(12) United States Patent
Yamazaki et al.

(10) Patent No.: US 12,707,847 B2
(45) Date of Patent: Aug. 11, 2026

(54) DISPLAY APPARATUS

(71) Applicant: Semiconductor Energy Laboratory Co., Ltd., Kanagawa-ken (JP)

(72) Inventors: Shunpei Yamazaki, Tokyo (JP); Daiki Nakamura, Atsugi (JP); Ryo Yamauchi, Atsugi (JP); Kenichi Okazaki, Atsugi (JP); Shingo Eguchi, Atsugi (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 485 days.

(21) Appl. No.: 18/287,339

(22) PCT Filed: Apr. 13, 2022

(86) PCT No.: PCT/IB2022/053452
§ 371 (c)(1),
(2) Date: Oct. 18, 2023

(87) PCT Pub. No.: WO2022/224085
PCT Pub. Date: Oct. 27, 2022

(65) Prior Publication Data
US 2024/0196657 A1 Jun. 13, 2024

(30) Foreign Application Priority Data
Apr. 22, 2021 (JP) ................................ 2021-072688

(51) Int. Cl.
*H10K 59/122* (2023.01)
*H10K 50/00* (2023.01)
(Continued)

(52) U.S. Cl.
CPC ........... *H10K 59/353* (2023.02); *H10K 50/00* (2023.02); *H10K 59/00* (2023.02); *H10K 59/122* (2023.02);
(Continued)

(58) Field of Classification Search
CPC ...... H10K 59/353; H10K 50/00; H10K 59/00; H10K 59/122; H10K 59/80515;
(Continued)

(56) References Cited

U.S. PATENT DOCUMENTS 5,953,985 A 9/1999 Kobayashi
6,120,338 A 9/2000 Hirano et al.
(Continued)

FOREIGN PATENT DOCUMENTS

CN 001578555 A 2/2005
CN 103219357 A 7/2013
(Continued)

OTHER PUBLICATIONS

International Search Report (Application No. PCT/IB2022/053452) Dated Jul. 5, 2022.
(Continued)

*Primary Examiner* — Elmito Breval
(74) *Attorney, Agent, or Firm* — Husch Blackwell LLP

(57) ABSTRACT

A display apparatus with a wide viewing angle is provided. The display apparatus includes a first light-emitting element and a second light-emitting element over a substrate. The first light-emitting element includes a first pixel electrode, a first organic layer, and a common electrode, and the second light-emitting element includes a second pixel electrode, a second organic layer, and the common electrode. In a top view of the substrate, the first light-emitting element includes a first side and a second side that is shorter than the first side. An absolute value of a difference between a chromaticity difference between a chromaticity in a front direction and a chromaticity in a first direction and a chromaticity difference between the chromaticity in the front direction and a chromaticity in a second direction is less than or equal to 0.05. A projection of the first direction onto the
(Continued)

substrate is parallel to the first side, and a projection of the second direction onto the substrate is parallel to the second side. An angle formed by the first direction and a normal direction of a surface of the substrate is 70°, and an angle formed by the second direction and the normal direction of the surface of the substrate is 70°.

10 Claims, 35 Drawing Sheets

(51) Int. Cl.

| | |
|---|---|
| ***H10K 59/00*** | (2023.01) |
| ***H10K 59/35*** | (2023.01) |
| ***H10K 59/80*** | (2023.01) |
| *H10K 50/10* | (2023.01) |

(52) U.S. Cl.
CPC ....... *H10K 59/80515* (2023.02); *H10K 50/10* (2023.02); *H10K 59/871* (2023.02); *H10K 59/873* (2023.02)

(58) Field of Classification Search
CPC .... H10K 50/10; H10K 59/871; H10K 59/873; H10K 59/35; H10K 59/121; H10K 50/16; G09F 9/30; G09F 9/301; H05B 33/02; H05B 33/12; H05B 33/22
See application file for complete search history.

(56) References Cited

U.S. PATENT DOCUMENTS

| | | | |
|---|---|---|---|
| 7,399,991 | B2 | 7/2008 | Seo et al. |
| 7,511,420 | B2 | 3/2009 | Adachi et al. |
| 7,977,875 | B2 | 7/2011 | Adachi et al. |
| 8,183,770 | B2 | 5/2012 | Adachi et al. |
| 8,274,218 | B1 | 9/2012 | Adachi et al. |
| 10,636,851 | B2 | 4/2020 | Ukigaya |
| 11,387,299 | B2 | 7/2022 | Ukigaya |
| 2002/0072139 | A1 | 6/2002 | Kashiwabara |
| 2005/0007322 | A1 | 1/2005 | Adachi et al. |
| 2011/0148290 | A1 | 6/2011 | Oota |
| 2012/0256204 | A1 | 10/2012 | Yoshizumi et al. |
| 2012/0273804 | A1 | 11/2012 | Hatano |
| 2012/0276484 | A1 | 11/2012 | Izumi et al. |
| 2013/0084531 | A1 | 4/2013 | Hamaguchi et al. |
| 2013/0084664 | A1 | 4/2013 | Yoshitoku et al. |
| 2013/0084666 | A1 | 4/2013 | Oshige |
| 2013/0187840 | A1 | 7/2013 | Tomita et al. |
| 2013/0280839 | A1 | 10/2013 | Sonoda et al. |
| 2013/0295705 | A1 | 11/2013 | Sonoda et al. |
| 2013/0334507 | A1 | 12/2013 | Shimoji et al. |
| 2014/0004640 | A1 | 1/2014 | Hamaguchi et al. |
| 2014/0004642 | A1 | 1/2014 | Otsuka et al. |
| 2015/0060826 | A1 | 3/2015 | Matsumoto et al. |
| 2015/0069360 | A1 | 3/2015 | Sato |
| 2015/0076476 | A1 | 3/2015 | Odaka et al. |
| 2016/0172595 | A1 | 6/2016 | Malinowski et al. |
| 2016/0315133 | A1 | 10/2016 | Sato |
| 2017/0141167 | A1 | 5/2017 | Naganuma |
| 2017/0256754 | A1 | 9/2017 | Defranco et al. |
| 2018/0190908 | A1 | 7/2018 | Ke et al. |
| 2018/0247981 | A1* | 8/2018 | Yamaoka .............. H10K 59/30 |
| 2019/0096971 | A1 | 3/2019 | Ukigaya |
| 2020/0027932 | A1 | 1/2020 | Choi et al. |
| 2020/0168133 | A1 | 5/2020 | Hwang et al. |
| 2020/0203662 | A1 | 6/2020 | Mollard et al. |

FOREIGN PATENT DOCUMENTS

| | | | |
|---|---|---|---|
| CN | 108538211 | A | 9/2018 |
| CN | 110739332 | A | 1/2020 |
| JP | 2000-036385 | A | 2/2000 |
| JP | 2002-324673 | A | 11/2002 |
| JP | 2003-059663 | A | 2/2003 |
| JP | 2005-031251 | A | 2/2005 |
| JP | 2008-098106 | A | 4/2008 |
| JP | 2008-147072 | A | 6/2008 |
| JP | 2008-251270 | A | 10/2008 |
| JP | 2013-175433 | A | 9/2013 |
| JP | 2014-017239 | A | 1/2014 |
| JP | 2014-120218 | A | 6/2014 |
| JP | 2014-135251 | A | 7/2014 |
| JP | 2014-232568 | A | 12/2014 |
| JP | 2015-115178 | A | 6/2015 |
| JP | 2016-197494 | A | 11/2016 |
| JP | 2019-067525 | A | 4/2019 |
| JP | 2019-179696 | A | 10/2019 |
| JP | 2020-160305 | A | 10/2020 |
| KR | 2020-0009865 | A | 1/2020 |
| TW | 200505258 | | 2/2005 |
| WO | WO-2019/196335 | | 10/2019 |

OTHER PUBLICATIONS

Written Opinion (Application No. PCT/IB2022/053452) Dated July 5. 2022.
Zakhidov.A et al., "Orthogonal processing: A new strategy for organic electronics", Chem. Sci. (Chemical Science), Apr. 7, 2011, vol. 2, No. 6, pp. 1178-1182.
Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.
Malinowski.P et al., "Photolithographic patterning of organic photodetectors with a non-fluorinated photoresist system", Organic Electronics, Jul. 12, 2014, vol. 15, No. 10, pp. 2355-2359.
Malinowski.P et al., "Multicolor 1250 ppi OLED Arrays Patterened by Photolithography", SID Digest '16 : SID International Symposium Digest of Technical Papers, May 22, 2016, vol. 47, No. 1, pp. 1009-1012.
Papadopoulos.N et al., "AMOLED Displays with In-Pixel Photodetector", Liquid Crystals and Display Technology, Jul. 9, 2020, pp. 1-19.
Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.
Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.
Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.
Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.
Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37. No. 1, pp. 909-911.
Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

* cited by examiner

80
R
G
B
A1
A2
R
G
B
90R
90G
90B 90R
90G
90B
119
113
A1
112R
111R
101
112G
111G
112B
111B
A2

90R
119a
119b
90G
113
90B
A1
112R
111R
101
112G
111G
112B
111B
A2

90R
90G
114
113
121
90B
140
A1
101
112R
111R
112G
111G
112B
111B
A2
C1
C2
111C 90R
90G
114
113
121
90B
140
A1
101
112R
111R
125
112G
111G
112B
111B
A2
C1
C2
111C 90R
90G
114
113
121
90B
140
A1
101
112R
111R
112G
111G
126
112B
111B
A2
C1
C2
111C 90R
90G
114
113
121
90B
140
A1
101
112R
111R
125
112G
111G
126
112B
111B
A2
C1
C2
111C 90R
90G
114
113
121
90B
140
A1
101
112R
111R
125
112G
111G
112B
111B
A2
C1
111C
C2

90R
90G
114
113
121
90B
140
A1
101
112R
111R
112G
111G
126
112B
111B
A2
C1
111C
C2

90R
90G
114
113
121
90B
140
A1
101
112R
111R
125
112G
111G
126
112B
111B
A2
C1
111C
C2

90R
90G
114
113
121
90B
140
A1
101
112R
111R
111G
112G
111B
112B
A2
C1
C2
111C 90R
90G
114
113
121
90B
140
A1
101
112R
111R
125
111G
112G
111B
112B
A2
C1
C2
111C 90R
90G
114
113
121
90B
140
A1
101
112R
111R
111G
112G
126
111B
112B
A2
C1
C2
111C 90R
90G
114
113
121
90B
140
A1
101
112R
111R
125
111G
112G
126
111B
112B
A2
C1
C2
111C 90R
90G
114
113
121
90B
121
140
113
A1
101
112R
111R
124
125
111G
112G
124
126
111B
112B
124
A2
C1
111C
114
C2
124

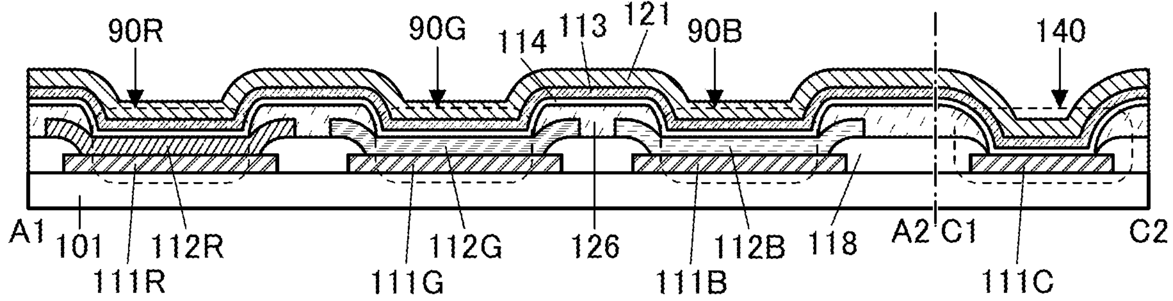
FIG. 10B
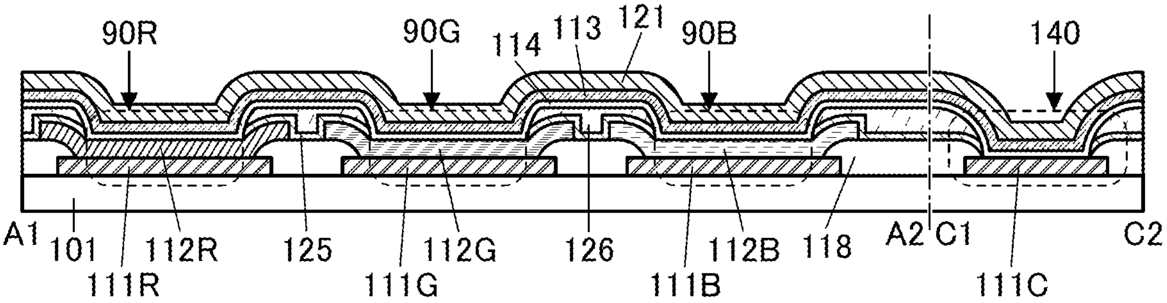
FIG. 10C
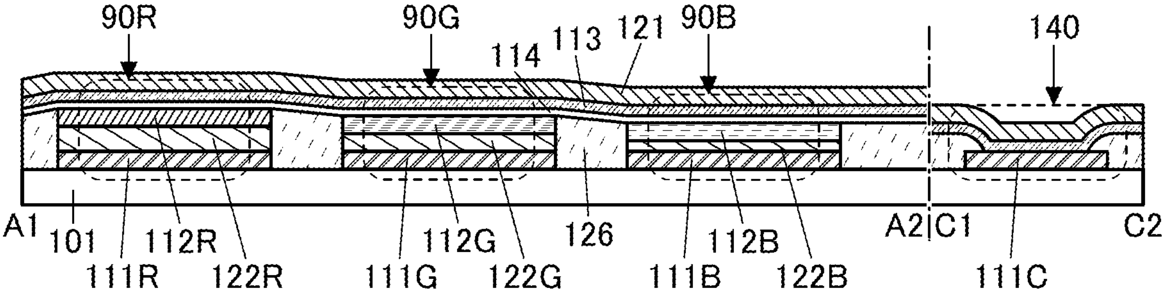
FIG. 10D
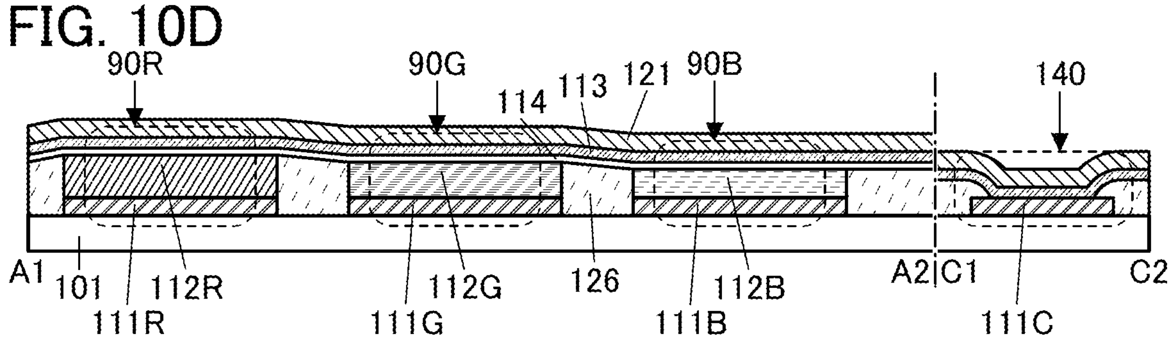

FIG. 13A
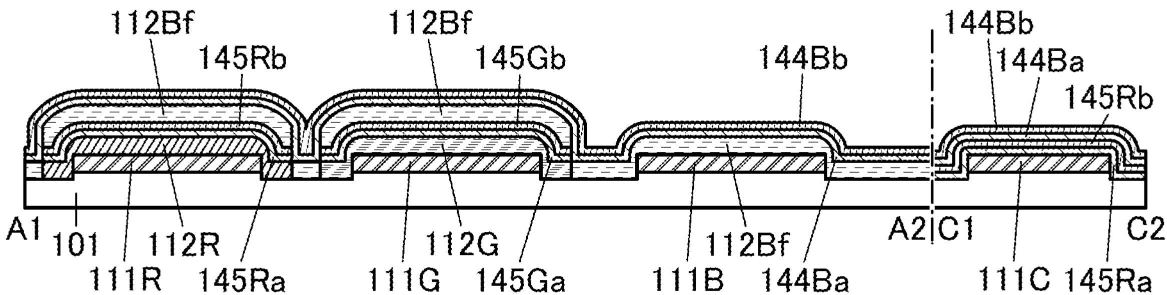
FIG. 13B
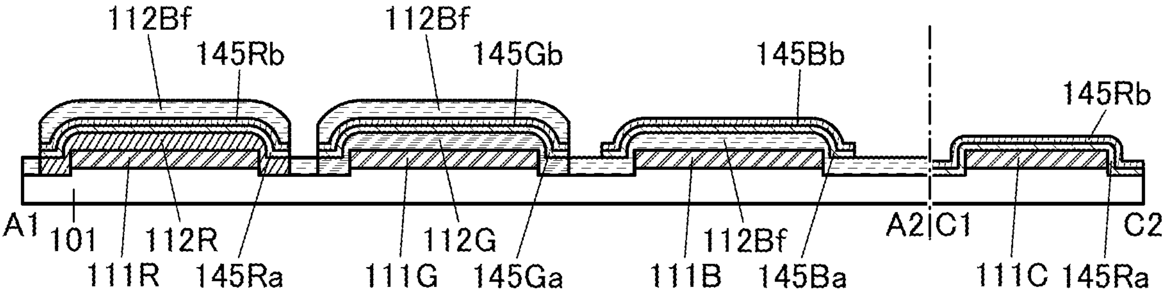
FIG. 13C
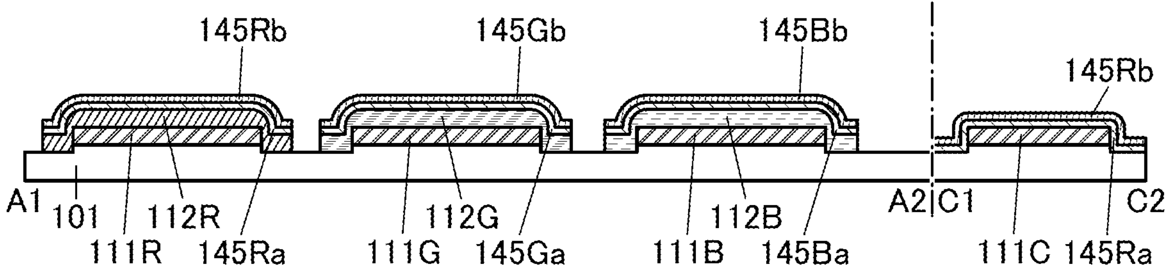
FIG. 13D
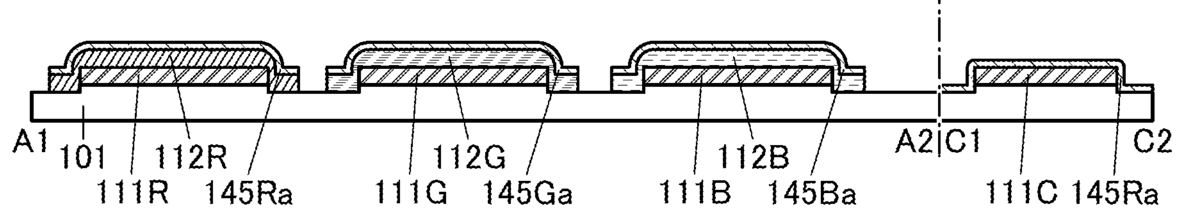

FIG. 25A
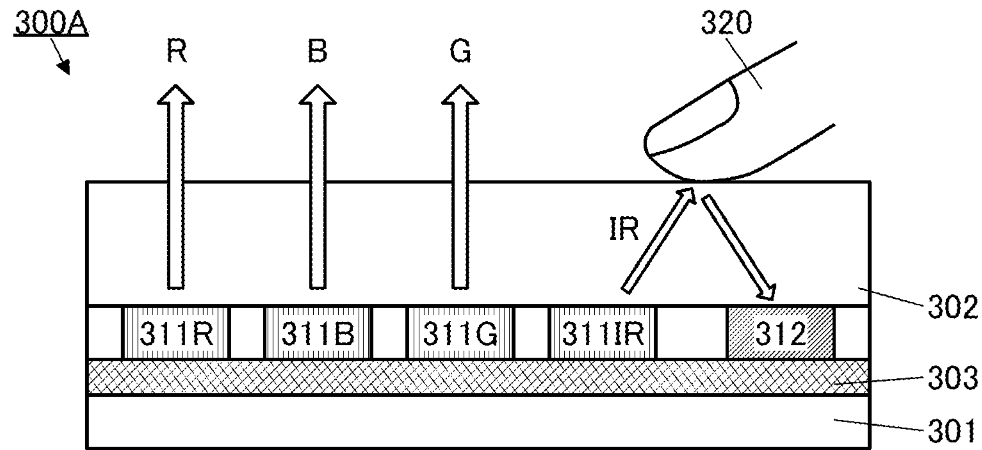
FIG. 25B FIG. 25C
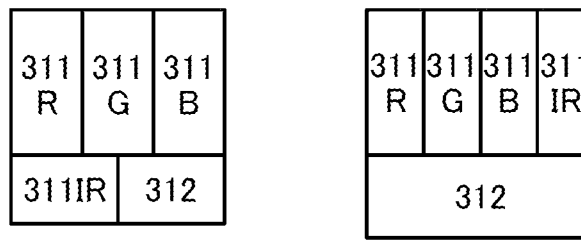
FIG. 25D
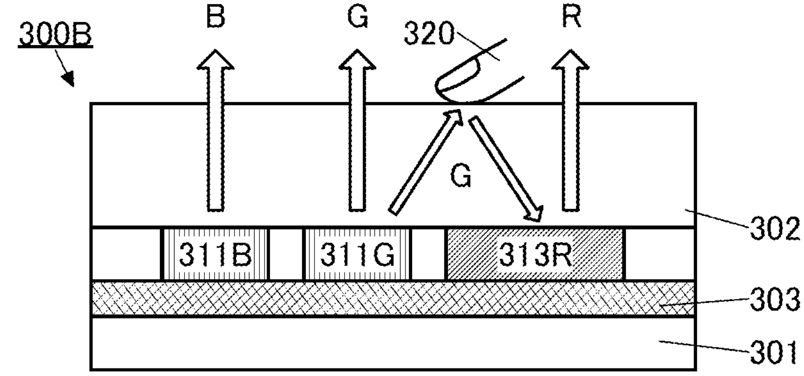
FIG. 25E FIG. 25F
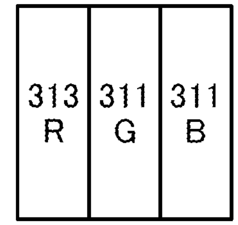
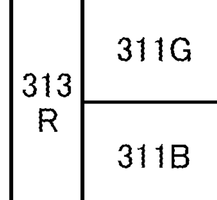

FIG. 29A
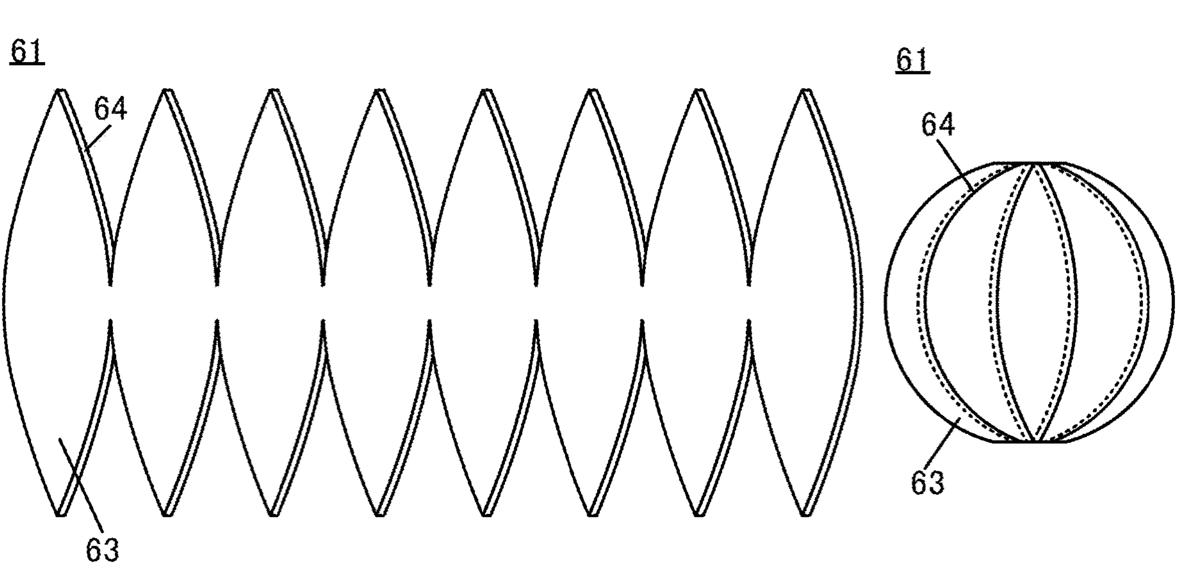
FIG. 29B
FIG. 29C
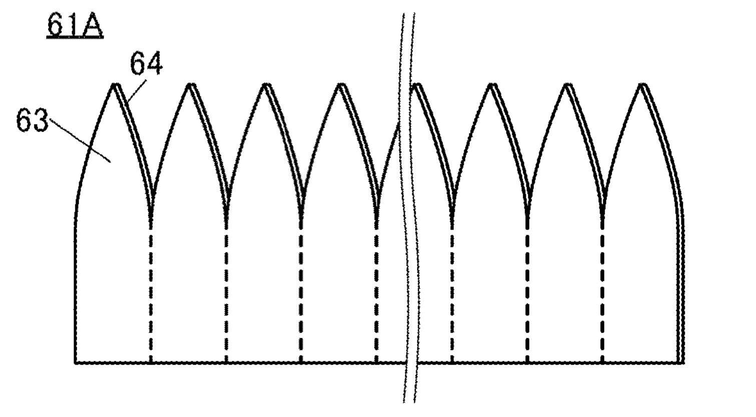
FIG. 29D
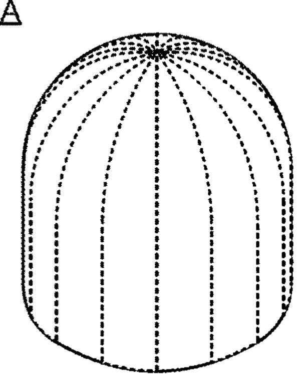
FIG. 29E
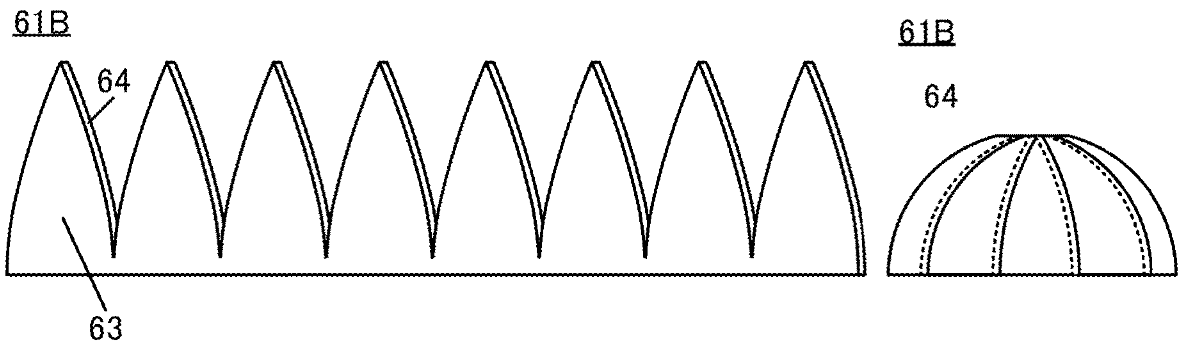
FIG. 29F

DISPLAY APPARATUS

This application is a 371 of international application PCT/IB2022/053452 filed on Apr. 13, 2022, which is incorporated herein by reference.

TECHNICAL FIELD

One embodiment of the present invention relates to a display apparatus. One embodiment of the present invention relates to a method for fabricating a display apparatus.

Note that one embodiment of the present invention is not limited to the above technical field. Examples of a technical field of one embodiment of the present invention disclosed in this specification and the like include a semiconductor device, a display apparatus, a light-emitting apparatus, a power storage device, a memory device, an electronic device, a lighting device, an input device, an input/output device, a driving method thereof, and a manufacturing method thereof. A semiconductor device refers to any device that can function by utilizing semiconductor characteristics.

BACKGROUND ART

In recent years, higher-definition display panels have been required. Examples of devices that require high-definition display panels include a smartphone, a tablet terminal, and a laptop computer. Furthermore, higher definition has been required for a stationary display apparatus such as a television device or a monitor device along with an increase in resolution.

Examples of a display apparatus that can be used for a display panel include, typically, a liquid crystal display apparatus, a light-emitting apparatus including a light-emitting element (also referred to as a light-emitting device) such as an organic EL (Electro Luminescence) element or a light-emitting diode (LED), and electronic paper performing display by an electrophoretic method or the like.

For example, the basic structure of an organic EL element is a structure where a layer containing a light-emitting organic compound is provided between a pair of electrodes. By voltage application to this element, light emission can be obtained from the light-emitting organic compound. A display apparatus using such an organic EL element does not need a backlight that is necessary for a liquid crystal display apparatus and the like; thus, a thin, lightweight, high-contrast, and low-power display apparatus can be achieved. Patent Document 1, for example, discloses an example of a display apparatus using an organic EL element.

REFERENCE

Patent Document

[Patent Document 1] Japanese Published Patent Application No. 2002-324673

SUMMARY OF THE INVENTION

Problems to be Solved by the Invention

An object of one embodiment of the present invention is to provide a display apparatus with a wide viewing angle. An object of one embodiment of the present invention is to provide a display apparatus with high color purity. An object of one embodiment of the present invention is to provide a display apparatus that easily achieves higher definition. An object of one embodiment of the present invention is to provide a display apparatus with both high display quality and high definition. An object of one embodiment of the present invention is to provide a high-contrast display apparatus. An object of one embodiment of the present invention is to provide a highly reliable display apparatus. An object of one embodiment of the present invention is to provide a display apparatus having a novel structure.

An object of one embodiment of the present invention is to provide a method of fabricating the above display apparatus. An object of one embodiment of the present invention is to provide a method of manufacturing the above-described display apparatus with high yield. An object of one embodiment of the present invention is to at least reduce at least one of problems of the conventional technique.

Note that the description of these objects does not preclude the existence of other objects. Note that one embodiment of the present invention does not have to achieve all the objects. Note that objects other than these can be derived from the description of the specification, the drawings, the claims, and the like.

Means for Solving the Problems

One embodiment of the present invention is a display apparatus including a first light-emitting element and a second light-emitting element over a substrate. The first light-emitting element includes a first pixel electrode, a first organic layer, and a common electrode, and the second light-emitting element includes a second pixel electrode, a second organic layer, and the common electrode. In a top view of the substrate, the first light-emitting element includes a first side and a second side that is shorter than the first side. An absolute value of a difference between a chromaticity difference Δu'v' between a chromaticity in a front direction and a chromaticity in a first direction and a chromaticity difference Δu'v' between the chromaticity in the front direction and a chromaticity in a second direction is less than or equal to 0.05. A projection of the first direction onto the substrate is parallel to the first side, and a projection of the second direction onto the substrate is parallel to the second side. An angle formed by the first direction and a normal direction of a surface of the substrate is 70°, and an angle formed by the second direction and the normal direction of the surface of the substrate is 70°.

One embodiment of the present invention is a display apparatus including a first light-emitting element and a second light-emitting element over a substrate. The first light-emitting element includes a first pixel electrode, a first organic layer, and a common electrode, and the second light-emitting element includes a second pixel electrode, a second organic layer, and the common electrode. In a top view of the substrate, the first light-emitting element includes a first side and a second side that is shorter than the first side. The ratio of a chromaticity difference Δu'v' between a chromaticity in a front direction and a chromaticity in a first direction to a chromaticity difference Δu'v' between the chromaticity in the front direction and a chromaticity in a second direction is greater than or equal to 0.5 and less than or equal to 1.5. A projection of the first direction onto the substrate is parallel to the first side, and a projection of the second direction onto the substrate is parallel to the second side. An angle formed by the first direction and a normal direction of a surface of the substrate is 70°, and an angle formed by the second direction and the normal direction of the surface of the substrate is 70°.

In a top view of the first light-emitting element in the display apparatus, in a region where the first pixel electrode and the common electrode overlap with each other with a light-emitting region of the first organic layer therebetween, an entire surface of the first pixel electrode on the first organic layer side and an entire surface of the common electrode on the first organic layer side are preferably parallel or substantially parallel to each other.

It is preferable that the display apparatus further include an insulating layer, an end portion of the first pixel electrode and an end portion of the first organic layer be aligned or substantially aligned with each other, an end portion of the second pixel electrode and an end portion of the second organic layer be aligned or substantially aligned with each other, and the insulating layer include regions in contact with side surfaces of the first pixel electrode, the second pixel electrode, the first organic layer, and the second organic layer.

It is preferable that the display apparatus further include an insulating layer, the width of the first pixel electrode be smaller than the width of the first organic layer, the width of the second pixel electrode be smaller than the width of the second organic layer, the first organic layer cover a side surface and a top surface of the first pixel electrode, the second organic layer cover a side surface and a top surface of the second pixel electrode, and the insulating layer include regions in contact with side surfaces and parts of top surfaces of the first organic layer and the second organic layer.

It is preferable that the display apparatus further include an insulating layer, the width of the first pixel electrode be larger than the width of the first organic layer, the width of the second pixel electrode be larger than the width of the second organic layer, and the insulating layer include regions in contact with side surfaces and parts of top surfaces of the first pixel electrode and the second pixel electrode and side surfaces of the first organic layer and the second organic layer.

It is preferable that the display apparatus further include a first insulating layer and a second insulating layer, the first insulating layer cover an end portion of the first pixel electrode, the first organic layer be provided over the first pixel electrode and the first insulating layer, the second insulating layer be provided over the first organic layer and the first insulating layer, and the second insulating layer include a region in contact with a side surface and a part of a top surface of the first organic layer and a part of a top surface of the first insulating layer.

In the display apparatus, it is preferable that an end portion of the first insulating layer have a tapered shape, and the second insulating layer include a region overlapping with the end portion of the first insulating layer with the first organic layer therebetween.

In the display apparatus, it is preferable that the first light-emitting element include a common layer between the first organic layer and the common electrode, and the second light-emitting element include the common layer between the second organic layer and the common electrode.

In the display apparatus, the common layer preferably includes one or both of an electron-transport layer and an electron-injection layer.

In the display apparatus, it is preferable that the substrate have flexibility and the shape of the substrate be non-rectangular.

Effect of the Invention

One embodiment of the present invention can provide a display apparatus with a wide viewing angle. Alternatively, a display apparatus with high color purity can be provided. Alternatively, a display apparatus that easily achieves higher definition can be provided. Alternatively, a display apparatus with both high display quality and high definition can be provided. Alternatively, a high-contrast display apparatus can be provided. Alternatively, a highly reliable display apparatus can be provided. Alternatively, a display apparatus having a novel structure can be provided.

One embodiment of the present invention can provide a method of manufacturing the above display apparatus. Alternatively, a method of manufacturing the above-described display apparatus with high yield can be provided. With one embodiment of the present invention, at least one of problems of the conventional technology can be at least reduced.

Note that the description of these effects does not preclude the existence of other effects. One embodiment of the present invention does not need to have all of these effects. Note that effects other than these can be derived from the description of the specification, the drawings, the claims, and the like.

BRIEF DESCRIPTION OF THE DRAWINGS

FIG. 8A to FIG. 8F are cross-sectional views illustrating structure examples of a display apparatus.

FIG. 10A to FIG. 10D are cross-sectional views illustrating structure examples of a display apparatus.

FIG. 13A to FIG. 13D are cross-sectional views illustrating an example of a method of manufacturing a display apparatus.

FIG. 17 is a cross-sectional view illustrating an example of a display apparatus.

FIG. 19A to FIG. 19D are top views illustrating examples of a pixel.

FIG. 20A to FIG. 20D are top views illustrating examples of a pixel.

FIG. 21A to FIG. 21E are top views illustrating examples of a pixel.

FIG. 22A to FIG. 22C are top views illustrating examples of a pixel.

FIG. 23A to FIG. 23C are top views illustrating examples of a pixel.

FIG. 25A and FIG. 25D are cross-sectional views illustrating structure examples of a display apparatus. FIG. 25B, FIG. 25C, FIG. 25E, and FIG. 25F are top views illustrating examples of a pixel.

FIG. 26A to FIG. 26F are diagrams illustrating structure examples of a light-emitting device.

FIG. 29A, FIG. 29C, and FIG. 29E are schematic top views of unfolded display panels, and FIG. 29B, FIG. 29D, and FIG. 29F are external views of display apparatuses of one embodiment of the present invention.

MODE FOR CARRYING OUT THE INVENTION

Figures 1A, 1B, 1C:
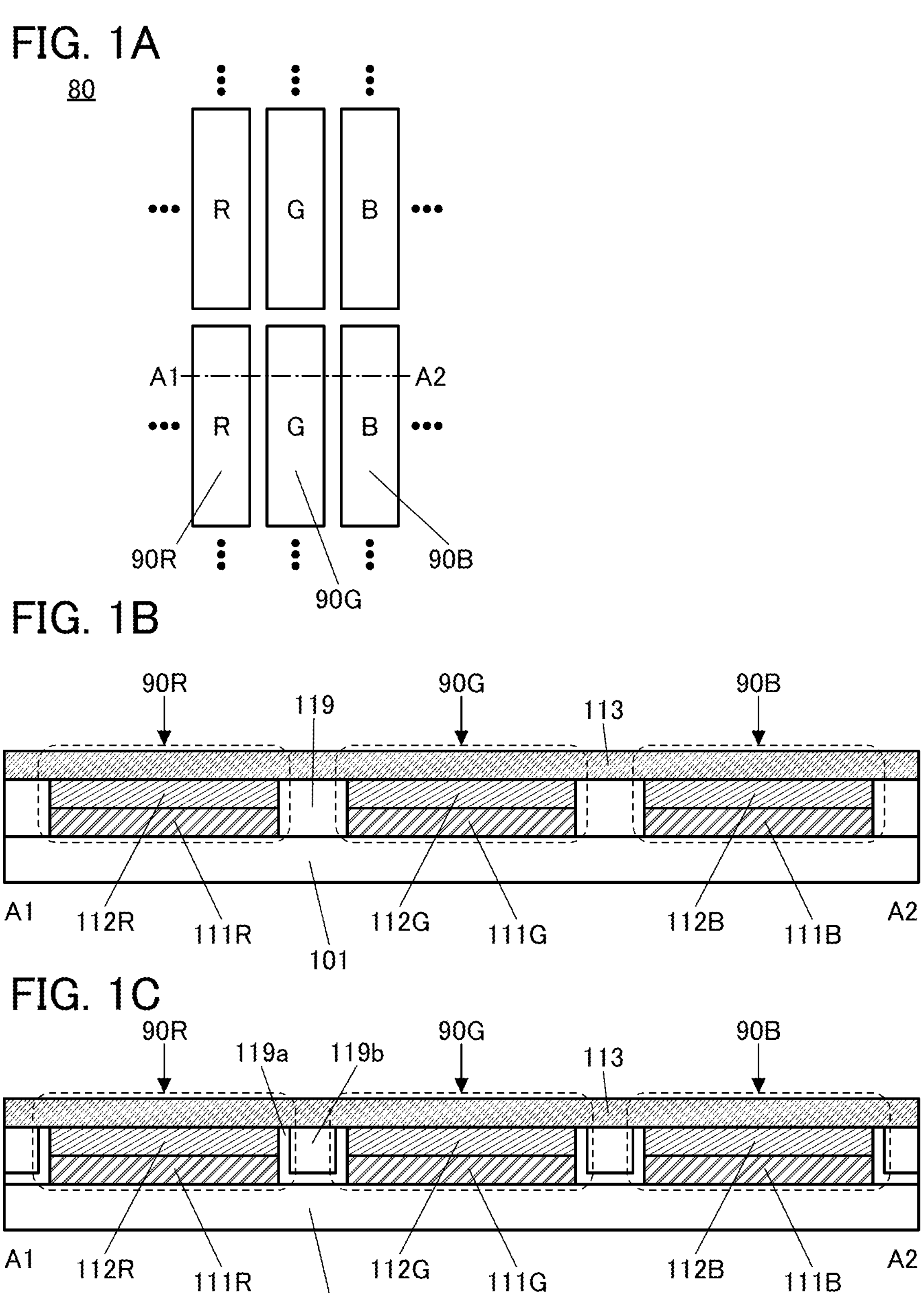
FIG. 1A is a schematic top view illustrating a structure example of a display apparatus.
FIG. 1B and FIG. 1C are schematic cross-sectional views illustrating structure examples of the display apparatus.

Embodiments will be described below with reference to the drawings. Note that the embodiments can be implemented with many different modes, and it will be readily understood by those skilled in the art that modes and details thereof can be changed in various ways without departing from the spirit and scope thereof. Therefore, the present invention should not be construed as being limited to the description of embodiments below.

Note that in structures of the invention described below, the same portions or portions having similar functions are denoted by the same reference numerals in different drawings, and the description thereof is not repeated. Furthermore, the same hatch pattern is used for the portions having similar functions, and the portions are not especially denoted by reference numerals in some cases.

Note that in each drawing described in this specification, the size, the layer thickness, or the region of each component is exaggerated for clarity in some cases. Therefore, they are not limited to the illustrated scale.

Note that in this specification and the like, ordinal numbers such as “first” and “second” are used in order to avoid confusion among components and do not limit the number.

In addition, in this specification and the like, the term “film” and the term “layer” can be interchanged with each other. For example, in some cases, the term “conductive layer” and the term “insulating layer” can be interchanged with the term “conductive film” and the term “insulating film”, respectively.

Note that in this specification, an EL layer means a layer containing at least a light-emitting substance (also referred to as a light-emitting layer) or a stacked-layer body including the light-emitting layer provided between a pair of electrodes of a light-emitting element.

In this specification and the like, a display panel that is one embodiment of a display apparatus has a function of displaying (outputting) an image or the like on (to) a display surface. Therefore, the display panel is one embodiment of an output device.

In this specification and the like, a substrate of a display panel to which a connector such as an FPC (Flexible Printed Circuit) or a TCP (Tape Carrier Package) is attached, or a substrate on which an IC is mounted by a COG (Chip On Glass) method or the like is referred to as a display panel module, a display module, or simply a display panel or the like in some cases.

In this specification, in the case where the maximum value and the minimum value are specified, a structure in which the maximum value and the minimum value are freely combined is also disclosed.

Note that in this specification and the like, the expression “level or substantially level” indicates a structure having the same level from a reference surface (e.g., a flat surface such as a substrate surface) in a cross-sectional view. For example, in a manufacturing process of the semiconductor device, planarization treatment (typically, CMP treatment) is performed, whereby the surface(s) of a single layer or a plurality of layers are exposed in some cases. In this case, the surfaces on which the CMP treatment is performed is at the same level from a reference surface. Note that a plurality of layers are not level with each other in some cases, depending on a treatment apparatus, a treatment method, or a material of the treated surfaces on which the CMP treatment is performed. This case is also regarded as being “level or substantially level” in this specification and the like. For example, the expression “level or substantially level” includes the case where two layers (here, given as a first layer and a second layer) having different two levels with respect to the reference surface are included, and the difference between the top-surface level of the first layer and the top-surface level of the second layer is less than or equal to 20 nm.

Note that in this specification and the like, the expression “end portions are aligned or substantially aligned” means that at least outlines of stacked layers partly overlap with each other. For example, the case of processing an upper layer and a lower layer with the use of the same mask pattern or mask patterns that are partly the same is included. However, in some cases, the outlines do not exactly overlap with each other and the outline of the upper layer is located inward from the outline of the lower layer or the outline of the upper layer is located outward from the outline of the lower layer; such a case is also represented by the expression “end portions are aligned or substantially aligned”.

Embodiment 1

In this embodiment, a display apparatus of one embodiment of the present invention will be described with reference to FIG. 1 to FIG. 3.

The display apparatus of this embodiment includes a first light-emitting element and a second light-emitting element. Each of the first light-emitting element and the second light-emitting element includes a first electrode, a light-emitting layer over the first electrode, and a second electrode over the light-emitting layer. Note that the display apparatus of this embodiment may further include a third light-emitting element. The third light-emitting element includes a first electrode, a light-emitting layer over the first electrode, and a second electrode over the light-emitting layer.

The display apparatus of this embodiment includes a first electrode, a second electrode, and a light-emitting layer. Furthermore, a top surface of the first electrode that overlaps with a light-emitting region of the light-emitting layer is flat and a bottom surface of the second electrode that overlaps with the light-emitting region of the light-emitting layer is flat. With such a structure, a color shift is hardly caused between when the display apparatus is observed from an oblique direction and when the display apparatus is observed from the front direction. Furthermore, a color shift is hardly caused between when the display apparatus is observed from a first oblique direction and when the display apparatus is observed from a second oblique direction. Therefore, a display apparatus with a wide viewing angle can be achieved. Furthermore, a display apparatus with high color purity can be achieved.

For example, in the case where an insulating layer is provided to cover an end portion of the first electrode, light is emitted from the light-emitting layer positioned over the insulating layer in some cases. Furthermore, since the light is emitted in an oblique direction in the case where the insulating layer in a region overlapping with the light-emitting layer has a slope, the viewing angle of the display apparatus might be adversely affected. Specifically, the viewing angle of the display apparatus might be narrowed. In contrast, in the structure of one embodiment of the present invention, the light-emitting region of the light-emitting layer is flat. Thus, the viewing angle can be widened in the horizontal (lateral) direction and the perpendicular (vertical) direction. For example, the viewing angle dependence of chromaticity can be low in the horizontal (lateral) direction and the perpendicular (vertical) direction. Furthermore, the viewing angle dependence of chromaticity in the horizontal (lateral) direction and the viewing angle dependence of chromaticity in the perpendicular direction (vertical) can be approximately the same.

On the CIE 1976 chromaticity coordinates, a chromaticity difference Δu'v' between a chromaticity of light emitted from each light-emitting element in the front direction and the chromaticity in the oblique direction (a direction in which the absolute value of an angle from the front is greater than 0° and less than 90°) is preferably less than or equal to 0.05, and further preferably less than or equal to 0.02. Specifically, a chromaticity difference Δu'v' between a chromaticity of light emitted from each light-emitting element in the front direction and the chromaticity in a direction that is inclined from the front by 30° or greater and 60° or less (preferably 30° or greater and 80° or less) is preferably less than or equal to 0.05, and further preferably less than or equal to 0.02.

When white display is performed by the first light-emitting element, the second light-emitting element, and the third light-emitting element, on the CIE 1976 chromaticity coordinates, a chromaticity difference Δu'v' between a chromaticity of light in the front direction and the chromaticity in the oblique direction (a direction in which the absolute value of an angle from the front is greater than 0° and less than 90°) is preferably less than or equal to 0.05, and further preferably less than or equal to 0.02. Specifically, a chromaticity difference Δu'v' between a chromaticity in the front direction and the chromaticity in a direction that is inclined from the front by 30° or greater and 60° or less (preferably 30° or greater and 80° or less) is preferably less than or equal to 0.05, and further preferably less than or equal to 0.02. Note that as long as display is performed by the first light-emitting element, the second light-emitting element, and the third light-emitting element, the color displayed by the first light-emitting element, the second light-emitting element, and the third light-emitting element may be a color other than white.

Note that calculation of the above chromaticity difference Δu'v' may be performed on an angle greater than or equal to 30° and less than or equal to 80°. For example, the calculation may be performed on an angle greater than or equal to 60° and less than or equal to 80°, specifically, an angle of 70°. When the chromaticity difference Δu'v' at the angle is small, the viewing angle dependence of chromaticity can be regarded as small. Alternatively, the chromaticity difference Δu'v' may be the average value of chromaticity differences Δu'v' calculated with some or all of angles of 30° to 80° inclusive.

On the CIE 1976 chromaticity coordinates, an absolute value of a difference between a chromaticity difference Δu'v' between a chromaticity of light emitted from each light-emitting element in the front direction and the chromaticity in the first direction and a chromaticity difference Δu'v' between the chromaticity in the front direction and a chromaticity in the second direction is preferably less than or equal to 0.05, and further preferably less than or equal to 0.02. Specifically, an absolute value of a difference between the chromaticity difference Δu'v' between a chromaticity of light emitted from each light-emitting element in the front direction and the chromaticity in the first direction that is inclined from the front by 30° or greater and 60° or less (further preferably 30° or greater and 80° or less) and the chromaticity difference Δu'v' between a chromaticity in the front direction and the chromaticity in the second direction is preferably less than or equal to 0.05, and further preferably less than or equal to 0.02. Note that the first direction and the second direction are described later.

Alternatively, on the CIE 1976 chromaticity coordinates, the ratio of a chromaticity difference Δu'v' between a chromaticity of light emitted from each light-emitting element in the front direction and the chromaticity in the second direction to a chromaticity difference Δu'v' between the chromaticity in the front direction and the chromaticity in the first direction is preferably greater than or equal to 0.5 and less than or equal to 1.5, further preferably greater than or equal to 0.6 and less than or equal to 1.3, still further preferably greater than or equal to 0.8 and less than or equal to 1.2. Specifically, the ratio of a chromaticity difference Δu'v' between a chromaticity of light emitted from each light-emitting element in the front direction and the chromaticity in the second direction to a chromaticity difference Δu'v' between the chromaticity in the front direction and the chromaticity in the first direction that is inclined from the front by 30° or greater and 60° or less (further preferably 0° or greater and 80° or less) is preferably greater than or equal to 0.5 and less than or equal to 1.5, further preferably greater than or equal to 0.6 and less than or equal to 1.3, and still further preferably greater than or equal to 0.8 and less than or equal to 1.2. Note that the first direction and the second direction are described later.

When white display is performed by the first light-emitting element, the second light-emitting element, and the third light-emitting element, on the CIE 1976 chromaticity coordinates, the absolute value of the difference between a chromaticity difference Δu'v' between a chromaticity of light emitted from each light-emitting element in the front direction and the chromaticity in the first direction and a chromaticity difference Δu'v' between the chromaticity in the front direction and the chromaticity in the second direction is preferably less than or equal to 0.05, and further preferably less than or equal to 0.02. Specifically, the absolute value of the difference between the chromaticity difference Δu'v' between a chromaticity of light emitted from each light-emitting element in the front direction and the chromaticity in the first direction that is inclined from the front by 30° or greater and 60° or less (further preferably 30° or greater and 80° or less) and the chromaticity difference Δu'v' between the chromaticity in the front direction and the chromaticity in the second direction is preferably less than or equal to 0.05, and further preferably less than or equal to 0.02. Note that as long as display is performed by the first light-emitting element, the second light-emitting element, and the third light-emitting element, the color displayed by the first light-emitting element, the second light-emitting element, and the third light-emitting element may be a color other than white.

Alternatively, when white is displayed by the first light-emitting element, the second light-emitting element, and the third light-emitting element, on the CIE 1976 chromaticity coordinates, the ratio of the chromaticity difference Δu'v' between a chromaticity of light emitted from each light-emitting element in the front direction and the chromaticity in the second direction to the chromaticity difference Δu'v' between the chromaticity in the front direction and the chromaticity in the first direction is preferably greater than or equal to 0.5 and less than or equal to 1.5, further preferably greater than or equal to 0.6 and less than or equal to 1.3, still further preferably greater than or equal to 0.8 and less than or equal to 1.2. Specifically, the ratio of the chromaticity difference Δu'v' between a chromaticity of light emitted from each light-emitting element in the front direction and the chromaticity in the second direction to the chromaticity difference Δu'v' between the chromaticity in the front direction and the chromaticity in the first direction that is inclined from the front by 30° or greater and 60° or less (further preferably 30° or greater and 80° or less) is preferably greater than or equal to 0.5 and less than or equal to 1.5, further preferably greater than or equal to 0.6 and less than or equal to 1.3, and still further preferably greater than or equal to 0.8 and less than or equal to 1.2. Note that as long as display is performed by the first light-emitting element, the second light-emitting element, and the third light-emitting element, the color displayed by the first light-emitting element, the second light-emitting element, and the third light-emitting element may be a color other than white.

Note that calculation of the absolute value of the difference or the ratio may be performed on an angle greater than or equal to 30° and less than or equal to 80°. For example, the calculation may be performed on an angle greater than or equal to 60° and less than or equal to 80°, specifically, an angle of 70°. When the absolute value of the difference or the ratio at the angle is small, the viewing angle dependence of chromaticity in the horizontal (lateral) direction can be regarded as substantially the same as the viewing angle dependence of chromaticity in the perpendicular (vertical) direction. Alternatively, the absolute value of the difference and the ratio may be an average value of absolute values of differences and an average value of ratios, respectively, which are calculated with some or all of angles of 30° to 80° inclusive.

The display apparatus of this embodiment has a small viewing angle dependence in the horizontal (lateral) direction and the perpendicular (vertical) direction; thus, even when the display apparatus is seen from the oblique direction, a reduction in contrast and a change in chromaticity, which depend on the angle, are small. Accordingly, the display apparatus can have high visibility not only when seen from the front but also when seen from the oblique direction. For example, even when a plurality of viewers see the display apparatus of this embodiment from various angles at the same time, information displayed on the display apparatus can be recognized by the viewers. Moreover, even when a flexible display is seen in a bent state, high visibility can be obtained. The display apparatus of this embodiment can be used for various applications such as a display portion of a portable electronic device, a display portion of a large screen, and a curved display portion.

The display apparatus can have a structure in which sub-pixels of three colors of R (red), G (green), and B (blue) express one color, a structure in which sub-pixels of four colors of R, G, B, and white (W) express one color, a structure in which sub-pixels of four colors of R, G, B, and Y (yellow) express one color, or the like. There is no particular limitation on the color element and colors other than R, G, B, W, and Y (e.g., cyan, magenta, or the like) may be used.

In the structure of the display apparatus of one embodiment of the present invention, it is preferable that an end portion of the first electrode be not covered with an insulating layer. In other words, it is preferable that the insulating layer be not provided between the first electrode and the light-emitting layer. Specifically, the end portion of the first electrode and an end portion of the light-emitting layer are preferably aligned or substantially aligned with each other. Alternatively, the width of the first electrode is preferably smaller than the width of the light-emitting layer.

Alternatively, in the structure of the display apparatus of one embodiment of the present invention, it is preferable that the end portion of the first electrode be covered with the insulating layer and the insulating layer be in contact with a side surface of the light-emitting layer. Specifically, it is preferable that the width of the first electrode be larger than the width of the light-emitting layer and the insulating layer be in contact with a side surface of the first electrode, a part of the top surface of the first electrode, and the side surface of the light-emitting layer.

Alternatively, when the display apparatus has a structure of one embodiment of the present invention, it is preferable that the end portion of the first electrode be covered with the first insulating layer, and the second insulating layer be provided above the light-emitting layer overlapping with the first insulating layer.

Structure Example of Display Apparatus

Structure examples of the display apparatus of one embodiment of the present invention are described with reference to FIG. 1 and FIG. 2.

FIG. 1A is a schematic top view of a display region 80 included in the display apparatus. The display region 80 includes a plurality of light-emitting elements 90R exhibiting red, a plurality of light-emitting elements 90G exhibiting green, and a plurality of light-emitting elements 90B exhibiting blue. In FIG. 1A, light-emitting regions of the light-emitting elements are denoted by R, G, and B to easily differentiate the light-emitting elements.

The light-emitting elements 90R, the light-emitting elements 90G, and the light-emitting elements 90B are arranged in a matrix. FIG. 1A illustrates stripe arrangement of the light-emitting elements. Note that the arrangement method of the light-emitting elements is not limited thereto; another arrangement method such as an S-stripe arrangement, a delta arrangement, a Bayer arrangement, or a zigzag arrangement may be employed, or a PenTile arrangement or a diamond arrangement may also be used.

Structure Example 1

FIG. 1B is a schematic cross-sectional view taken along dashed-dotted line A1-A2 in FIG. 1A. FIG. 1B is a schematic cross-sectional view of the light-emitting element 90R, the light-emitting element 90G, and the light-emitting element 90B.

The light-emitting element 90R, the light-emitting element 90G, and the light-emitting element 90B are provided over a layer 101 including a transistor (not illustrated). The layer 101 is provided over a substrate (not illustrated). Alternatively, the layer 101 includes a substrate (not illustrated).

The substrate preferably has flexibility. It is preferable that the shape of the substrate be non-rectangular. A display apparatus with a curved display surface can be fabricated by forming the light-emitting elements over the substrate.

The layer 101 can have a stacked-layer structure in which a plurality of transistors are provided and an insulating layer is provided so as to cover these transistors, for example. The layer 101 may have a depressed portion between adjacent light-emitting elements. For example, an insulating layer positioned on the outermost surface of the layer 101 may have a depressed portion. A structure example of the layer 101 is described later.

The light-emitting element 90R includes a pixel electrode 111R, an organic layer 112R, and a common electrode 113. The light-emitting element 90G includes a pixel electrode 111G, an organic layer 112G, and the common electrode 113. The light-emitting element 90B includes a pixel electrode 111B, an organic layer 112B, and the common electrode 113. The common electrode 113 is shared by the light-emitting element 90R, the light-emitting element 90G, and the light-emitting element 90B.

Note that in the following description common to the light-emitting element 90R, the light-emitting element 90G, and the light-emitting element 90B, the alphabets are omitted from the reference numerals and the term "light-emitting element 90" is used in some cases. In addition, the light-emitting element 90 described in this specification and the like refers to one or more of the light-emitting element 90R, the light-emitting element 90G, and the light-emitting element 90B in some cases.

In the following description common to the pixel electrode 111R, the pixel electrode 111G, and the pixel electrode 111B, the alphabets are omitted from the reference numerals and the term "pixel electrode 111" is used in some cases. In addition, the pixel electrode 111 described in this specification and the like refers to one or more of the pixel electrode 111R, the pixel electrode 111G, and the pixel electrode 111B in some cases.

In the following description common to the organic layer 112R, the organic layer 112G, and the organic layer 112B, the alphabets are omitted from the reference numerals and the term "organic layer 112" is used in some cases. In addition, the organic layer 112 described in this specification and the like refers to one or more of the organic layer 112R, the organic layer 112G, and the organic layer 112B in some cases.

The pixel electrode 111 is provided in each of the light-emitting elements.

The organic layer 112R contains at least a light-emitting organic compound that emits light with intensity in the red wavelength range. The organic layer 112G contains at least a light-emitting organic compound that emits light with intensity in the green wavelength range. The organic layer 112B contains at least a light-emitting organic compound that emits light with intensity in the blue wavelength range. Each of the organic layer 112R, the organic layer 112G, and the organic layer 112B can also be referred to as an EL layer.

As illustrated in FIG. 1B, an end portion of the pixel electrode 111R and an end portion of the organic layer 112R are aligned or substantially aligned with each other. An end portion of the pixel electrode 111G and an end portion of the organic layer 112G are aligned or substantially aligned with each other. An end portion of the pixel electrode 111B and an end portion of the organic layer 112B are aligned or substantially aligned with each other.

As illustrated in FIG. 1B, a gap is provided in the two organic layers between the light-emitting elements with different colors. In this manner, the organic layers 112R, the organic layers 112G, and the organic layers 112B are preferably provided so as not to be in contact with one another. This can suitably prevent unintentional light emission caused by current flow through two adjacent organic layers. As a result, the color purity can be increased to achieve a display apparatus with high display quality.

As illustrated in FIG. 1B, the display apparatus includes an insulating layer 119, and the insulating layer 119 is provided in the gap. Specifically, the insulating layer 119 includes regions in contact with side surfaces of the pixel electrode 111R, the pixel electrode 111G, the pixel electrode 111B, the organic layer 112R, the organic layer 112G, and the organic layer 112B. Providing the insulating layer 119 can effectively inhibit electrical short circuit between the pixel electrode 111 and the common electrode 113 and leakage current therebetween.

Although the insulating layer 119 has a single-layer structure in FIG. 1B, one embodiment of the present invention is not limited thereto. For example, the insulating layer 119 may have a multilayer structure of two or more layers. FIG. 1C illustrates the insulating layer 119 having a two-layer structure. The display apparatus illustrated in FIG. 1C includes an insulating layer 119*a* and an insulating layer 119*b* over the insulating layer 119*a*, and the other components are the same as those of the display apparatus illustrated in FIG. 1B.

For example, the insulating layer 119*a* is formed with an inorganic material and the insulating layer 119*b* is formed with an organic material, in which case electrical short circuit between the pixel electrode 111 and the common electrode 113 and leakage current therebetween can be further effectively inhibited.

The common electrode 113 is provided as a continuous layer shared by the light-emitting elements. The common electrode 113 is provided over the organic layer 112R, the organic layer 112G, the organic layer 112B, and the insulating layer 119. Note that the common electrode 113 may be provided for each light-emitting element. In that case, a conductive layer functioning as a wiring may be provided above the common electrodes and the conductive layer and the common electrodes may be electrically connected to each other.

In the above structure, light-emitting regions of the organic layer 112 correspond to regions hatched with slant lines in FIG. 1B. That is, the light-emitting region of the organic layer 112 is the whole of the organic layer 112.

With the above structure, the organic layer 112 can be flat. In addition, the common electrode 113 overlapping with the light-emitting regions of the organic layer 112 can be flat. In other words, the top surface of the pixel electrode 111 and the bottom surface of the common electrode 113 that overlaps with the light-emitting regions of the organic layer 112 are parallel or substantially parallel to each other in a cross-sectional view of the light-emitting element 90. In a region where the pixel electrode 111 and the common electrode 113 in a top view of the light-emitting element 90 overlap with each other with the light-emitting region of the organic layer 112 positioned therebetween, the entire surface of the pixel electrode 111 on the organic layer 112 side and the entire surface of the common electrode 113 on the organic layer 112 side are parallel or substantially parallel to each other in the cross-sectional view of the light-emitting element 90.

Although FIG. 1B illustrates a structure in which an end portion of the pixel electrode 111 and an end portion of the organic layer 112 are aligned or substantially aligned with each other, one embodiment of the present invention is not limited thereto. Examples of structures, which are different from the above structure, of the display apparatus are described with reference to FIG. 2A to FIG. 2C.

Structure Example 2

Figure 2A:
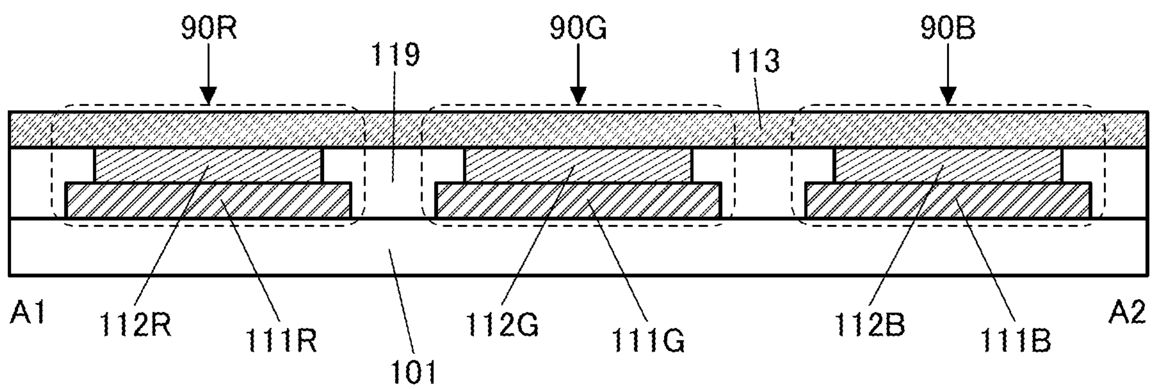
FIG. 2A to FIG. 2C are schematic cross-sectional views illustrating structure examples of a display apparatus.

FIG. 2A is a schematic cross-sectional view taken along the dashed-dotted line A1-A2 in FIG. 1A. The display apparatus illustrated in FIG. 2A is different from the display apparatus illustrated in FIG. 1B in that the width of the pixel electrode 111 is larger than the width of the organic layer 112. Note that description of the same portions as Structure example 1 described above is omitted and different portions are described.

As illustrated in FIG. 2A, the width of the pixel electrode 111R is larger than the width of the organic layer 112R. The width of the pixel electrode 111G is larger than the width of the organic layer 112G. The width of the pixel electrode 111B is larger than the width of the organic layer 112B.

As illustrated in FIG. 2A, the insulating layer 119 includes regions in contact with side surfaces and parts of the top surfaces of the pixel electrode 111R, the pixel electrode 111G, and the pixel electrode 111B and the side surfaces of the organic layer 112R, the organic layer 112G, and the organic layer 112B.

In the above structure, light-emitting regions of the organic layer 112 correspond to regions shown with slant lines in FIG. 2A. That is, the light-emitting region of the organic layer 112 is the whole of the organic layer 112.

With the above structure, the organic layer 112 can be flat. In addition, the common electrode 113 overlapping with the light-emitting regions of the organic layer 112 can be flat. In other words, the top surface of the pixel electrode 111 and the bottom surface of the common electrode 113 that overlaps with the light-emitting regions of the organic layer 112 are parallel or substantially parallel to each other in a cross-sectional view of the light-emitting element 90. In a region where the pixel electrode 111 and the common electrode 113 in a top view of the light-emitting element 90 overlap with each other with the light-emitting region of the organic layer 112 positioned therebetween, the entire surface of the pixel electrode 111 on the organic layer 112 side and the entire surface of the common electrode 113 on the organic layer 112 side are parallel or substantially parallel to each other in the cross-sectional view of the light-emitting element 90.

Structure Example 3

Figure 2B:
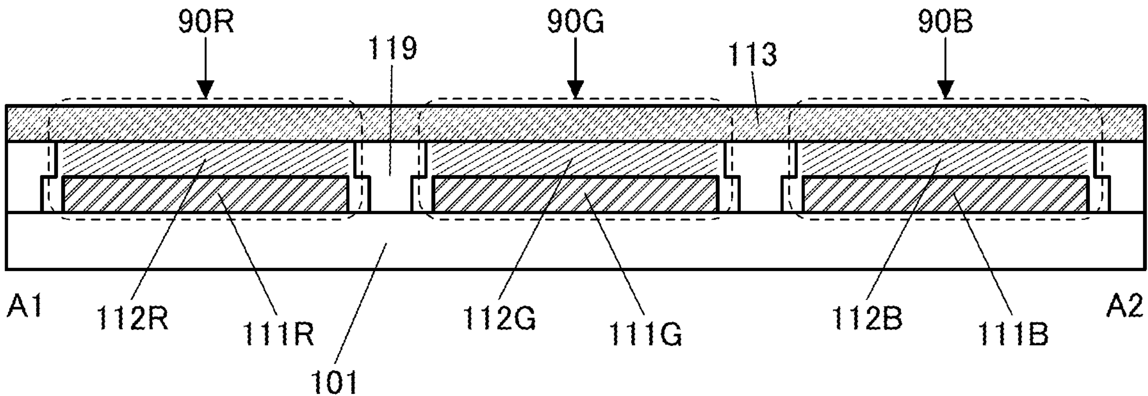

FIG. 2B is a schematic cross-sectional view taken along the dashed-dotted line A1-A2 in FIG. 1A. The display apparatus illustrated in FIG. 2B is different from the display apparatus illustrated in FIG. 1B in that the width of the pixel electrode 111 is smaller than the width of the organic layer 112. Note that description of the same portions as Structure example 1 described above is omitted and different portions are described.

As illustrated in FIG. 2B, the width of the pixel electrode 111R is smaller than the width of the organic layer 112R. The width of the pixel electrode 111G is smaller than the width of the organic layer 112G. The width of the pixel electrode 111B is smaller than the width of the organic layer 112B.

As illustrated in FIG. 2B, the organic layer 112R is provided to cover the top surface and the side surface of the pixel electrode 111R. The organic layer 112G is provided to cover the top surface and the side surface of the pixel electrode 111G. The organic layer 112B is provided to cover the top surface and the side surface of the pixel electrode 111B. Although FIG. 2B illustrates an example in which the side surface of the pixel electrode 111 is vertical, one embodiment of the present invention is not limited thereto and the end portion of the pixel electrode 111 may have a tapered shape. Accordingly, the step coverage with the organic layer 112 is improved and a highly reliable display apparatus can be provided.

Note that in this specification and the like, an end portion of an object having a tapered shape indicates that the end portion of the object has a cross-sectional shape in which the angle between a side surface (a surface) of the object and a surface on which the object is formed (a bottom surface) is greater than 0° and less than 90° in a region of the end portion, and the thickness continuously increases from the end portion. A taper angle refers to an angle between a bottom surface (a surface on which an object is formed) and a side surface (a surface) at an end portion of the object.

As illustrated in FIG. 2B, the insulating layer 119 includes regions in contact with the side surfaces and parts of top surfaces of the organic layer 112R, the organic layer 112G, and the organic layer 112B. With this structure, the distance between the pixel electrode 111 and the common electrode 113 in a region not overlapping with the pixel electrode 111 can be prevented from being shortened. Thus, in the top view, the organic layer 112 in a region not overlapping with the pixel electrode 111 can be inhibited from emitting light. That is, regions of the organic layer 112 which overlap with the pixel electrode 111 (regions shown with slant lines in FIG. 2B) can be the light-emitting regions of the organic layer 112.

With the above structure, the light-emitting region of the organic layer 112 can be flat. In addition, the common electrode 113 overlapping with the light-emitting regions of the organic layer 112 can be flat. In other words, the top surface of the pixel electrode 111 and the bottom surface of the common electrode 113 that overlaps with the light-emitting regions of the organic layer 112 are parallel or substantially parallel to each other in a cross-sectional view of the light-emitting element 90. In a region where the pixel electrode 111 and the common electrode 113 in a top view of the light-emitting element 90 overlap with each other with the light-emitting region of the organic layer 112 positioned therebetween, the entire surface of the pixel electrode 111 on the organic layer 112 side and the entire surface of the common electrode 113 on the organic layer 112 side are parallel or substantially parallel to each other in the cross-sectional view of the light-emitting element 90.

Structure Example 4

Figure 2C:
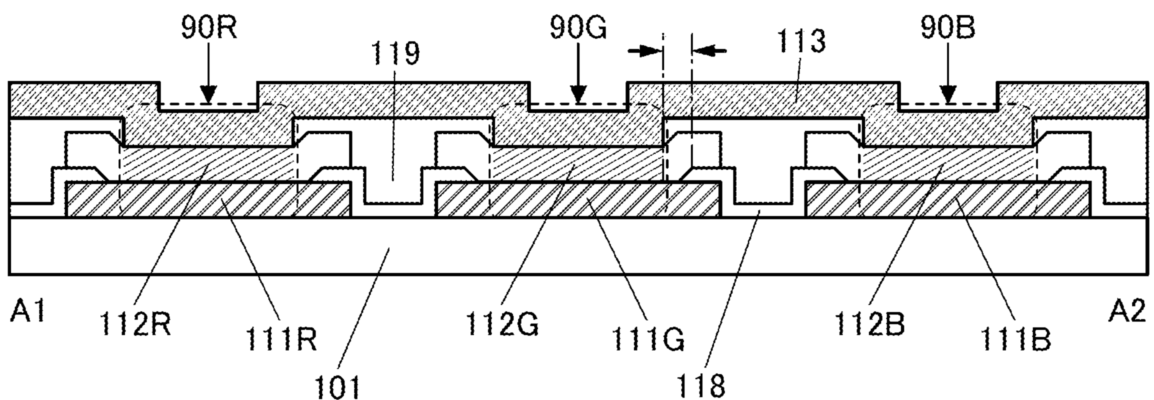

FIG. 2C is a schematic cross-sectional view taken along the dashed-dotted line A1-A2 in FIG. 1A. The display apparatus illustrated in FIG. 2C is different from the display apparatus illustrated in FIG. 1B in that an insulating layer 118 is provided to cover the end portion of the pixel electrode 111. In addition, the display apparatus illustrated in FIG. 2C is different from the display apparatus illustrated in FIG. 1B in that the insulating layer 119 is provided to cover the end portion of the organic layer 112. Note that description of the same portions as Structure example 1 described above is omitted and different portions are described.

As illustrated in FIG. 2C, the insulating layer 118 is provided over the layer 101 and the pixel electrode 111 to cover the end portion of the pixel electrode 111. In other words, the insulating layer 118 is in contact with the side surface and a part of the top surface of the pixel electrode 111. End portions of the insulating layer 118 each preferably have a tapered shape. Thus, the coverage with the organic layer 112 formed over the insulating layer 118 can be improved.

The organic layer 112 is provided over the pixel electrode 111 and the insulating layer 118. Although FIG. 2C illustrates a structure in which the end portion of the organic layer 112 and the end portion of the pixel electrode 111 are aligned or substantially aligned with each other, one embodiment of the present invention is not limited thereto. The width of the pixel electrode 111 may be larger than the width of the organic layer 112, or the width of the pixel electrode 111 may be smaller than the width of the organic layer 112.

The insulating layer 119 is provided over the organic layer 112 and the insulating layer 118. The insulating layer 119 includes regions in contact with the side surface and a part of the top surface of the organic layer 112 and a side surface and a part of a top surface of the insulating layer 118. Note that the region of the insulating layer 119 in contact with the insulating layer 118 is different depending on the width of the organic layer 112, the shape of the insulating layer 118, or the like. For example, in the display apparatus illustrated in FIG. 2C, the insulating layer 119 includes a region in contact with the side surface and the part of the top surface of the organic layer 112 and the side surface and the part of the top surface of the insulating layer 118. Furthermore, for example, in the case where the insulating layer 118 is formed with an organic resin, the insulating layer 118 in a region not overlapping with the pixel electrode 111 does not include a depressed portion in some cases. In that case, the insulating layer 119 includes a region in contact with the side surface and the part of the top surface of the organic layer 112 and the top surface of the insulating layer 118.

The insulating layer 119 is preferably provided over a region of the organic layer 112 having a slope or in a region overlapping with an end portion of the insulating layer 118, further preferably over the region of the organic layer 112 having a slope or in a region that overlaps with the end portion of the insulating layer 118 with the organic layer 112 positioned therebetween. With this structure, a gap between the pixel electrode 111 and the common electrode 113 with regions indicated by arrows in FIG. 2C (the region of the organic layer 112 having a slope or the region where the insulating layer 119 overlaps with the end portion of the insulating layer 118) therebetween can be made large. Accordingly, a region (a region shown with slant lines in FIG. 2C) of the organic layer 112 which overlaps with a region where the distance between the pixel electrode 111 and the common electrode 113 is the shortest can be the light-emitting region of the organic layer 112.

With the above structure, the light-emitting region of the organic layer 112 can be flat. In addition, the common electrode 113 overlapping with the light-emitting regions of the organic layer 112 can be flat. In other words, the top surface of the pixel electrode 111 and the bottom surface of the common electrode 113 that overlaps with the light-emitting regions of the organic layer 112 are parallel or substantially parallel to each other in a cross-sectional view of the light-emitting element 90. In a region where the pixel electrode 111 and the common electrode 113 in a top view of the light-emitting element 90 overlap with each other with the light-emitting region of the organic layer 112 positioned therebetween, the entire surface of the pixel electrode 111 on the organic layer 112 side and the entire surface of the common electrode 113 on the organic layer 112 side are parallel or substantially parallel to each other in the cross-sectional view of the light-emitting element 90.

Chromaticity Range of Display Apparatus

The display apparatus of this embodiment includes a plurality of light-emitting elements and can display a full-color image. Here, some standards are established as quality indicators for full-color display.

For example, the sRGB standard, which is an international standard for color spaces defined by the International Electrotechnical Commission (IEC) to standardize color reproductions different between devices such as displays, printers, digital cameras, and scanners, is widely used.

Note that in the sRGB standard, the chromaticities (x, y) on the CIE 1931 chromaticity coordinates (x,y chromaticity coordinates) defined by the International Commission on Illumination (CIE) are (x, y)=(0.640, 0.330) for red (R), (x, y)=(0.300, 0.600) for green (G), and (x, y)=(0.150, 0.060) for blue (B).

Note that although described as chromaticities (x, y) on the CIE 1931 chromaticity coordinates (x,y chromaticity coordinates) can also be described with the CIE 1976 chromaticity coordinates (u',v' chromaticity coordinates), which are defined so that the perceived color differences may be substantially proportional to distances in the space, when the following conversion equations (1) is used.

[Formula 1]

$$u' = \frac{4x}{-2x + 12y + 3} \quad (1)$$
$$v' = \frac{9y}{-2x + 12y + 3}$$

In the NTSC standard, which is a color gamut standard for analog television systems defined by the National Television System Committee (NTSC) in America, the chromaticities (x, y) are (x, y)=(0.670, 0.330) for red (R), (x, y)=(0.210, 0.710) for green (G), and (x, y)=(0.140, 0.080) for blue (B).

In the DCI-P3 (Digital Cinema Initiatives) standard, which is the international unified standard used when distributing digital movies (cinema), the chromaticities (x, y) are (x, y)=(0.680, 0.320) for red (R), (x, y)=(0.265, 0.690) for green (G), and (x, y)=(0.150, 0.060) for blue (B).

In Recommendation ITU-R BT.2020 (hereinafter referred to as BT.2020), which is the standard defined by NHK and used for ultra high definition television (UHDTV, also referred to as Super Hi-Vision), the chromaticities (x, y) are (0.708, 0.292) for red, (0.170, 0.797) for green, and (0.131, 0.046)) for blue.

As described above, a variety of standards for displaying images are defined.

Note that for the calculation of chromaticity, any of a color luminance meter, a spectroradiometer, and an emission spectrometer may be used.

First Direction, Second Direction

The first direction and the second direction described above are described with reference to FIG. 3. Here, the first direction and the second direction are mainly described with use of a spherical coordinate system.

Figure 3:
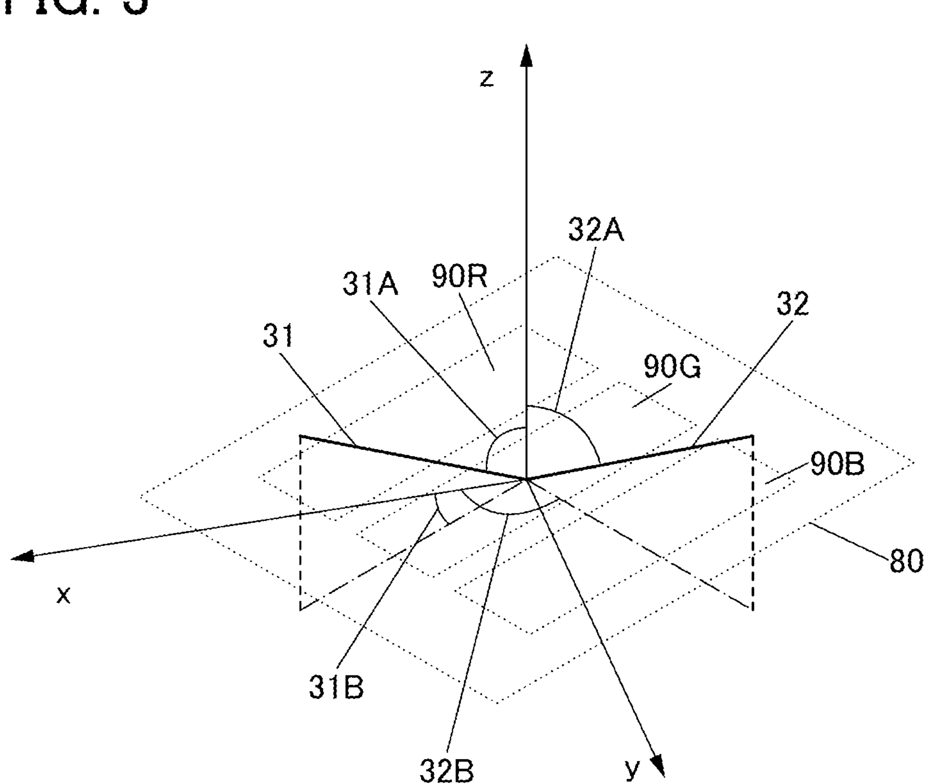
FIG. 3 is a diagram showing directions for calculation of a chromaticity difference.

FIG. 3 is a perspective view of the display region 80 included in the display apparatus. FIG. 3 illustrates a structure in which three light-emitting elements (the light-emitting element 90R, the light-emitting element 90G, and the light-emitting element 90B) are arranged. Note that the display region 80 is parallel to a surface of a substrate (not illustrated). Therefore, the display region 80 described below can be replaced with the substrate.

Here, description is given on the assumption that the shape of each light-emitting element is rectangular in a top view. That is, the top surface shape of each light-emitting element is a rectangle formed of a pair of long sides and a pair of short sides. Although FIG. 3 illustrates an example in which the light-emitting element 90R, the light-emitting element 90G, and the light-emitting element 90B each have a rectangular shape in the top view, one embodiment of the present invention is not limited thereto. At least one of the light-emitting element 90R, the light-emitting element 90G, and the light-emitting element 90B preferably has a rectangular shape in the top view. The top surface shape of each light-emitting element is not limited to a rectangular shape, and may be a shape other than a circle (a perfect circle) and a regular polygon. For example, a rectangle with rounded vertices, an oval (an egg-like shape, an elliptic shape, or the like), or a polygon having two or more different side lengths may be employed.

As illustrated in FIG. 3, the normal direction of the display region 80 is a z axis, a direction perpendicular to the z axis is an x axis, and a direction orthogonal to the z axis and the x axis is a y axis. In other words, the x axis and the y axis are parallel to the display region 80. In the following description, a plane parallel to the display region 80 is sometimes referred to as an xy plane.

FIG. 3 illustrates a first direction 31 and a second direction 32. The first direction 31 corresponds to the above-described first direction and the second direction 32 corresponds to the above-described second direction.

As illustrated in FIG. 3, an angle formed by the first direction 31 and the z axis is an angle 31A, and an angle formed by the second direction 32 and the z axis is an angle 32A. An angle formed by a projection of the first direction 31 onto the xy plane and the x axis is an angle 31B, and an angle formed by a projection of the second direction 32 onto the xy plane and the x axis is an angle 32B.

In the case where, on the CIE 1976 chromaticity coordinates, an absolute value of a difference between the chromaticity difference Δu'v' between a chromaticity of light emitted from each light-emitting element in the front direction and the chromaticity in the first direction and the chromaticity difference Δu'v' between the chromaticity in the front direction and the chromaticity in the second direction is calculated, the first direction 31 is set such that the projection of the first direction 31 onto the xy plane is parallel to a long side of the light-emitting element, and the second direction 32 is set such that the projection of the second direction 32 onto the xy plane is parallel to a short side of the light-emitting element. In other words, in the top view of the display region 80, the first direction 31 is parallel to the long side of the light-emitting element, and the second direction 32 is parallel to the short side of the light-emitting element. Since the light-emitting element has a rectangular shape in the top view, the angle formed by the long side of the light-emitting element and the short side of the light-emitting element is a right angle, so that the projection of the second direction 32 onto the xy plane is perpendicular to the projection of the first direction 31 onto the xy plane.

Furthermore, the first direction 31 and the second direction 32 are set such that an angle formed by the front direction (corresponding to the z axis direction) and the first direction 31 is equal to an angle formed by the front direction and the second direction 32 and an angle formed by the projection of the first direction 31 onto the xy plane and the projection of the second direction 32 onto the xy plane is 90° or 270° in the top view of the display region 80. In other words, the first direction 31 and the second direction 32 are set such that the angle 31A and the angle 32A are equal to each other and a difference between the angle 31B and the angle 32B is 90° or 270°.

The absolute value of the difference between the above two chromaticity differences Δu'v' may be calculated with the angle 31A and the angle 32A each set to an angle selected from 30° to 80° inclusive or with some or all of angles of 30° to 80° inclusive.

Note that an absolute value of inclination of the second direction 32 from the front is the same as that of the first direction 31, and a projection of the second direction 32 onto the display region 80 can be regarded as a direction perpendicular to a projection of the first direction 31 onto the display region 80. The second direction 32 can be regarded as the first direction 31 in the case where the display region 80 is rotated by 90° in the top view in a state where the first direction 31 is fixed.

In the case where the light-emitting element has a top surface shape other than a rectangular shape, a long side and a short side cannot be determined in some cases. For example, in the case where the top surface shape of the light-emitting element has a symmetry axis, the first direction 31 may be set such that the projection of the first direction 31 onto the xy plane is parallel to the symmetry axis, and the second direction 32 may be set such that the projection of the second direction 32 onto the xy plane is perpendicular to the symmetry axis. The first direction 31 is preferably set such that the projection of the first direction 31 onto the xy plane is parallel to a straight line passing through the center of gravity of the shape of the light-emitting element and having the longest distance to the outer edge (outline) of the shape, and the second direction 32 is preferably set such that the projection of the second direction 32 onto the xy plane is parallel to a straight line passing through the center of gravity of the shape and having the shortest distance to the outer edge of the shape. In that case, an angle formed by the projection of the first direction 31 onto the xy plane and the projection of the second direction 32 onto the xy plane is not limited to a right angle (90° or 270°).

The same applies to the calculation of the ratio of, on the CIE 1976 chromaticity coordinates, the chromaticity difference Δu'v' in a chromaticity of light emitted from each light-emitting element in the front direction and the chromaticity in the second direction to the chromaticity difference Δu'v' between the chromaticity in the front direction and the chromaticity in the first direction.

As described above, one embodiment of the present invention can provide a display apparatus with a wide viewing angle. Furthermore, a display apparatus with high color purity can be provided. A display apparatus with a wide viewing angle in the horizontal (lateral) direction and the perpendicular (vertical) direction can be provided. A display apparatus with high color purity in the horizontal (lateral) direction and the perpendicular (vertical) direction can be provided.

At least part of this embodiment can be implemented as appropriate in combination with any of the other embodiments described in this specification.

Embodiment 2

In this embodiment, a structure example of a display apparatus of one embodiment of the present invention and an example of a method for manufacturing the display apparatus will be described.

One embodiment of the present invention is a display apparatus including a light-emitting element (also referred to as a light-emitting device). For example, when three kinds of light-emitting elements that emit red (R) light, green (G) light, and blue (B) light are included, a full-color display apparatus can be achieved.

In one embodiment of the present invention, fine patterning of island-shaped EL layers or an island-shaped EL layer and an active layer are performed by a photolithography method without a shadow mask such as a metal mask. This can achieve a display apparatus with high definition and a high aperture ratio, which has been difficult to achieve. Moreover, EL layers can be separately formed, enabling the display apparatus to perform extremely clear display with high contrast and high display quality.

Note that in this specification and the like, the term “island shape” refers to a state where two or more layers formed using the same material in the same step are physically separated from each other. For example, “island-shaped EL layer” means a state where the EL layer and its adjacent EL layer are physically separated from each other.

It is difficult to set the space between EL layers for different colors or between an EL layer and an active layer to be less than 10 μm with a formation method using a metal mask, for example; however, with use of the above method, the space can be narrowed to be less than or equal to 3 μm, less than or equal to 2 μm, or less than or equal to 1 μm. For example, with use of an exposure apparatus for LSI, the space can be narrowed to be less than or equal to 500 nm, less than or equal to 200 nm, less than or equal to 100 nm, or less than or equal to 50 nm. Accordingly, the area of a non-light-emitting region that may exist between two light-emitting elements can be significantly reduced, and the aperture ratio can be close to 100%. For example, the aperture ratio higher than or equal to 50%, higher than or equal to 60%, higher than or equal to 70%, higher than or equal to 80%, or higher than or equal to 90% and lower than 100% can be achieved.

Furthermore, patterns of the EL layer and the active layer can be made extremely smaller than that in the case of using a metal mask. For example, in the case of using a metal mask for forming EL layers separately, a variation in the thickness of the pattern occurs between the center and the edge of the pattern, causing a reduction in effective area that can be used for a light-emitting region with respect to the entire pattern area. In contrast, in the above manufacturing method, a pattern is formed by processing a film deposited to have a uniform thickness, which enables a uniform thickness in the pattern; thus, even in the case of a fine pattern, almost the entire area can be used for a light-emitting region. Therefore, the above manufacturing method makes it possible to achieve both high definition and a high aperture ratio.

In many cases, an organic film formed using an FMM (Fine Metal Mask) has an extremely small taper angle (e.g., a taper angle greater than 0° and less than 30°) so that the thickness of the film becomes smaller in a portion closer to an end portion. Therefore, it is sometimes difficult to clearly observe a side surface of an organic film formed using an FMM because the side surface and a top surface are continuously connected. By contrast, in one embodiment of the present invention, an EL layer is processed without using an FMM and thus a side surface can be observed clearly. In particular, in one embodiment of the present invention, a taper angle of the EL layer is preferably greater than or equal to 30° and less than or equal to 120°, further preferably greater than or equal to 60° and less than or equal to 120°.

In this specification and the like, a device fabricated using a metal mask or an FMM (fine metal mask, high-resolution metal mask) is sometimes referred to as a device having an MM (metal mask) structure. In this specification and the like, a device fabricated using an FMM is sometimes referred to as a device having an FMM structure. In this specification and the like, a device fabricated without using a metal mask or an FMM is sometimes referred to as a device having an MML (metal maskless) structure. A display apparatus having an MML structure is fabricated without using a metal mask and thus has higher flexibility in designing the pixel arrangement, the pixel shape, and the like than a display apparatus having an FMM structure or an MM structure.

Note that in the method of fabricating a display apparatus having an MML structure, an island-shaped EL layer is formed not by patterning with the use of a metal mask but by processing an EL layer formed over an entire surface. Accordingly, a high-definition display apparatus or a display apparatus with a high aperture ratio, each of which has been difficult to achieve, can be obtained. Moreover, EL layers of different colors can be formed separately, which enables the display apparatus to perform extremely clear display with high contrast and high display quality. Moreover, providing the sacrificial layer over the EL layer can reduce damage to the EL layer in the manufacturing process of the display apparatus, resulting in an increase in reliability of the light-emitting element. Note that in this specification and the like, a sacrificial layer may be referred to as a mask layer.

The display apparatus of one embodiment of the present invention has a structure in which an insulator for covering the end portion of the pixel electrode is not provided. In other words, an insulator is not provided between the pixel electrode and the EL layer. With such a structure, light can be efficiently extracted from the EL layer, and thus viewing angle dependence can be extremely reduced. For example, in the display apparatus of one embodiment of the present invention, the viewing angle (the maximum angle with a certain contrast ratio maintained when the screen is seen from an oblique direction) can be greater than or equal to 100° and less than 180°, preferably greater than or equal to 150° and less than or equal to 170°. Note that the viewing angle refers to that in both the vertical direction and the horizontal direction. The display apparatus of one embodiment of the present invention can have improved viewing angle dependence and high image visibility.

In the case where a display apparatus is formed using an FMM, the pixel arrangement or the like is limited in some cases. Here, formation of the EL layer using an FMM is described below.

In the case where an EL layer is formed with use of an FMM, a metal mask provided with an opening portion (also referred to as an FMM) is set to be opposed to a substrate so that an EL can be deposited to a desired region at the time of EL evaporation. Then, the EL is deposited to the desired region by EL evaporation through the FMM. When the size of the substrate at the time of EL evaporation is larger, the size of the FMM is increased and accordingly the weight thereof is also increased. In addition, heat or the like is applied to the FMM at the time of EL evaporation and may change the shape of the FMM. Furthermore, there is a method in which EL evaporation is performed while a certain level of tension is applied to the FMM; therefore, the weight and strength of the FMM are important parameters.

Therefore, a configuration of pixel arrangement in a display apparatus having the FMM structure needs to be designed under certain restrictions; for example, the above-described parameters and the like need to be considered. In contrast, the display apparatus of one embodiment of the present invention has the MML structure, and thus exhibits an excellent effect, such as higher design flexibility in the pixel arrangement structure or the like than a display apparatus having the FMM structure. This structure is highly compatible with a flexible device or the like, for example, and thus one or both of a pixel and a driver circuit can have a variety of circuit arrangements.

In this specification and the like, a structure in which light-emitting layers in light-emitting elements of different colors (here, blue (B), green (G), and red (R)) are separately formed or separately patterned may be referred to as an SBS (Side By Side) structure. In this specification and the like, a light-emitting element capable of emitting white light may be referred to as a white-light-emitting element. Note that a combination of white-light-emitting elements with coloring layers (e.g., color filters) enables a full-color display apparatus.

Light-emitting elements can be classified roughly into a single structure and a tandem structure. An element having a single structure includes one light-emitting unit between a pair of electrodes, and the light-emitting unit preferably includes one or more light-emitting layers. To obtain white light emission by using two light-emitting layers, two light-emitting layers are selected such that the light-emitting layers emit light of complementary colors. For example, when the emission color of a first light-emitting layer and the emission color of a second light-emitting layer are complementary colors, the light-emitting element can be configured to emit white light as a whole. To obtain white light emission by using three or more light-emitting layers, the light-emitting element is configured to emit white light as a whole by combining emission colors of the three or more light-emitting layers.

An element having a tandem structure includes two or more light-emitting units between a pair of electrodes, and each light-emitting unit preferably includes one or more light-emitting layers. When light-emitting layers that emit light of the same color are used in each light-emitting unit, luminance per predetermined current can be increased, and the light-emitting element can have higher reliability than that with a single structure. To obtain white light emission with a tandem structure, a structure in which white light emission can be obtained by combining light from light-emitting layers of a plurality of light-emitting units is employed. Note that a combination of emission colors for obtaining white light emission is similar to that of the case of a single structure. In the element having a tandem structure, an intermediate layer such as a charge-generation layer is suitably provided between the plurality of light-emitting units.

When the white-light-emitting element (having a single structure or a tandem structure) and a light-emitting element having an SBS structure are compared to each other, the light-emitting element having an SBS structure can have lower power consumption than the white-light-emitting element. To reduce power consumption, a light-emitting element having an SBS structure is preferably used. Meanwhile, the white-light-emitting element is preferable in terms of lower manufacturing cost or higher manufacturing yield because the manufacturing process of the white-light-emitting element is simpler than that of a light-emitting element having an SBS structure.

There is no particular limitation on the structure of the light-emitting element in this embodiment, and the light-emitting element can have a single structure or a tandem structure.

More specific examples are described below.

Structure Example

Figure 4:
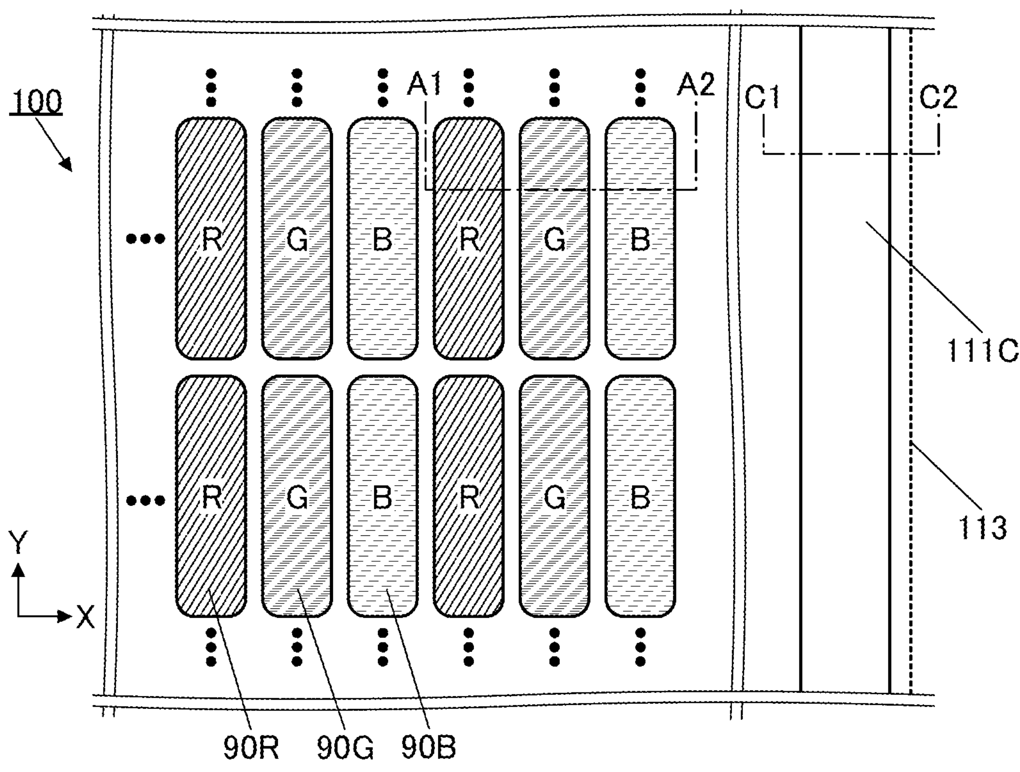
FIG. 4 is a schematic top view illustrating a structure example of a display apparatus.

FIG. 4 is a schematic top view of the display region of the display apparatus 100 and the neighboring area. The display region of the display apparatus 100 includes a plurality of light-emitting elements 90R exhibiting red, a plurality of light-emitting elements 90G exhibiting green, and a plurality of light-emitting elements 90B exhibiting blue. In FIG. 4, light-emitting regions of the light-emitting elements are denoted by R, G, and B to easily differentiate the light-emitting elements.

The light-emitting elements 90R, the light-emitting elements 90G, and the light-emitting elements 90B are arranged in a matrix. FIG. 4 illustrates stripe arrangement. Note that the arrangement method of the light-emitting elements is not limited thereto; another arrangement method such as an S-stripe arrangement, a delta arrangement, a Bayer arrangement, or a zigzag arrangement may be employed, or a PenTile arrangement or a diamond arrangement may also be used.

FIG. 4 illustrates a connection electrode 111C that is electrically connected to a common electrode 113. The connection electrode 111C is supplied with a potential (e.g., an anode potential or a cathode potential) that is to be supplied to the common electrode 113. The connection electrode 111C is provided outside a display region where the light-emitting elements 90R and the like are arranged. In FIG. 4, the common electrode 113 is denoted by a dashed line.

The connection electrode 111C can be provided along the outer periphery of the display region. For example, the connection electrode 111C may be provided along one side of the outer periphery of the display region or two or more sides of the outer periphery of the display region. That is, in the case where the display region has a rectangular top surface, a top surface of the connection electrode 111C can have a belt-like shape, an L shape, a U shape (a square bracket shape), or a quadrangular shape, for example.

Figures 5A, 5B, 5C, 5D:
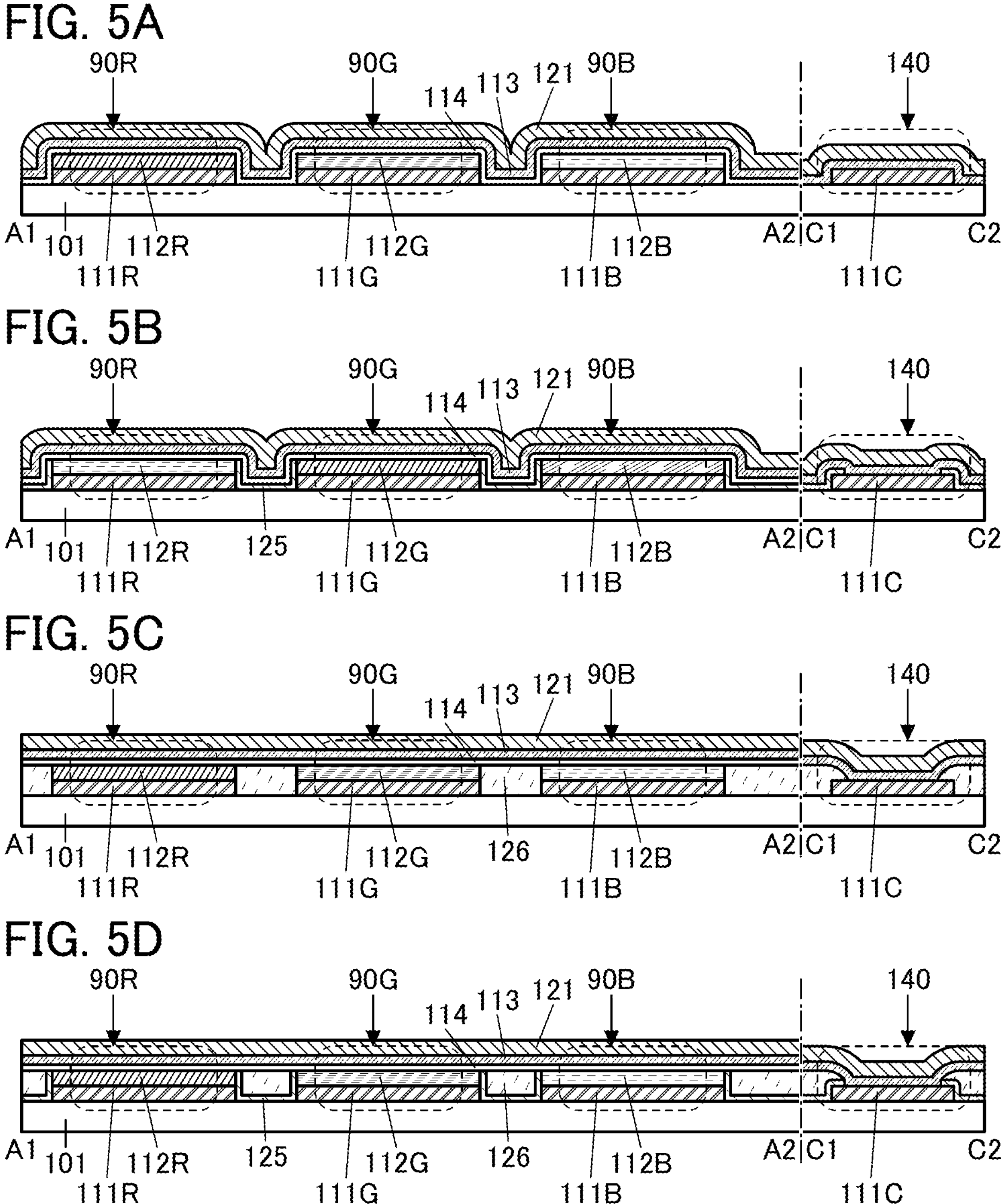
FIG. 5A to FIG. 5D are cross-sectional views illustrating structure examples of a display apparatus.

FIG. 5A is a cross-sectional view taken along dashed-dotted line A1-A2 and dashed-dotted line C1-C2 in FIG. 4. FIG. 5A is a cross-sectional view of the light-emitting element 90R, the light-emitting element 90G, the light-emitting element 90B, and the connection portion 140.

The light-emitting element 90R, the light-emitting element 90G, and the light-emitting element 90B are provided over the layer 101. The layer 101 is provided over a substrate (not illustrated). Alternatively, the layer 101 includes a substrate (not illustrated).

The layer 101 can have a stacked-layer structure in which a plurality of transistors (not illustrated) are provided and an insulating layer is provided so as to cover these transistors, for example. Here, although FIG. 5A illustrates an example in which the layer 101 does not include a depressed portion between adjacent light-emitting elements, the layer 101 may include a depressed portion.

In the layer 101, a pixel circuit, a scan line driver circuit (gate driver), and a signal line driver circuit (source driver), for example, are preferably formed. In addition to the above, an arithmetic circuit, a memory circuit, or the like may be formed.

The light-emitting element 90R includes the pixel electrode 111R, an organic layer 112R, the organic layer 114, and the common electrode 113. The light-emitting element 90G includes the pixel electrode 111G, the organic layer 112G, the organic layer 114, and the common electrode 113. The light-emitting element 90B includes the pixel electrode 111B, the organic layer 112B, the organic layer 114, and the common electrode 113. The organic layer 114 and the common electrode 113 are shared by the light-emitting element 90R, the light-emitting element 90G, and the light-emitting element 90B. The organic layer 114 can also be referred to as a common layer.

The organic layer 112R contains at least a light-emitting organic compound that emits light with intensity in a red wavelength range. The organic layer 112G contains at least a light-emitting organic compound that emits light with intensity in a green wavelength range. The organic layer 112B contains at least a light-emitting organic compound that emits light with intensity in a blue wavelength range. Each of the organic layer 112R, the organic layer 112G, and the organic layer 112B can also be referred to as an EL layer.

The organic layer 112R, the organic layer 112G, and the organic layer 112B may each include one or more of an electron-injection layer, an electron-transport layer, a hole-injection layer, and a hole-transport layer. The organic layer 114 does not necessarily include the light-emitting layer. For example, the organic layer 114 includes one or more of an electron-injection layer, an electron-transport layer, a hole-injection layer, and a hole-transport layer.

Here, the uppermost layer in the stacked-layer structure of the organic layer 112R, the organic layer 112G, and the organic layer 112B, i.e., the layer in contact with the organic layer 114 is preferably a layer other than the light-emitting layer. For example, a structure is preferable in which an electron-injection layer, an electron-transport layer, a hole-injection layer, a hole-transport layer, or a layer other than those is provided to cover the light-emitting layer so as to be in contact with the organic layer 114. When a top surface of the light-emitting layer is protected by another layer in manufacturing each light-emitting element, the reliability of the light-emitting element can be improved.

The pixel electrode 111 is provided for each light-emitting element. The common electrode 113 and the organic layer 114 are each provided as a continuous layer shared by the light-emitting elements. A conductive film that has a property of transmitting visible light is used for either the pixel electrodes or the common electrode 113, and a reflective conductive film is used for the other. When the pixel electrodes have a light-transmitting property and the common electrode 113 has a reflective property, a bottom-emission display apparatus can be obtained; by contrast, when the pixel electrodes have a reflective property and the common electrode 113 has a light-transmitting property, a top-emission display apparatus can be obtained. Note that when both the pixel electrodes and the common electrode 113 transmit light, a dual-emission display apparatus can be obtained.

As illustrated in FIG. 5A, spaces are provided between the two organic layers 112 of the light-emitting elements of different colors. In this manner, the organic layer 112R, the organic layer 112G, and the organic layer 112B are preferably provided so as not to be in contact with each other. This can suitably prevent unintentional light emission due to current flowing through the two adjacent organic layers 112. As a result, the contrast can be increased to achieve a display apparatus with high display quality.

The organic layer 112R, the organic layer 112G, and the organic layer 112B each preferably have a taper angle greater than or equal to 30°. In an end portion of each of the organic layer 112R, an organic layer 112G, and the organic layer 112B, the angle between a side surface (a surface) and a bottom surface (a surface on which the layer is formed) is preferably greater than or equal to 30° and less than or equal to 120°, further preferably greater than or equal to 45° and less than or equal to 120°, still further preferably greater than or equal to 60° and less than or equal to 120°. Alternatively, the organic layer 112R, the organic layer 112G, and the organic layer 112B each preferably have a taper angle of 90° or a neighborhood thereof (e.g., greater than or equal to 80° and less than or equal to 100°).

A protective layer 121 is provided over the common electrode 113. The protective layer 121 has a function of preventing diffusion of impurities such as water into the light-emitting elements from above.

The protective layer 121 can have, for example, a single-layer structure or a stacked-layer structure at least including an inorganic insulating film. For the inorganic insulating film, for example, an oxide film, an oxynitride film, a nitride oxide film, or a nitride film such as a silicon oxide film, a silicon oxynitride film, a silicon nitride oxide film, a silicon nitride film, an aluminum oxide film, an aluminum oxynitride film, or a hafnium oxide film can be given. Alternatively, a semiconductor material such as indium gallium oxide or indium gallium zinc oxide may be used for the protective layer 121.

As the protective layer 121, a stacked-layer film of an inorganic insulating film and an organic insulating film can be used. For example, a structure in which an organic insulating film is sandwiched between a pair of inorganic insulating films is preferable. Furthermore, the organic insulating film preferably functions as a planarization film. This enables the top surface of the organic insulating film to be flat, and accordingly, coverage with the inorganic insulating film thereover is improved, which leads to an improvement in barrier properties of the protective layer 121 against impurities. Moreover, the top surface of the protective layer 121 is flat, which is preferable because the influence of an uneven shape due to a lower structure can be reduced in the case where a component (e.g., a color filter, an electrode of a touch sensor, a lens array, or the like) is provided above the protective layer 121.

In the connection portion 140, the common electrode 113 is provided on and in contact with the connection electrode 111C and the protective layer 121 is provided to cover the common electrode 113.

FIG. 5A illustrates an example of the case where the end portion of the pixel electrode 111R and the end portion of the organic layer 112R are aligned or substantially aligned with each other, the end portion of the pixel electrode 111G and the end portion of the organic layer 112G are aligned or substantially aligned with each other, and the end portion of the pixel electrode 111B and the end portion of the organic layer 112B are aligned or substantially aligned with each other.

In FIG. 5A, the organic layer 114 is provided to cover top surfaces and side surfaces of the organic layer 112R, the organic layer 112G, and the organic layer 112B. The organic layer 114 can prevent the pixel electrode 111 and the common electrode 113 from being in contact with each other and being electrically short-circuited.

The structure of the display apparatus of one embodiment of the present invention is not limited to the structures illustrated in FIG. 5A. A structure example of a display apparatus whose structure is partly different from that in FIG. 5A is described below.

FIG. 5B illustrates an example of the case where the display apparatus includes an insulating layer 125 provided in contact with side surfaces of the organic layer 112R, the organic layer 112G, the organic layer 112B, and the pixel electrode 111. That is, the display apparatus illustrated in FIG. 5B is different from the display apparatus illustrated in FIG. 5A in including the insulating layer 125. Providing the insulating layer 125 can effectively inhibit electrical short circuit between the pixel electrode 111 and the common electrode 113 and leakage current therebetween.

Note that the insulating layer 125 may be provided in contact with a side surface of the connection electrode 111C. FIG. 5B illustrates an example of the case where the insulating layer 125 includes a region in contact with the side surface and a part of a top surface of the connection electrode 111C.

The insulating layer 125 can be an insulating layer containing an inorganic material. As the insulating layer 125, an inorganic insulating film such as an oxide insulating film, a nitride insulating film, an oxynitride insulating film, and a nitride oxide insulating film can be used. The insulating layer 125 may have a single-layer structure or a stacked-layer structure. Examples of the oxide insulating film include a silicon oxide film, an aluminum oxide film, a magnesium oxide film, an indium gallium zinc oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film. In particular, when an inorganic insulating film such as an aluminum oxide film, a hafnium oxide film, or a silicon oxide film formed by an atomic layer deposition (ALD) method is used as the insulating layer 125, the insulating layer 125 can have few pinholes and an excellent function of protecting the organic layer.

Note that in this specification and the like, an oxynitride refers to a material that contains more oxygen than nitrogen in its composition, and a nitride oxide refers to a material that contains more nitrogen than oxygen in its composition. For example, in the case where silicon oxynitride is described, it refers to a material that contains more oxygen than nitrogen in its composition; in the case where silicon nitride oxide is described, it refers to a material that contains more nitrogen than oxygen in its composition. For example, an aluminum oxynitride refers to a material that contains oxygen at a higher proportion than nitrogen, and an aluminum nitride oxide refers to a material that contains nitrogen at a higher proportion than oxygen.

In FIG. 5C, a resin layer 126 is provided between two adjacent light-emitting elements so as to fill the space between two pixel electrodes facing to each other and two organic layers facing to each other. That is, the display apparatus illustrated in FIG. 5C is different from the display apparatus illustrated in FIG. 5A in including the resin layer 126. The resin layer 126 can planarize the surface on which the organic layer 114, the common electrode 113, and the like are formed, which prevents disconnection of the common electrode 113 due to poor coverage with the common electrode 113 in a step between adjacent light-emitting elements.

A top surface of the resin layer 126 is preferably as flat as possible; however, the surface of the resin layer 126 may have a depressed shape or a projecting shape depending on an uneven shape of a surface on which the resin layer 126 is formed, the formation conditions of the resin layer 126, or the like.

Note that the resin layer 126 may be provided in contact with a side surface of the connection electrode 111C. FIG. 5C illustrates an example of the case where the resin layer 126 includes a region in contact with the side surface and a part of a top surface of the connection electrode 111C.

An insulating layer containing an organic material can be suitably used as the resin layer 126. For example, as the resin layer 126, an acrylic resin, a polyimide resin, an epoxy resin, an imide resin, a polyamide resin, a polyimide-amide resin, a silicone resin, a siloxane resin, a benzocyclobutene-based resin, a phenol resin, and precursors of these resins can be used. As the resin layer 126, an organic material such as polyvinyl alcohol (PVA), polyvinyl butyral, polyvinylpyrrolidone, polyethylene glycol, polyglycerin, pullulan, water-soluble cellulose, or an alcohol-soluble polyamide resin may be used. A photosensitive resin can be used as the resin layer 126. A photoresist may be used for the photosensitive resin. As the photosensitive resin, a positive photosensitive material or a negative photosensitive material can be used.

With the use of the photosensitive resin, the resin layer 126 can be formed by only light exposure and developing steps. The resin layer 126 may be formed using a negative photosensitive resin (e.g., a resist material). In the case where an insulating layer containing an organic material is used as the resin layer 126, a material absorbing visible light is suitably used. With use of a material absorbing visible light for the resin layer 126, light emitted from the EL layer can be absorbed by the resin layer 126, whereby light that might leak to an adjacent EL layer (stray light) can be reduced. Accordingly, a display apparatus with high display quality can be provided.

A colored material (e.g., a material containing a black pigment) may be used for the resin layer 126 so that the resin layer 126 has a function of blocking stray light from adjacent pixels and inhibiting color mixture.

In FIG. 5D, the insulating layer 125 and the resin layer 126 over the insulating layer 125 are provided. That is, the display apparatus illustrated in FIG. 5D is different from the display apparatus illustrated in FIG. 5A in including the insulating layer 125 and the resin layer 126. Since the insulating layer 125 prevents the organic layer 112 from being in contact with the resin layer 126, impurities such as moisture contained in the resin layer 126 can be prevented from being diffused into the organic layer 112, whereby a highly reliable display apparatus can be provided. A reflective film (e.g., a metal film containing one or more of silver, palladium, copper, titanium, aluminum, and the like) may be provided between the insulating layer 125 and the resin layer 126 so that light emitted from the light-emitting layer is reflected by the reflective film to provide a function of increasing light extraction efficiency.

The display apparatuses illustrated in FIG. 6A to FIG. 6C and FIG. 7A to FIG. 7E are different from the display apparatus illustrated in FIG. 5A in that the width of the pixel electrode 111 is different from the width of the organic layer 112.

Figures 6A, 6B, 6C:
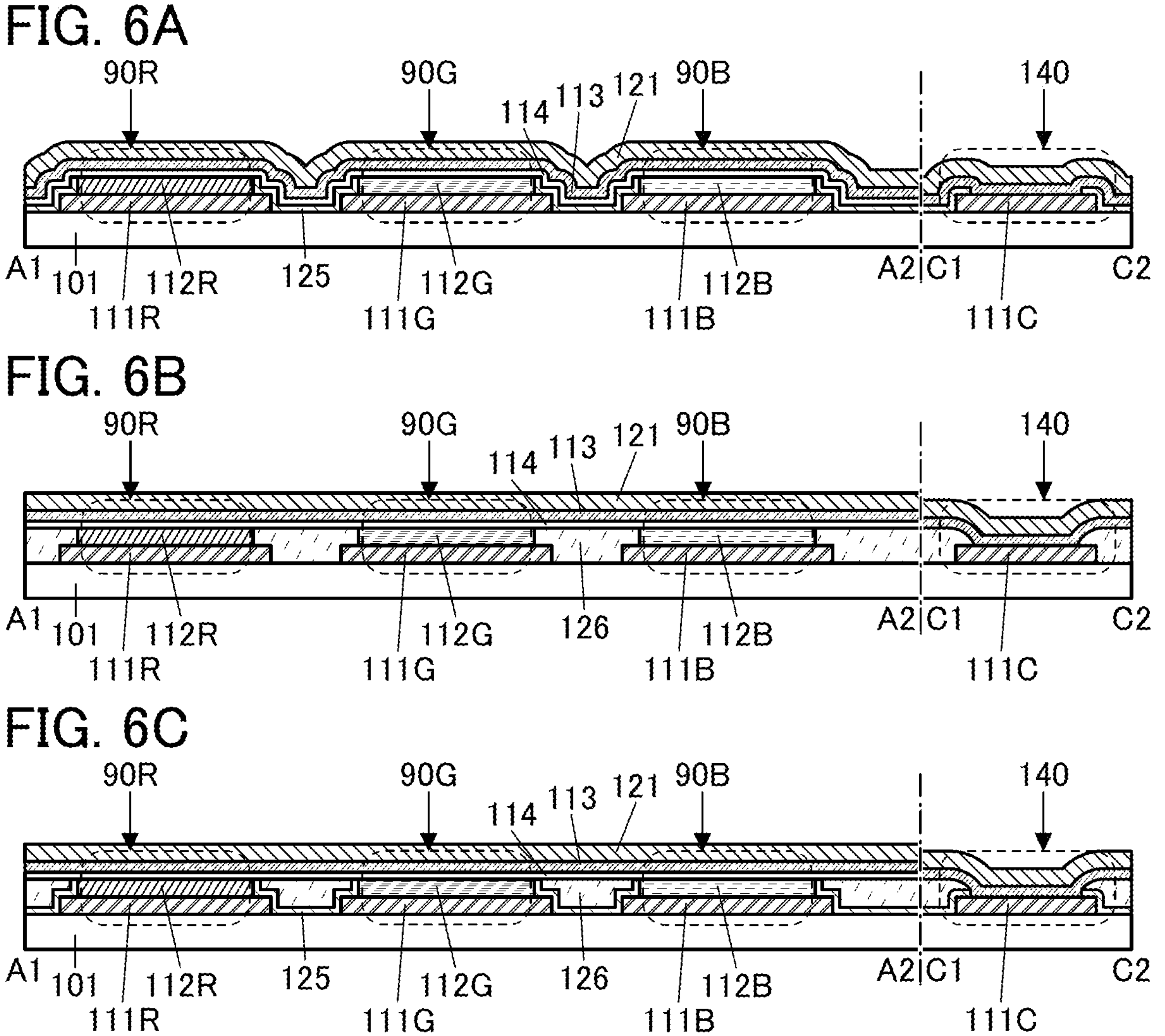
FIG. 6A to FIG. 6C are cross-sectional views illustrating structure examples of a display apparatus.

FIG. 6A to FIG. 6C each illustrate an example of the case where the width of the pixel electrode 111R is larger than the width of the organic layer 112R, the width of the pixel electrode 111G is larger than the width of the organic layer 112G, and the width of the pixel electrode 111B is larger than the width of the organic layer 112B. The organic layer 112R is provided on the inner side than the end portions of the pixel electrode 111R, the organic layer 112G is provided on the inner side than the end portions of the pixel electrode 111G, and the organic layer 112B is provided on the inner side than the end portions of the pixel electrode 111B.

FIG. 6A illustrates an example in which the insulating layer 125 is provided. The insulating layer 125 is provided to cover a side surface of the organic layer 112 included in the light-emitting element and a side surface and part of a top surface of the pixel electrode 111.

FIG. 6B illustrates an example in which the resin layer 126 is provided. The resin layer 126 is positioned between two adjacent light-emitting elements and covers the side surface of the organic layer 112 and the side surface and the part of the top surface of the pixel electrode 111. FIG. 6C illustrates an example in which both the insulating layer 125 and the resin layer 126 are provided. The insulating layer 125 is provided between the organic layer 112 and the resin layer 126.

FIG. 7A to FIG. 7E each illustrate an example of the case where the width of the pixel electrode 111R is smaller than the width of the organic layer 112R, the width of the pixel electrode 111G is smaller than the width of the organic layer 112G, and the width of the pixel electrode 111B is smaller than the width of the organic layer 112B. The end portions of the organic layer 112R are positioned outward from the end portions of the pixel electrode 111R, the end portions of the organic layer 112G are positioned outward from the end portions of the pixel electrode 111G, and the end portions of the organic layer 112B are positioned outward from the end portions of the pixel electrode 111B.

Figure 7A:
FIG. 7A to FIG. 7E are cross-sectional views illustrating structure examples of a display apparatus.
Figure 7B:
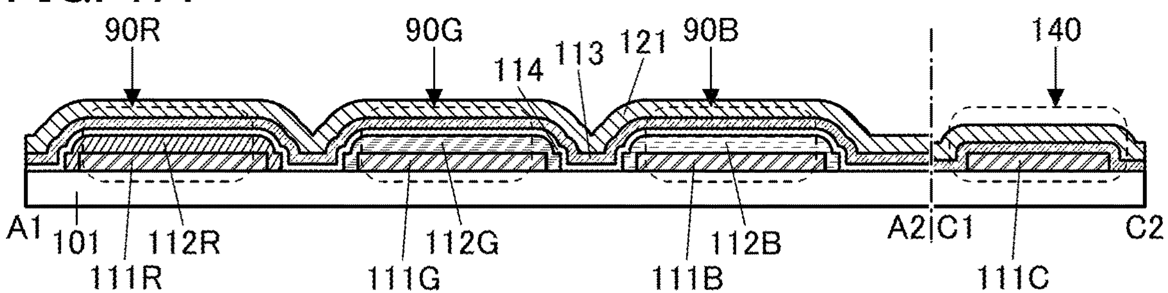
Figure 7B:
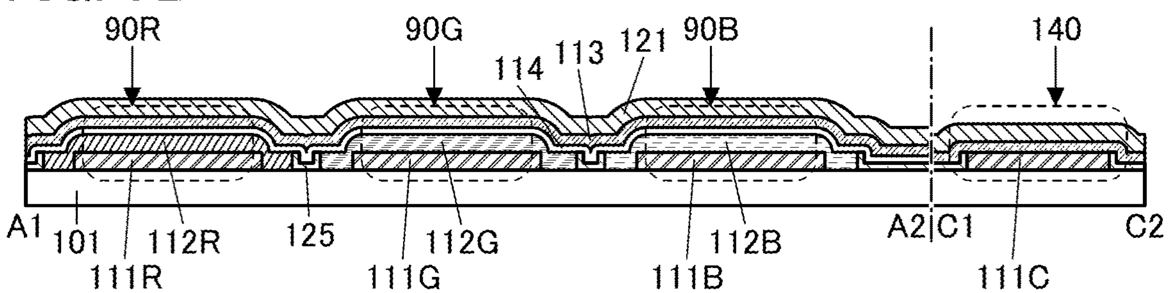

FIG. 7B illustrates an example in which the insulating layer 125 is provided. The insulating layer 125 is provided in contact with the side surfaces of the organic layers 112 of two adjacent light-emitting elements. Note that the insulating layer 125 may be provided to cover not only the side surface of the organic layer 112 but also part of the top surface thereof.

Figure 7C:
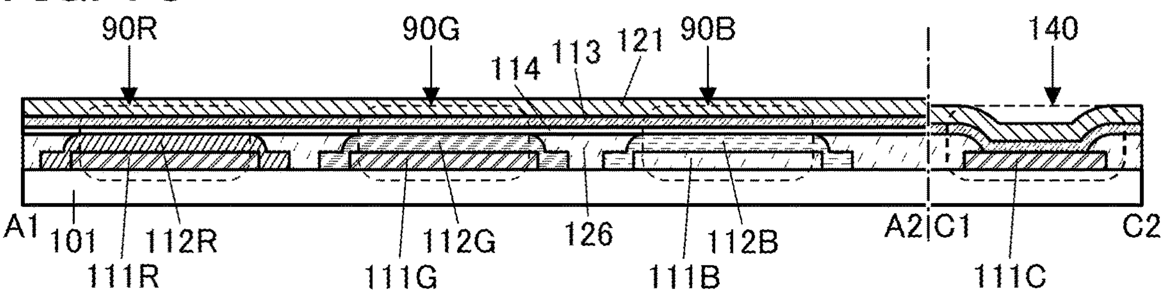

FIG. 7C illustrates an example in which the resin layer 126 is provided. The resin layer 126 is positioned between two adjacent light-emitting elements and covers the side surface and part of the top surface of the organic layer 112. Note that the resin layer 126 may be formed to be in contact with the side surface of the organic layer 112 and not to cover the top surface thereof.

Figure 7D:
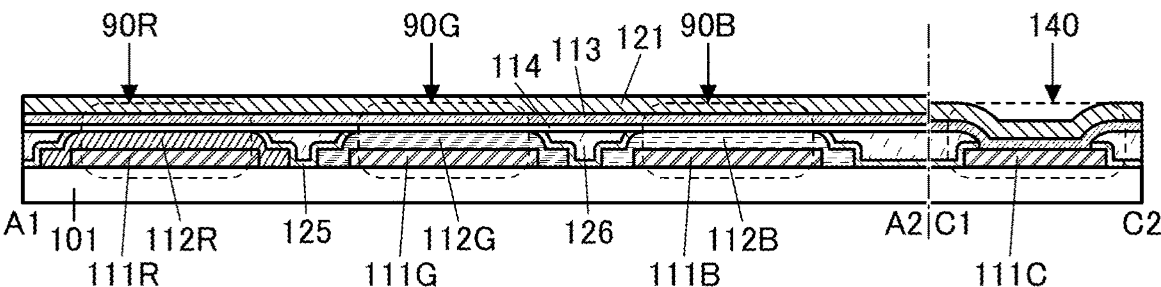

FIG. 7D illustrates an example in which both the insulating layer 125 and the resin layer 126 are provided. The insulating layer 125 is provided between the organic layer 112 and the resin layer 126.

Figure 7E:
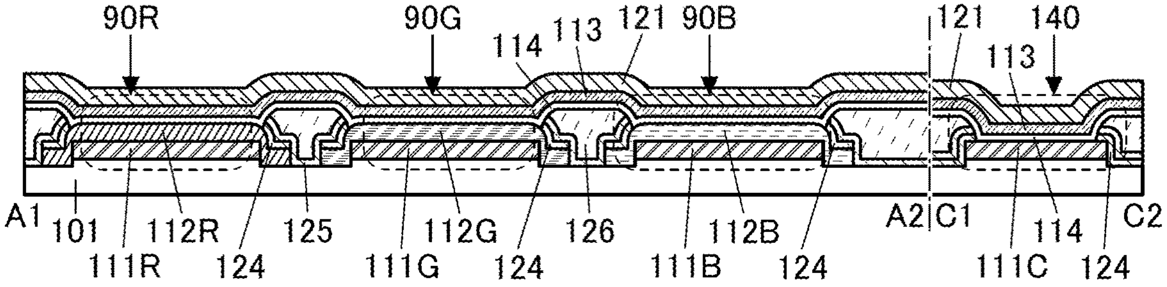

FIG. 7E illustrates an example in which the insulating layer 124, the insulating layer 125, and the resin layer 126 are provided. The insulating layer 124 is provided between the organic layer 112 and the insulating layer 125. The insulating layer 124 is formed of a sacrificial layer provided over the organic layer 112. The sacrificial layer is described in [Manufacturing method example] below.

As illustrated in FIG. 7E, the layer 101 may include a depressed portion between adjacent light-emitting elements. For example, an insulating layer positioned on the outermost surface of the layer 101 may include a depressed portion. Note that the layer 101 does not include a depressed portion between adjacent light-emitting elements in some cases.

FIG. 8A to FIG. 9F are each an enlarged view of an end portion of the pixel electrode 111R included in the light-emitting element 90R, an end portion of the pixel electrode 111G included in the light-emitting element 90G, and the vicinity thereof.

Figure 8A:
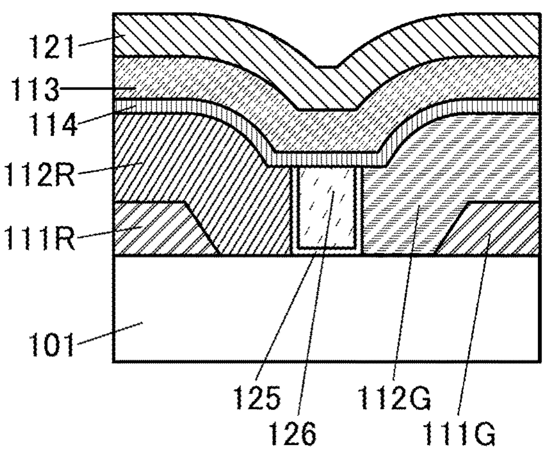
Figure 8A:
Figure 8A:
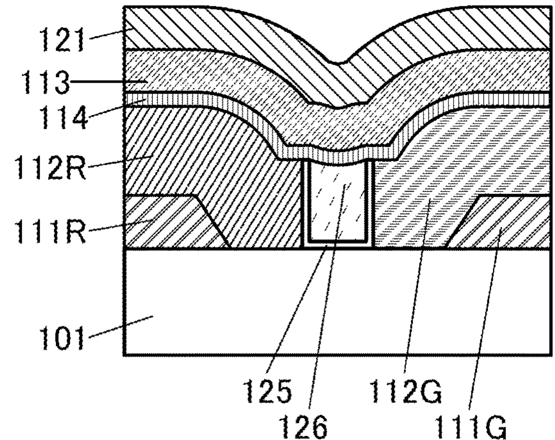
Figure 8B:
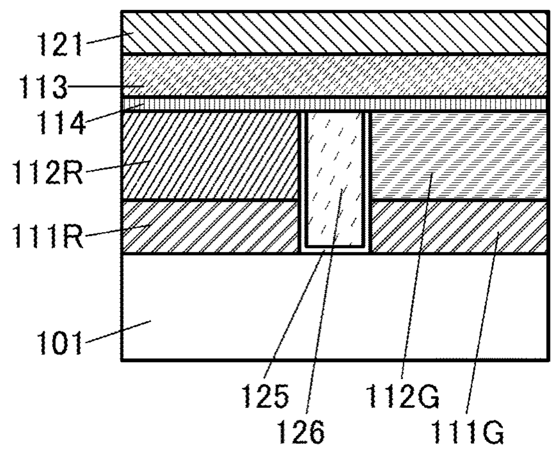
Figure 8E:
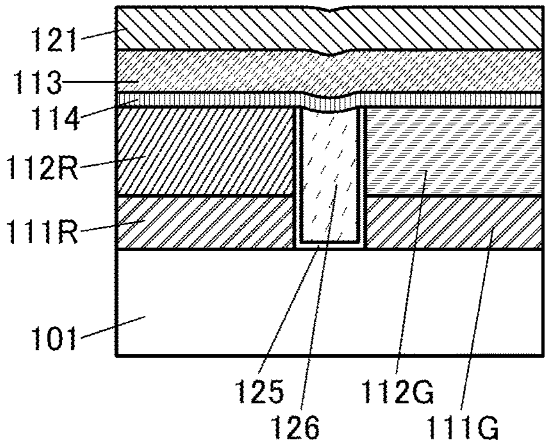
Figure 8C:
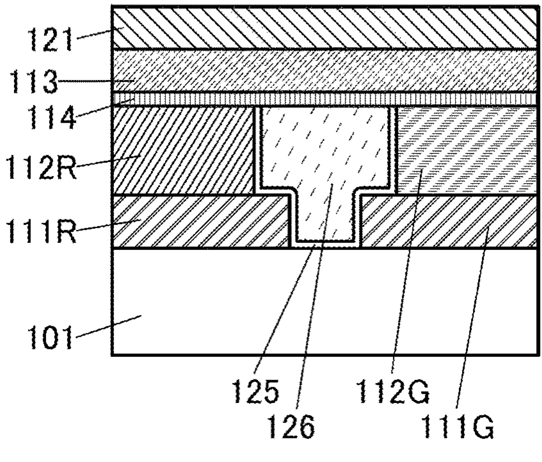

FIG. 8A to FIG. 8C are each an enlarged view of the resin layer 126 having a flat top surface and the vicinity thereof. FIG. 8A illustrates an example of the case where the width of the organic layer 112R is larger than that of the pixel electrode 111R and the width of the organic layer 112G is larger than that of the pixel electrode 111G. FIG. 8B illustrates an example of the case where the width of the pixel electrode 111R and the width of the organic layer 112R are equal or substantially equal to each other and the width of the pixel electrode 111G and the width of the organic layer 112G are equal or substantially equal to each other. FIG. 8C illustrates an example of the case where the width of the organic layer 112R is smaller than that of the pixel electrode 111R and the width of the organic layer 112G is smaller than that of the pixel electrode 111G.

As illustrated in FIG. 8A, since the organic layer 112R is provided to cover the end portion of the pixel electrode 111R and the organic layer 112G is provided to cover the end portion of the pixel electrode 111G, the end portion of each of the pixel electrode 111R and the pixel electrode 111G preferably has a tapered shape. Accordingly, the step coverage with the organic layer 112R and the organic layer 112G is improved and a highly reliable display apparatus can be provided.

Figure 8F:
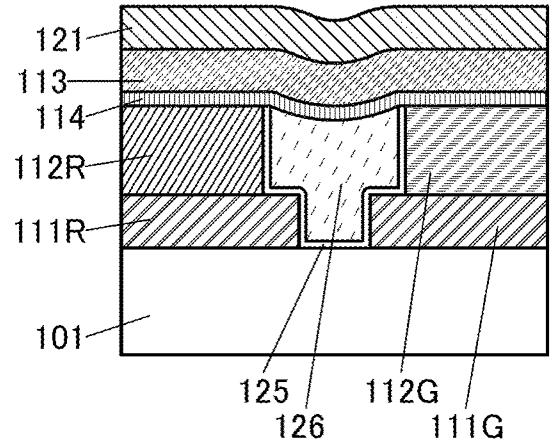

FIG. 8D to FIG. 8F each illustrate an example of the case where the top surface of the resin layer 126 has a depressed shape. In that case, a depressed portion that reflects the depressed top surface of the resin layer 126 is formed on each of top surfaces of the organic layer 114, the common electrode 113, and the protective layer 121.

Figure 9A:
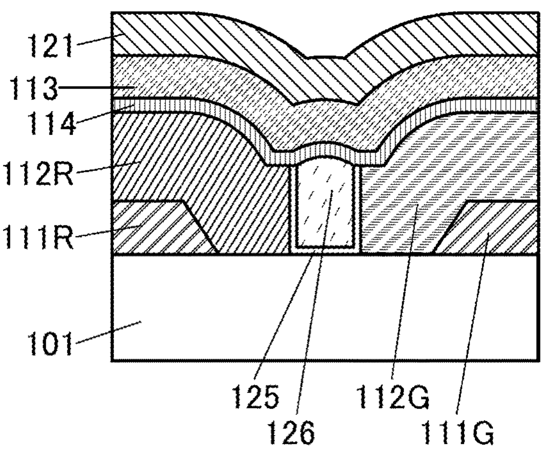
FIG. 9A to FIG. 9F are cross-sectional views illustrating structure examples of a display apparatus.
Figure 9A:
Figure 9D:
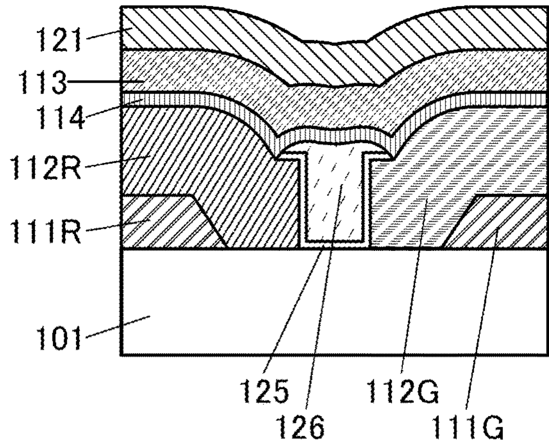
Figure 9B:
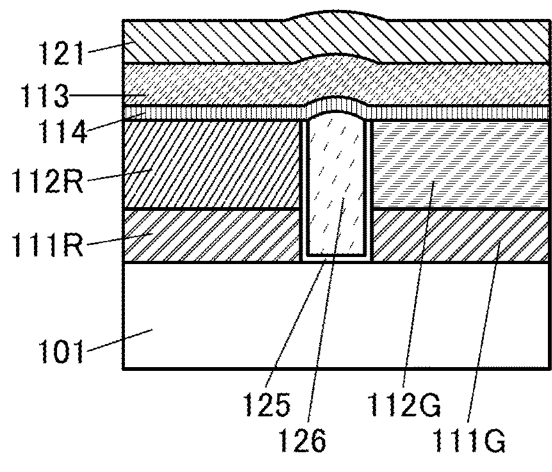
Figure 9E:
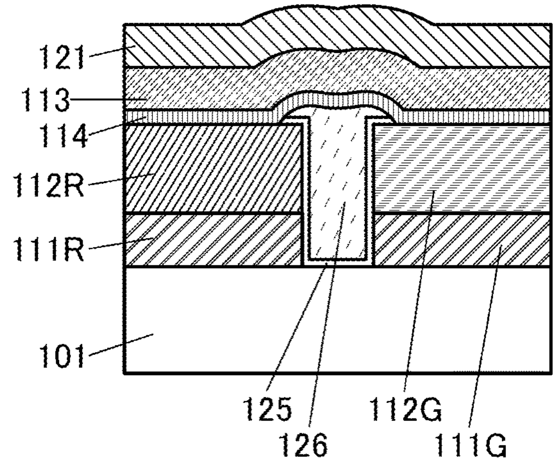
Figure 9C:
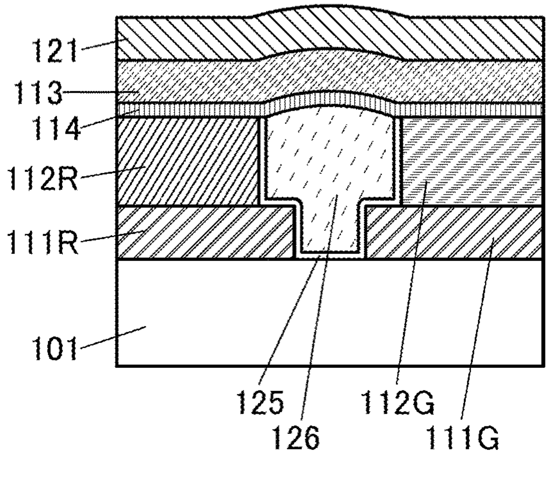

FIG. 9A to FIG. 9C each illustrate an example of the case where the top surface of the resin layer 126 has a projecting shape. In that case, a projecting portion that reflects the projecting top surface of the resin layer 126 is formed on each of the top surfaces of the organic layer 114, the common electrode 113, and the protective layer 121.

Figure 9F:
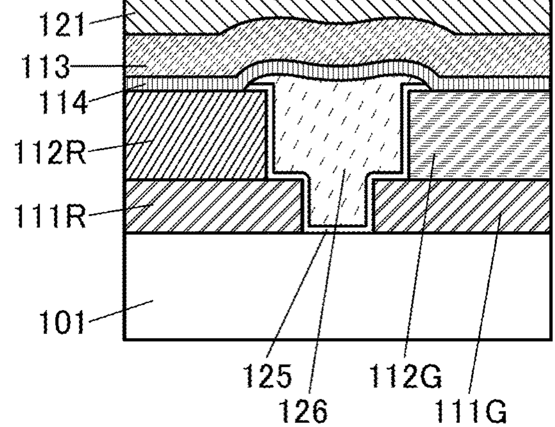

FIG. 9D to FIG. 9F each illustrate an example of the case where a part of the resin layer 126 covers the side surface and a part of the top surface of the organic layer 112R and the side surface and a part of the top surface of the organic layer 112G. In that case, the insulating layer 125 is provided between the resin layer 126 and the side surfaces and the parts of the top surfaces of the organic layer 112R and the organic layer 112G.

FIG. 9D to FIG. 9F each illustrate an example of the case where a part of the top surface of the resin layer 126 has a depressed shape. In that case, an uneven portion that reflects the top surface of the resin layer 126 is formed on each of the top surfaces of the organic layer 114, the common electrode 113, and the protective layer 121.

FIG. 10A and FIG. 10B each illustrate an example in which the insulating layer 118 is provided.

The insulating layer 118 is provided to cover end portions of the pixel electrode 111. End portions of the insulating layer 118 each preferably have a tapered shape.

When an organic resin is used for the insulating layer 118, the surface can be moderately curved. Thus, coverage with a film formed over the insulating layer 118 can be improved.

Examples of materials that can be used for the insulating layer 118 include an acrylic resin, a polyimide resin, an epoxy resin, a polyamide resin, a polyimide-amide resin, a siloxane resin, a benzocyclobutene-based resin, a phenol resin, and precursors of these resins.

Alternatively, an inorganic insulating material may be used for the insulating layer 118. Examples of inorganic insulating materials that can be used for the insulating layer 118 include oxide, nitride oxide, oxynitride, and nitride, such as silicon oxide, silicon oxynitride, silicon nitride oxide, silicon nitride, aluminum oxide, aluminum oxynitride, and hafnium oxide. Yttrium oxide, zirconium oxide, gallium oxide, tantalum oxide, magnesium oxide, lanthanum oxide, cerium oxide, neodymium oxide, or the like may be used.

FIG. 10A illustrates an example in which the insulating layer 118 and the resin layer 126 are provided. That is, the display apparatus illustrated in FIG. 10A is different from the display apparatus illustrated in FIG. 5A in including the insulating layer 118 and the resin layer 126. The resin layer 126 is positioned between two adjacent light-emitting elements and covers the side surface and the part of the top surface of the organic layer 112 and the top surface of the insulating layer 118.

FIG. 10B illustrates an example in which the insulating layer 118, the insulating layer 125, and the resin layer 126 are provided. That is, the display apparatus illustrated in FIG. 10B is different from the display apparatus illustrated in FIG. 10A in including the insulating layer 125. The insulating layer 125 is provided between the organic layer 112 and the insulating layer 118 and the resin layer 126. Note that in the structure illustrated in FIG. 10B, the resin layer 126 is not necessarily provided in some cases.

Note that in two adjacent light-emitting elements illustrated in FIG. 5B, FIG. 5C, and the like, the insulating layer 125 or the resin layer 126 provided between two organic layers facing to each other corresponds to the insulating layer 119 described in Embodiment 1. In two adjacent light-emitting elements illustrated in FIG. 5D and the like, the insulating layer 125 and the resin layer 126 provided between two organic layers facing to each other correspond to the insulating layer 119*a* and the insulating layer 119*b* described in Embodiment 1.

Modification Example

An example whose structure is partly different from the above-described structure is described below. Note that hereinafter, the above description can be referred to for portions similar to those described above, and the description is not repeated.

A display apparatus illustrated in FIG. 10C is different from the display apparatus illustrated in FIG. 5C mainly in including a conductive layer 122R, a conductive layer 122G, and a conductive layer 122B. The conductive layer 122R, the conductive layer 122G, and the conductive layer 122B function as optical adjustment layers.

The light-emitting element 90R includes the conductive layer 122R between the pixel electrode 111R and the organic layer 112R. The light-emitting element 90G includes the conductive layer 122G between the pixel electrode 111G and the organic layer 112G. The light-emitting element 90B includes the conductive layer 122B between the pixel electrode 111B and the organic layer 112B.

The conductive layer 122R, the conductive layer 122G, and the conductive layer 122B each have a property of transmitting visible light. The conductive layer 122R, the conductive layer 122G, and the conductive layer 122B have different thicknesses. Thus, the optical path lengths of the light-emitting elements can differ from one another.

Here, a conductive film having a reflecting property with respect to visible light is used for the pixel electrode 111R, the pixel electrode 111G, and the pixel electrode 111B, and a conductive film having a reflecting property and a transmitting property with respect to visible light is used for the common electrode 113. Thus, the light-emitting elements have what is called a microcavity structure where light with a specific wavelength is intensified. This can achieve a display apparatus with high color purity.

A conductive material having a light-transmitting property with respect to visible light can be used for each of the optical adjustment layers. For example, a conductive oxide such as indium oxide, indium tin oxide, indium zinc oxide, zinc oxide, zinc oxide containing gallium, indium-tin oxide containing silicon, or indium-zinc oxide containing silicon can be used.

The optical adjustment layers can be formed after the formation of the pixel electrode 111R, the pixel electrode 111G, and the pixel electrode 111B and before the formation of an organic film to be the organic layer 112. The optical adjustment layers may be formed using conductive films with different thicknesses from each other or may have a single-layer structure, a two-layer structure, a three-layer structure, or the like, in ascending order of thickness.

Note that the optical adjustment layer is not limited to the display apparatus illustrated in FIG. 5C and may be provided in each light-emitting element in the display apparatuses illustrated in FIG. 5A, FIG. 5B, FIG. 5D, FIG. 6A to FIG. 6C, FIG. 7A to FIG. 7E, and FIG. 10A and FIG. 10B.

A display apparatus illustrated in FIG. 10D is different from the display apparatus illustrated in FIG. 10C mainly in not including the optical adjustment layer. The display apparatus illustrated in FIG. 10D is different from the display apparatus illustrated in FIG. 5C mainly in that the thicknesses of the organic layers 112 are different.

The display apparatus illustrated in FIG. 10D is an example in which the thicknesses of the organic layer 112R, the organic layer 112G, and the organic layer 112B are different to achieve the microcavity structure. Such a structure does not require an optical adjustment layer provided additionally, simplifying the process.

For example, in the display apparatus illustrated in FIG. 10D, the organic layer 112R of the light-emitting element 90R emitting light with the longest wavelength has the largest thickness, and the organic layer 112B of the light-emitting element 90B emitting light with the shortest wavelength has the smallest thickness. Without limitation to this, the thickness of each organic layer can be adjusted in consideration of the wavelength of light emitted from the light-emitting element, the optical characteristics of the layer included in the light-emitting element, the electrical characteristics of the light-emitting element, and the like.

Note that the microcavity structure formed by making the thicknesses of the organic layers 112 different is not limited to the light-emitting elements included in the display apparatus illustrated in FIG. 5C and may be applied to each light-emitting element included in the display apparatuses illustrated in FIG. 5A, FIG. 5B, FIG. 5D, FIG. 6A to FIG. 6C, FIG. 7A to FIG. 7E, and FIG. 10A and FIG. 10B.

The color purity can be increased when the light-emitting element has a microcavity structure.

Manufacturing Method Example

An example of a method for manufacturing the display apparatus of one embodiment of the present invention will be described below with reference to drawings. Here, description is made using the display apparatus 100 illustrated in FIG. 7E as an example.

Note that thin films included in the display apparatus (insulating films, semiconductor films, conductive films, and the like) can be formed by a sputtering method, a chemical vapor deposition (CVD) method, a vacuum evaporation method, a pulsed laser deposition (PLD) method, an ALD method, or the like. Examples of the CVD method include a plasma-enhanced chemical vapor deposition (PECVD) method, a thermal CVD method, and the like. An example of the thermal CVD method is a metal organic chemical vapor deposition (MOCVD: Metal Organic CVD) method. Examples of an ALD method include a PEALD method and a thermal ALD method.

Alternatively, the thin films included in the display apparatus (insulating films, semiconductor films, conductive films, and the like) can be formed by a method such as spin coating, dipping, spray coating, ink-jetting, dispensing, screen printing, offset printing, a doctor knife method, slit coating, roll coating, curtain coating, or knife coating.

In addition, when the thin films included in the display apparatus are processed, a photolithography method or the like can be used. Besides, the thin films may be processed by a nanoimprinting method, a sandblasting method, a lift-off method, or the like. An island-shaped thin film may be directly formed by a deposition method using a shielding mask such as a metal mask.

There are the following two typical examples of a photolithography method. In one of the methods, a resist mask is formed over a thin film that is to be processed, the thin film is processed by etching or the like, and the resist mask is removed. In the other method, a photosensitive thin film is deposited and then processed into a desired shape by light exposure and development.

For light used for light exposure in a photolithography method, for example, an i-line (with a wavelength of 365 nm), a g-line (with a wavelength of 436 nm), an h-line (with a wavelength of 405 nm), or light in which these lines are mixed can be used. Besides, ultraviolet light, KrF laser light, ArF laser light, or the like can be used. In addition, light exposure may be performed by liquid immersion exposure technique. As the light used for the light exposure, extreme ultraviolet (EUV) light or X-rays may be used. Furthermore, instead of the light used for the light exposure, an electron beam can also be used. It is preferable to use extreme ultraviolet light, X-rays, or an electron beam because extremely minute processing is possible. Note that when light exposure is performed by scanning of a beam such as an electron beam, a photomask is not needed.

For etching of the thin films, a dry etching method, a wet etching method, a sandblasting method, or the like can be used.

To manufacture the display apparatus 100, firstly, the layer 101 is formed over a substrate (not illustrated). As described above, the layer 101 can have a stacked-layer structure in which an insulating layer is provided so as to cover the transistors, for example.

As the substrate, a substrate having at least heat resistance high enough to withstand later heat treatment is preferably used. In the case where an insulating substrate is used as the substrate, a glass substrate, a quartz substrate, a sapphire substrate, a ceramic substrate, an organic resin substrate, or the like can be used. Alternatively, it is possible to use a semiconductor substrate such as a single crystal semiconductor substrate or a polycrystalline semiconductor substrate including silicon, silicon carbide, or the like as a material; a compound semiconductor substrate of silicon germanium or the like; or an SOI substrate.

Figure 11A:
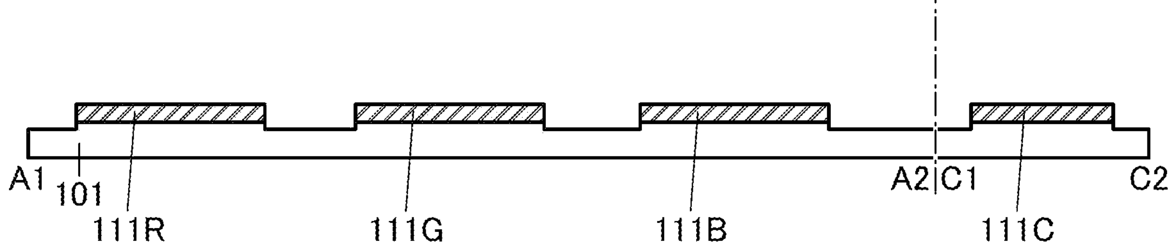
FIG. 11A to FIG. 11D are cross-sectional views illustrating an example of a method of manufacturing a display apparatus.

Subsequently, a conductive film to be the pixel electrode 111 and the connection electrode 111C is formed over the layer 101. Specifically, for example, the conductive film is formed over an insulating surface of the layer 101. Then, the conductive film is partly removed by etching, whereby the pixel electrode 111R, the pixel electrode 111G, the pixel electrode 111B, and the connection electrode 111C are formed over the layer 101 (FIG. 11A).

In the case where a conductive film having a reflective property with respect to visible light is used as the pixel electrode, a material that has a reflectance as high as possible in the whole wavelength range of visible light (e.g., silver, aluminum, or the like) is preferably used. This can increase color reproducibility as well as light extraction efficiency of the light-emitting elements.

Figure 11B:
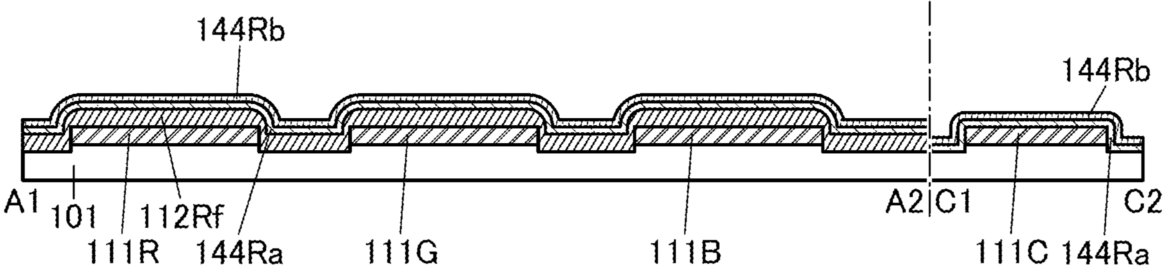

Subsequently, an organic film 112Rf to be the EL layer 112R later is formed over the pixel electrode 111R, the pixel electrode 111G, and the pixel electrode 111B, and over the layer 101 (FIG. 11B). Here, the organic film 112Rf is preferably provided so as not to overlap with the connection electrode 111C. For example, the organic film 112Rf can be formed so as not to overlap with the connection electrode 111C when formed by shielding a region including the connection electrode 111C with a metal mask. The metal mask used here does not need to shield a pixel region of the display portion; hence, a fine metal mask is not required.

The organic film 112Rf includes at least a film containing a light-emitting compound. The organic film 112Rf may have a structure in which one or more of films functioning as a hole-injection layer, a hole-transport layer, a hole-blocking layer, an electron-blocking layer, an electron-transport layer, and an electron-injection layer are stacked. The organic film 112Rf can be formed by, for example, an evaporation method, a sputtering method, or an inkjet method. Note that without limitation to this, the above deposition method can be used as appropriate.

Next, a sacrificial film 144Ra is formed over the organic film 112Rf, over the connection electrode 111C, and over the layer 101, and a sacrificial film 144Rb is formed over the sacrificial film 144Ra (FIG. 11B). That is, a sacrificial film having a two-layer stacked structure is formed over the organic film 112Rf, over the connection electrode 111C, and over the layer 101. Note that the sacrificial film may have a single-layer structure or a stacked-layer structure of three or more layers. In a subsequent process of forming another sacrificial film, a sacrificial film has a two-layer stacked structure; however, the sacrificial film may have a single-layer structure or a stacked-layer structure of three or more layers. Note that in this specification and the like, a sacrificial film may be referred to as a mask film.

The sacrificial film 144Ra and the sacrificial film 144Rb can be formed by, for example, a sputtering method, a CVD method, an ALD method, or a vacuum evaporation method. Note that a formation method that causes less damage to the EL layer is preferable, and the sacrificial film 144Ra formed directly on the organic film 112Rf is preferably formed by an ALD method or a vacuum evaporation method.

As the sacrificial film 144Ra, an inorganic film such as a metal film, an alloy film, a metal oxide film, a semiconductor film, or an inorganic insulating film can be suitably used.

Alternatively, an oxide film can be used as the sacrificial film 144Ra. An oxide film or an oxynitride film such as a silicon oxide film, a silicon oxynitride film, an aluminum oxide film, an aluminum oxynitride film, a hafnium oxide film, a hafnium oxynitride film, or the like can also be typically used. For example, a nitride film can also be used as the sacrificial film 144Ra. Specifically, it is also possible to use a nitride film such as a silicon nitride film, an aluminum nitride film, a hafnium nitride film, a titanium nitride film, a tantalum nitride film, a tungsten nitride film, a gallium nitride film, or a germanium nitride film. Such an inorganic insulating material can be formed by a deposition method such as a sputtering method, a CVD method, or an ALD method; the sacrificial film 144Ra, which is formed directly on the organic film 112Rf, is particularly preferably formed by an ALD method.

For the sacrificial film 144Ra, a metal material such as nickel, tungsten, chromium, molybdenum, cobalt, palladium, titanium, aluminum, yttrium, zirconium, or tantalum or an alloy material containing the metal material can be used, for example. It is particularly preferable to use a low-melting-point material such as aluminum or silver.

Alternatively, for the sacrificial film 144Ra, a metal oxide such as an indium gallium zinc oxide (an In—Ga—Zn oxide, also referred to as IGZO) can be used. It is also possible to use indium oxide, an indium zinc oxide (an In—Zn oxide), an indium tin oxide (an In—Sn oxide), an indium titanium oxide (an In—Ti oxide), an indium tin zinc oxide (an In—Sn—Zn oxide), an indium titanium zinc oxide (an In—Ti—Zn oxide), an indium gallium tin zinc oxide (an In—Ga—Sn—Zn oxide), or the like. Alternatively, for example, an indium tin oxide containing silicon can also be used.

Note that an element M (M is one or more kinds selected from aluminum, silicon, boron, yttrium, copper, vanadium, beryllium, titanium, iron, nickel, germanium, zirconium, molybdenum, lanthanum, cerium, neodymium, hafnium, tantalum, tungsten, and magnesium) can be employed instead of gallium. Specifically, M is preferably one or more kinds selected from gallium, aluminum, and yttrium.

Any of the above-described materials usable for the sacrificial film 144Ra can be used for the sacrificial film 144Rb. For example, from the above materials usable for the sacrificial film 144Ra, one material can be selected for the sacrificial film 144Ra and another material can be selected for the sacrificial film 144Rb. Alternatively, one or more materials can be selected for the sacrificial film 144Ra from the above materials usable for the sacrificial film 144Ra, and material(s) selected from the materials excluding the material(s) selected for the sacrificial film 144Ra can be used for the sacrificial film 144Rb.

Specifically, aluminum oxide formed by an ALD method is preferably used as the sacrificial film 144Ra, and silicon nitride formed by a sputtering method is suitably used as the sacrificial film 144Rb. In the case of employing this structure, the deposition temperature at the time of depositing the materials by an ALD method and a sputtering method is preferably higher than or equal to room temperature and lower than or equal to 120° C., further preferably higher than or equal to room temperature and lower than or equal to 100° C., in which case adverse effects on the organic film 112Rf can be reduced. In the case of the stacked-layer structure of the sacrificial film 144Ra and the sacrificial film 144Rb, a stress applied to the stacked-layer structure is preferably small. Specifically, a stress applied to the stacked-layer structure is preferably higher than or equal to −500 MPa and less than or equal to +500 MPa, further preferably higher than or equal to −200 MPa and lower than or equal to +200 MPa, in which case troubles in the process, such as film separation and peeling, can be inhibited.

As the sacrificial film 144Ra, it is possible to use a film highly resistant to etching treatment performed on various EL films such as the organic film 112Rf, i.e., a film having high etching selectivity. Moreover, as the sacrificial film 144Ra, it is particularly preferable to use a film that can be removed by a wet etching method less likely to cause damage to EL films.

For the sacrificial film 144Ra, a material that can be dissolved in a solvent chemically stable with respect to at least the uppermost film of the organic film 112Rf may be used. In particular, a material that is dissolved in water or alcohol can be suitably used for the sacrificial film 144Ra. In deposition of the sacrificial film 144Ra, it is preferable that application of such a material dissolved in a solvent such as water or alcohol be performed by a wet deposition method and followed by heat treatment for evaporating the solvent. At this time, the heat treatment is preferably performed in a reduced-pressure atmosphere, in which case the solvent can be removed at a low temperature in a short time and thermal damage to the organic film 112Rf can be reduced accordingly.

Examples of the wet deposition method that can be used for forming the sacrificial film 144Ra include spin coating, dipping, spray coating, ink-jetting, dispensing, screen printing, offset printing, a doctor knife method, slit coating, roll coating, curtain coating, knife coating, and the like.

For the sacrificial film 144Ra, an organic material such as polyvinyl alcohol (PVA), polyvinylbutyral, polyvinylpyrrolidone, polyethylene glycol, polyglycerin, pullulan, water-soluble cellulose, or an alcohol-soluble polyamide resin can be used.

As the sacrificial film 144Rb, a film having high selectivity with the sacrificial film 144Ra is used.

Preferably, an inorganic insulating material such as aluminum oxide, hafnium oxide, or silicon oxide formed by an ALD method is used for the sacrificial film 144Ra, and a metal material such as nickel, tungsten, chromium, molybdenum, cobalt, palladium, titanium, aluminum, yttrium, zirconium, or tantalum or an alloy material containing any of the metal materials formed by a sputtering method is used as the sacrificial film 144Rb. Tungsten formed by a sputtering method is particularly preferably used as the sacrificial film 144Rb. Alternatively, a metal oxide containing indium, such as In—Ga—Zn oxide, formed by a sputtering method may be used as the sacrificial film 144Rb. Furthermore, an inorganic material may be used for the sacrificial film 144Rb. For example, it is possible to use an oxide film, a nitride oxide film, an oxynitride film, or a nitride film, such as a silicon oxide film, a silicon oxynitride film, a silicon nitride oxide film, a silicon nitride film, an aluminum oxide film, an aluminum oxynitride film, or a hafnium oxide film.

Alternatively, as the sacrificial film 144Rb, an organic film that can be used for the organic film 112Rf and the like may be used. For example, the same film as the organic film used for the organic film 112Rf can be used as the sacrificial film 144Rb. The use of such an organic film is preferable, in which case the deposition apparatus for the organic film 112Rf can be used in common. Furthermore, the sacrificial film 144Rb can be removed at the same time as the etching of the organic film 112Rf; thus, the process can be simplified.

Then, a resist mask (not illustrated) is formed in the position being over the sacrificial film 144Rb and overlapping with the pixel electrode 111R and the connection electrode 111C. For the resist mask, a resist material containing a photosensitive resin, such as a positive type resist material or a negative type resist material can be used.

Figure 11C:
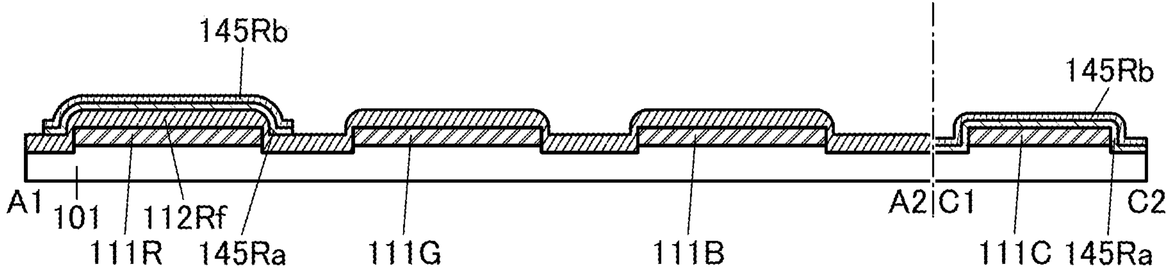

Then, part of the sacrificial film 144Rb and the sacrificial film 144Ra that is not covered with the resist mask is removed by etching, whereby island-shaped or band-shaped sacrificial layers 145Rb and 145Ra are formed (FIG. 11C). As illustrated in FIG. 11C, the sacrificial layer 145Rb and the sacrificial layer 145Ra can be formed over the pixel electrode 111R and over the connection electrode 111C, for example.

Preferably, part of the sacrificial film 144Rb is removed by etching using the resist mask to form the sacrificial layer 145Rb; then, the resist mask is removed; after that, the sacrificial film 144Ra is etched using the sacrificial layer 145Rb as a hard mask. In this case, the etching of the sacrificial film 144Rb preferably employs etching conditions with high selectivity with the sacrificial film 144Ra. Although a wet etching method or a dry etching method can be used for the etching for forming the hard mask, a shrinkage of the pattern can be reduced by using a dry etching method.

Processing of the sacrificial film 144Ra and the sacrificial film 144Rb and removal of the resist mask can be performed by a wet etching method or a dry etching method. For example, the sacrificial film 144Ra and the sacrificial film 144Rb can be processed by a dry etching method using a fluorine-containing gas. The resist mask can be removed by a dry etching method using an oxygen-containing gas (also referred to as an oxygen gas) (such a method is also referred to as a plasma ashing method).

When the sacrificial film 144Ra is etched using the sacrificial layer 145Rb as a hard mask, the resist mask can be removed while the organic film 112Rf is covered with the sacrificial film 144Ra. For example, if the organic film 112Rf is exposed to oxygen, the electrical characteristics of the light-emitting element 90R are adversely affected in some cases. Thus, in the case where the resist mask is removed by a method using an oxygen gas, such as plasma ashing, the sacrificial film 144Ra is preferably etched using the sacrificial layer 145Rb as a hard mask.

Figure 11D:
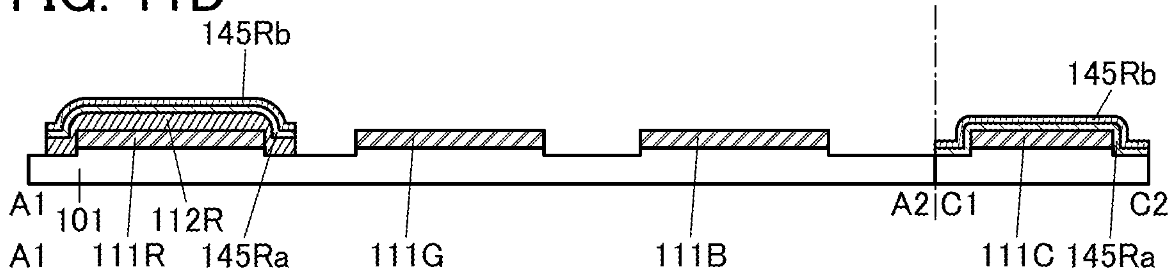

Next, part of the organic film 112Rf that is not covered with the sacrificial layer 145Ra is removed by etching, so that an island-shaped or band-shaped EL layer 112R is formed (FIG. 11D).

In addition, when a dry etching method using an oxygen gas is used for the etching of the organic film 112Rf, the etching rate can be increased. Thus, etching under a low-power condition can be performed while the etching rate is kept adequately high; hence, damage to the organic film 112Rf due to the etching can be reduced. Furthermore, a defect such as attachment of a reaction product generated at the etching onto the organic layer 112R or the like can be inhibited.

Alternatively, when the organic film 112Rf is etched by a dry etching method using an etching gas that does not contain oxygen as its main component, a change in properties of the organic film 112Rf can be inhibited, so that the display apparatus 100 can be a highly reliable display apparatus. Examples of the etching gas that does not contain oxygen as its main component include a gas containing a carbon tetrafluoride ($CF_4$), $C_4F_8$, $SF_6$, $CHF_3$, $Cl_2$, $H_2O$, $BCl_3$, or the like and a gas containing a Group 18 element such as He. Alternatively, a mixed gas of the above gas and a dilution gas that does not contain oxygen can be used as the etching gas. Note that etching of the organic film 112Rf is not limited to the above and may be performed by a dry etching method using another gas or a wet etching method.

If impurities are attached to the side surface of the organic layer 112R when the organic layer 112R is formed by the etching of the organic film 112Rf, the impurities might enter the inside of the organic layer 112R in the subsequent process. This degrades the reliability of the display apparatus 100 in some cases. Thus, it is preferable to remove impurities attached to the surface of the organic layer 112R after the formation of the organic layer 112R, in which case the reliability of the display apparatus 100 can be increased.

Impurities attached to the surface of the organic layer 112R can be removed, for example, by irradiation of the surface of the organic layer 112R with an inert gas. Here, the surface of the organic layer 112R is exposed immediately after the organic layer 112R is formed. Specifically, the side surface of the organic layer 112R is exposed. Accordingly, impurities attached to the organic layer 112R can be removed, for example, when the substrate where the organic layer 112R is formed is put in an inert gas atmosphere after the formation of the organic layer 112R. As the inert gas, one or more selected from Group 18 elements (typically, helium, neon, argon, xenon, and krypton) and nitrogen can be used, for example.

In the processes illustrated in FIG. 11C and FIG. 11D, when the organic film 112Rf is etched with use of an oxygen-containing gas, the surface states of the pixel electrode 111G and the pixel electrode 111B are changed in some cases. For example, the surfaces of the pixel electrode 111G and the pixel electrode 111B become hydrophilic in some cases. For example, in the case where each of the upper surfaces of the pixel electrode 111G and the pixel electrode 111B is a layer containing indium tin oxide, the layer containing indium tin oxide becomes hydrophilic by the etching of the organic film 112Rf with use of an oxygen-containing gas. Here, an organic film to be formed so as to include a region in contact with the pixel electrode 111G and an organic film to be formed so as to include a region in contact with the pixel electrode 111B in a later process are hydrophobic, for example. Adhesion between a hydrophilic surface and a hydrophobic surface is lower than adhesion between hydrophilic surfaces and adhesion between hydrophobic surfaces. From the above, when the surfaces of the pixel electrode 111G and the pixel electrode 111B are hydrophilic, adhesion between the surfaces and an organic film to be formed in a later process is lowered in some cases. Accordingly, in a later process, the organic film is separated at the interface with the pixel electrode 111G or the interface with the pixel electrode 111B. Moreover, when the etching of the organic film 112Rf is performed using a gas containing oxygen, work functions of the surfaces of the pixel electrode 111G and the pixel electrode 111B changes in some cases in addition to the change in the surface states described above.

In view of this, hydrophobic treatment is performed on the surface of the pixel electrode 111G and the surface of the pixel electrode 111B, whereby film separation of the organic film to be formed in a later process can be inhibited. Thus, the display apparatus 100 can be a highly reliable display apparatus. In addition, the yield in manufacturing the display apparatus 100 can be increased, and the display apparatus 100 can be an inexpensive display apparatus.

The hydrophobic treatment can be performed by fluorine modification of the pixel electrode 111G and the pixel electrode 111B, for example. The fluorine modification can be performed by, for example, treatment or heat treatment using a fluorine-containing gas, plasma treatment in an atmosphere of a fluorine-containing gas, or the like. As the fluorine-containing gas, a fluorine gas such as a fluorocarbon gas can be used, for example. As a fluorocarbon gas, a low carbon fluoride gas such as a $CF_4$ gas, a $C_4F_6$ gas, a $C_2F_6$ gas, a $C_4F_8$ gas, or a $C_5F_8$ gas can be used, for example. Moreover, as the fluorine-containing gas, a $SF_6$ gas, a $NF_3$ gas, a $CHF_3$ gas, or the like can be used, for example. Alternatively, a helium gas, an argon gas, a hydrogen gas, or the like can be added to these gases as appropriate.

In addition, treatment using a silylation agent is performed on the surface of the pixel electrode 111G and the surface of the pixel electrode 111B after plasma treatment is performed in a gas atmosphere containing a Group 18 element such as argon, so that the surface of the pixel electrode 111G and the surface of the pixel electrode 111B can become hydrophobic. As the silylation agent, hexamethyldisilazane (HMDS), N-trimethylsilylimidazole (TMSI), or the like can be used. Alternatively, treatment using a silane coupling agent is performed on the surface of the pixel electrode 111G and the surface of the pixel electrode 111B after plasma treatment is performed in a gas atmosphere containing a Group 18 element such as argon, so that the surface of the pixel electrode 111G and the surface of the pixel electrode 111B can become hydrophobic. Plasma treatment on the surface of the pixel electrode 111G and the surface of the pixel electrode 111B in a gas atmosphere containing a Group 18 element such as argon can apply damage to the surface of the pixel electrode 111G and the surface of the pixel electrode 111B. Accordingly, a methyl group included in the silylation agent such as HMDS is likely to bond to the surface of the pixel electrode 111G and the surface of the pixel electrode 111B. Moreover, silane coupling due to the silane coupling agent is likely to occur. As described above, treatment using a silylation agent or a silane coupling agent performed on the surface of the pixel electrode 111G and the surface of the pixel electrode 111B after plasma treatment in a gas atmosphere containing a Group 18 element such as argon enables the surface of the pixel electrode 111G and the surface of the pixel electrode 111B to become hydrophobic.

The treatment using the silylation agent, the silane coupling agent, or the like can be performed by application of the silylation agent, the silane coupling agent, or the like by a spin coating method or a dipping method, for example. The treatment using the silylation agent, the silane coupling agent, or the like can also be performed by forming a film containing the silylation agent, a film containing the silane coupling agent, or the like over the pixel electrode 111G, over the pixel electrode 111B, and the like by a gas phase method, for example. In a gas phase method, first, a material containing the silylation agent, a material containing the silane coupling agent, or the like is volatilized so that the silylation agent, the silane coupling agent, or the like is included in the atmosphere. Next, a substrate where the pixel electrode 111G, the pixel electrode 111B, and the like are formed is provided in the atmosphere. In this manner, a film containing a silylation agent, a silane coupling agent, or the like can be formed over the pixel electrode 111G, over the pixel electrode 111B, and the like, whereby the surface of the pixel electrode 111G and the surface of the pixel electrode 111B can become hydrophobic.

Next, an organic film 112Gf to be the organic layer 112G later is formed over the sacrificial layer 145Rb, the pixel electrode 111G, the pixel electrode 111B, and the layer 101. Forming the organic film 112Gf after the formation of the sacrificial layer 145Rb can prevent the organic film 112Gf from being in contact with the top surface of the organic layer 112R. For the formation of the organic film 112Gf, for example, the description of the formation of the organic film 112Rf can be referred to.

Figure 12A:
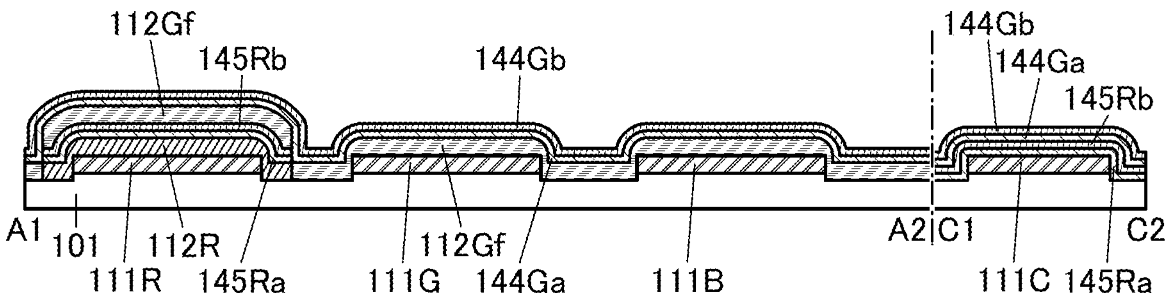
FIG. 12A to FIG. 12C are cross-sectional views illustrating an example of a method of manufacturing a display apparatus.

Subsequently, a sacrificial film 144Ga is formed over the organic film 112Gf and the sacrificial layer 145Rb, and a sacrificial film 144Gb is formed over the sacrificial film 144Ga (FIG. 12A). After that, a resist mask (not illustrated) is formed in the position being over the sacrificial film 144Gb and overlapping with the pixel electrode 111G. The description of the formation and the like of the sacrificial film 144Ra, the sacrificial film 144Rb, and the resist mask provided over the sacrificial film 144Rb can be referred to for the formation and the like of the sacrificial film 144Ga, the sacrificial film 144Gb, and the resist mask.

Figure 12B:
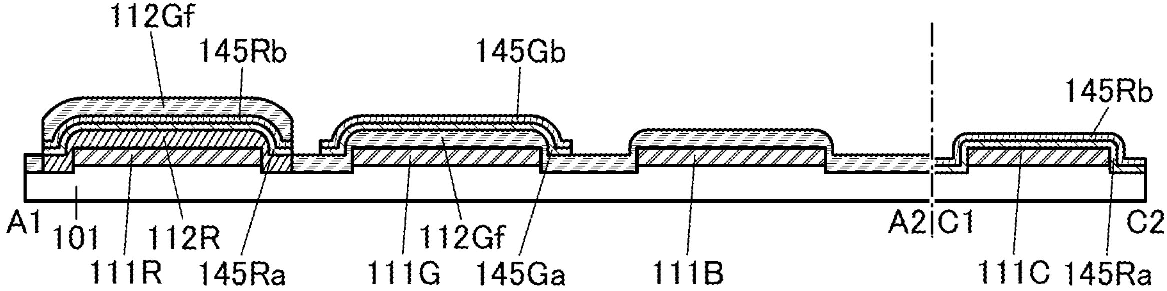

Then, part of the sacrificial film 144Gb and the sacrificial film 144Ga, which is not covered with the resist mask, is removed by etching, whereby island-shaped or band-shaped sacrificial layers 145Gb and 145Ga are formed. In addition, the resist mask is removed (FIG. 12B). Here, the sacrificial layer 145Gb and the sacrificial layer 145Ga can be formed over the pixel electrode 111G. The description of the formation of the sacrificial layer 145Rb and the sacrificial layer 145Ra, removal of the resist mask provided over the sacrificial layer 144Rb, and the like can be referred to for the formation of the sacrificial layer 145Gb and the sacrificial layer 145Ga, removal of the resist mask, and the like.

Figure 12C:
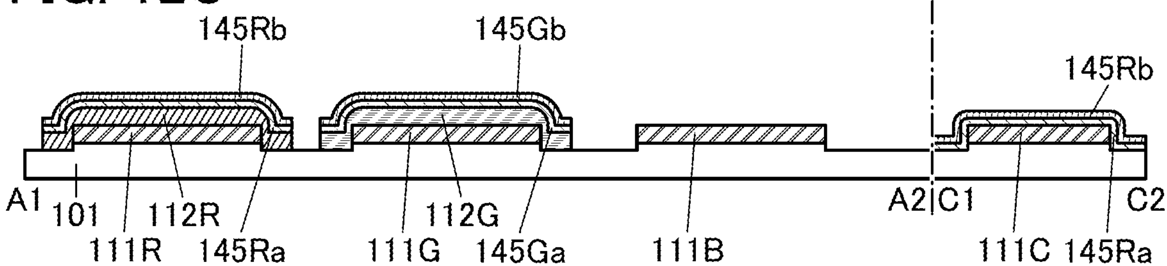

Next, part of the organic film 112Gf that is not covered with the sacrificial layer 145Ga is removed by etching, so that the island-shaped or band-shaped organic layer 112G is formed (FIG. 12C). For the formation of the organic layer 112G and the like, the description of the formation of the organic layer 112R and the like can be referred to. As in the case of the organic layer 112R, it is preferable to remove impurities attached to the surface of the organic layer 112G. For example, impurities attached to the organic layer 112G can be removed when the substrate where the organic layer 112G is formed is put in an inert gas atmosphere after the formation of the organic layer 112G.

Next, an organic film 112Bf to be the organic layer 112B later is formed over the sacrificial layer 145Rb, the sacrificial layer 145Gb, the pixel electrode 111B, and the layer 101. Forming the organic film 112Bf after the formation of the sacrificial layer 145Gb can prevent the organic film 112Bf from being in contact with the top surface of the organic layer 112G. For the formation of the organic film 112Bf, for example, the description of the formation of the organic film 112Rf can be referred to.

Subsequently, a sacrificial film 144Ba is formed over the organic film 112Bf and the sacrificial layer 145Rb, and a sacrificial film 144Bb is formed over the sacrificial film 144Ba (FIG. 13A). After that, a resist mask (not illustrated)

is formed in the position being over the sacrificial film 144Bb and overlapping with the pixel electrode 111B. The description of the formation and the like of the sacrificial film 144Ra, the sacrificial film 144Rb, and the resist mask provided over the sacrificial film 144Rb can be referred to for the formation and the like of the sacrificial film 144Ba, the sacrificial film 144Bb, and the resist mask.

Subsequently, part of the sacrificial film 144Bb and the sacrificial film 144Ba, which is not covered with the resist mask, is removed by etching, whereby island-shaped or band-shaped sacrificial layers 145Bb and 145Ba are formed. Furthermore, the resist mask is removed (FIG. 13B). Here, the sacrificial layer 145Bb and the sacrificial layer 145Ba can be formed over the pixel electrode 111B. The description of the formation of the sacrificial layer 145Rb and the sacrificial layer 145Ra, the removal of the resist mask provided over the sacrificial layer 144Rb, and the like can be referred to for the formation of the sacrificial layer 145Bb and the sacrificial layer 145Ba, the removal of the resist mask, and the like.

Next, part of the organic film 112Bf that is not covered with the sacrificial layer 145Ba is removed by etching, so that the island-shaped or band-shaped organic layer 112B is formed (FIG. 13C). For the formation of the organic layer 112B and the like, the description of the formation of the organic layer 112R and the like can be referred to. As in the case of the organic layer 112R and the organic layer 112G, it is preferable to remove impurities attached to the surface of the organic layer 112B. For example, impurities attached to the organic layer 112B can be removed when the substrate where the organic layer 112B is formed is put in an inert gas atmosphere after the formation of the organic layer 112B.

Subsequently, the sacrificial layer 145Rb, the sacrificial layer 145Gb, and the sacrificial layer 145Bb are removed by etching or the like (FIG. 13D). For the etching of the sacrificial layer 145Rb, the sacrificial layer 145Gb, and the sacrificial layer 145Bb, conditions that the etching selectivity with respect to the sacrificial layer 145Ra, the sacrificial layer 145Ga, and the sacrificial layer 145Ba is high are preferably employed. Note that in some cases, the sacrificial layer 145Rb, the sacrificial layer 145Gb, and the sacrificial layer 145Bb are not necessarily removed.

Figure 14A:
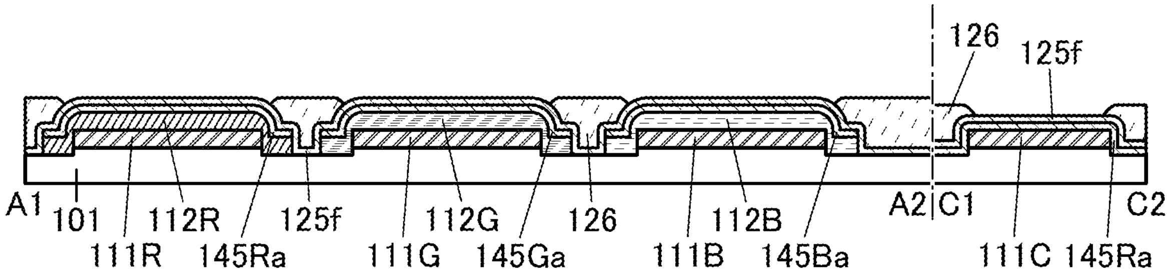
FIG. 14A to FIG. 14C are cross-sectional views illustrating an example of a method of manufacturing a display apparatus.

Next, an insulating film *125f* to be the insulating layer 125 later is formed over the sacrificial layer 145Ra, the sacrificial layer 145Ga, the sacrificial layer 145Ba, and the layer 101 (FIG. 14A).

The insulating film *125f* is preferably formed by, for example, a method providing high coverage. For example, the insulating film *125f* can be formed by an ALD method. Note that the insulating film *125f* may be formed by a sputtering method, a CVD method, a PLD method, or the like.

An inorganic insulating material can be used for the insulating film *125f*. For example, for the insulating film *125f*, oxide, oxynitride, nitride oxide, or nitride can be used; at least one of aluminum oxide, silicon oxide, silicon oxynitride, silicon nitride oxide, silicon nitride, aluminum oxynitride, hafnium oxide, and the like can be contained, for example.

The thickness of the insulating film *125f* is preferably greater than or equal to 1 nm and less than or equal to 60 nm, further preferably greater than or equal to 1 nm and less than or equal to 40 nm, and still further preferably greater than or equal to 5 nm and less than or equal to 20 nm, for example.

Then, an insulating film to be the resin layer 126 later is formed over the insulating film *125f*. As the insulating film, an insulating film containing an organic material is preferably used, and a resin is preferably used as the organic material. Moreover, a photosensitive resin can be used for the insulating film. As the photosensitive resin, a positive material or a negative material can be used.

In the case where a photosensitive resin is used for the insulating film, the insulating film can be formed by a spin coating method, a spraying method, a screen printing method, a painting method, or the like.

The insulating film is planarized in some cases. In some cases, the insulating film has a slight unevenness reflecting unevenness of the formation surface.

Next, the insulating film is processed to form the resin layer 126 (FIG. 14A). Here, when a photosensitive resin is used for the insulating film, the resin layer 126 can be formed without providing an etching mask such as a resist mask or a hard mask. Since a photosensitive resin can be processed only by light exposure and development steps, the resin layer 126 can be formed without using a dry etching method, for example. Thus, the process can be simplified. In addition, damage to the organic layer 112 due to etching of the insulating film can be reduced. Note that the height of the surface may be adjusted by further etching of a part of the upper portion of the resin layer 126.

The resin layer 126 may alternatively be formed by performing etching substantially uniformly on the top surface of the insulating film. Such uniform etching for planarization is also referred to as etch back.

To form the resin layer 126, the light exposure and development steps and the etch back step may be used in combination.

Figure 14B:
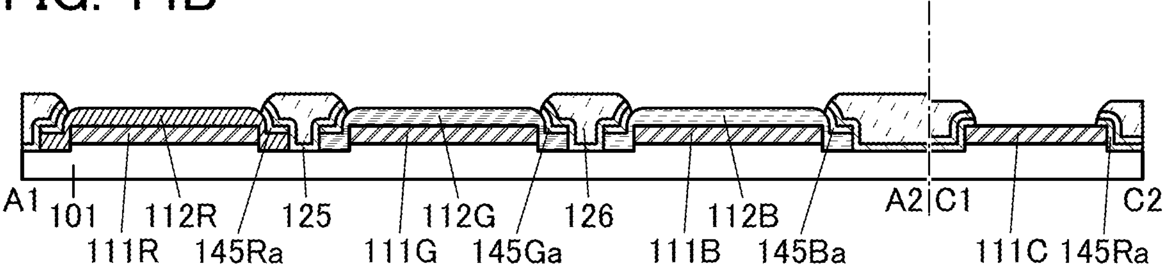

Next, the sacrificial layer 145Ra, the sacrificial layer 145Ga, the sacrificial layer 145Ba, and the insulating film *125f* are etched to expose at least parts of the top surfaces of the organic layer 112R, the organic layer 112G, the organic layer 112B, and the connection electrode 111C (FIG. 14B). At this time, the insulating layer 125 is formed from the insulating film *125f*. The insulating layer 125 is formed to include a region in contact with a side surface of the resin layer 126 and a region in contact with a bottom surface of the resin layer 126.

A part of each of the sacrificial layer 145Ra, the sacrificial layer 145Ga, and the sacrificial layer 145Ba is preferably removed by a method that causes damage to the organic layer 112 as little as possible; for example, a wet etching method is preferably used. Note that a part of the sacrificial layer 145Ra remains over the organic layer 112R in some cases. A part of the sacrificial layer 145Ga remains over the organic layer 112G in some cases. A part of the sacrificial layer 145Ba remains over the organic layer 112B in some cases.

Then, vacuum baking treatment is performed to remove water and the like adsorbed on the surface of the organic layer 112R, the surface of the organic layer 112G, and the surface of the organic layer 112B. The vacuum baking is preferably performed in a range of temperatures at which properties of the organic compounds contained in the organic layer 112R, the organic layer 112G, the organic layer 112B, and the like are not changed, and for example, can be performed at temperatures higher than or equal to 70° C. and lower than or equal to 120° C., and further preferably higher than or equal to 80° C. and lower than or equal to 100° C. The vacuum backing treatment is not necessarily performed when water and the like adsorbed on the surface of the organic layer 112R, the surface of the organic layer 112G, and the surface of the organic layer 112B, and the like are small in amount and are less likely to adversely affect the reliability of the display apparatus 100, for example.

Next, the organic layer 114 is formed over the organic layers 112R, the organic layer 112G, the organic layer 112B, and the resin layer 126. As described above, the organic layer 114 includes at least one of a hole-injection layer, a hole-transport layer, a hole-blocking layer, an electron-blocking layer, an electron-transport layer, and an electron-injection layer and includes, for example, an electron-injection layer or a hole-injection layer. The organic layer 114 can be formed by, for example, an evaporation method, a sputtering method, an inkjet method, or the like. Note that in the case where the organic layer 114 is not provided over the connection electrode 111C, a metal mask that shields the upper portion of the connection electrode 111C is used in the formation of the organic layer 114. The metal mask used here does not need to shield a pixel region of the display portion; hence, a fine metal mask is not required.

Next, the common electrode 113 is formed over the organic layer 114. The common electrode 113 can be formed by a sputtering method or a vacuum evaporation method, for example. Through the above processes, the light-emitting element 90R, the light-emitting element 90G, and the light-emitting element 90B can be manufactured.

Figure 14C:
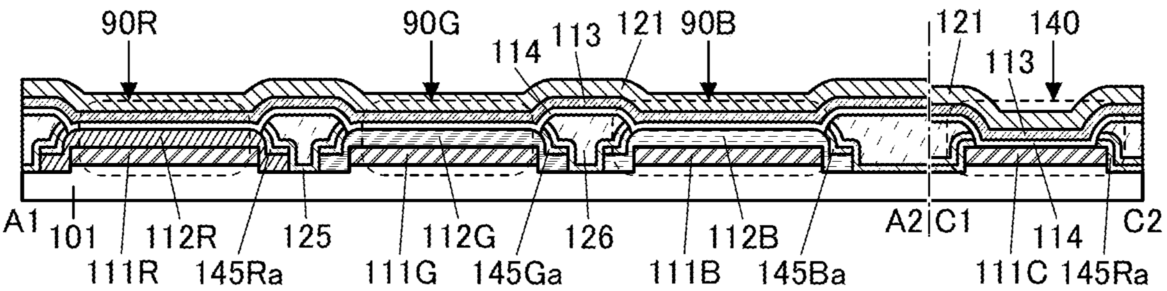

Next, the protective layer 121 is formed over the common electrode 113 (FIG. 14C). When an inorganic insulating film is used as the protective layer 121, the protective layer 121 is preferably formed by a sputtering method, a CVD method, or an ALD method, for example. When an organic insulating film is used as the protective layer 121, the protective layer 121 is preferably formed by an inkjet method, for example, in which case a uniform film can be formed in a desired area.

Through the above processes, the display apparatus 100 can be manufactured.

As described above, in the method for manufacturing the display apparatus of one embodiment of the present invention, EL layers are separately formed by a photolithography method and an etching method without using a shadow mask such as a metal mask. Accordingly, the EL layer can have a fine pattern. Thus, a display apparatus with high definition and a high aperture ratio can be manufactured by the method for manufacturing the display apparatus of one embodiment of the present invention. In addition, a high-resolution display apparatus and a large-sized display apparatus can be manufactured. Moreover, EL layers can be separately formed, whereby a display apparatus that performs extremely clear display with high contrast and high display quality can be manufactured.

At least part of this embodiment can be implemented as appropriate in combination with any of the other embodiments described in this specification.

Embodiment 3

In this embodiment, a display apparatus of one embodiment of the present invention will be described with reference to FIG. 15 to FIG. 23.

The display apparatus in this embodiment can be a high-resolution display apparatus or a large-sized display apparatus. Accordingly, the display apparatus of this embodiment can be used for display portions of a digital camera, a digital video camera, a digital photo frame, a mobile phone, a portable game console, a portable information terminal, and an audio reproducing device, in addition to display portions of electronic devices with a relatively large screen, such as a television device, a desktop or laptop personal computer, a monitor of a computer or the like, digital signage, and a large game machine such as a pachinko machine.

Display Apparatus 100A

Figure 15:
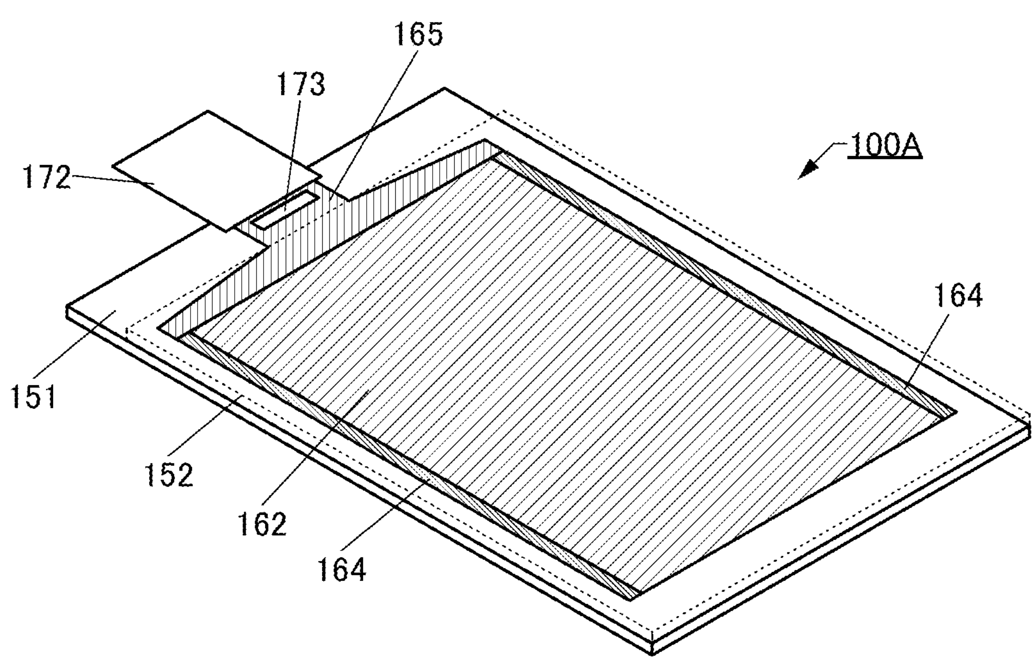
FIG. 15 is a perspective view illustrating an example of a display apparatus.
Figures 16A, 16B, 16C:
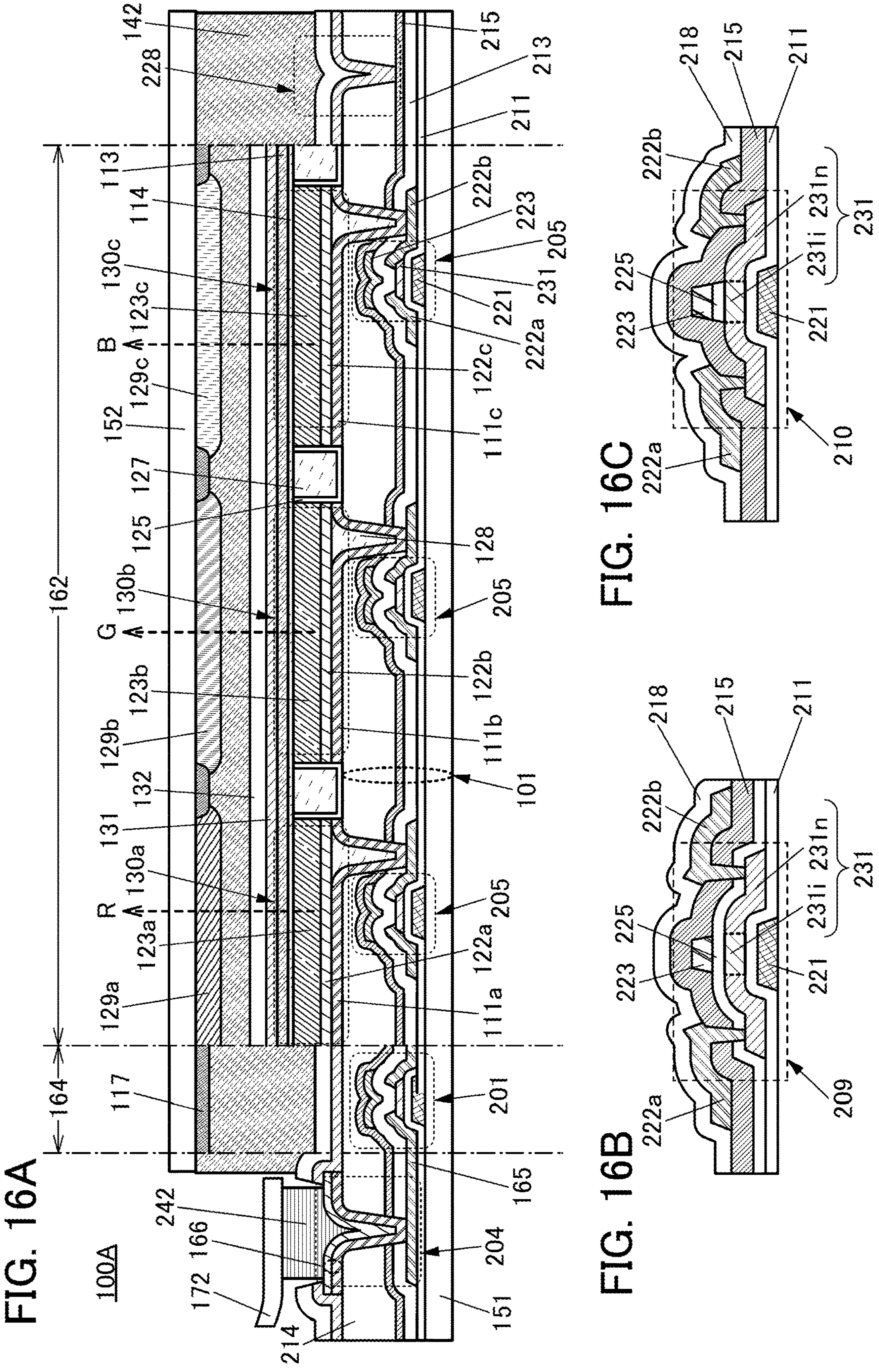
FIG. 16A is a cross-sectional view illustrating an example of a display apparatus.
FIG. 16B and FIG. 16C are cross-sectional views illustrating examples of a transistor.

FIG. 15 is a perspective view of a display apparatus 100A, and FIG. 16A is a cross-sectional view of the display apparatus 100A.

The display apparatus 100A has a structure where a substrate 152 and a substrate 151 are bonded to each other. In FIG. 15, the substrate 152 is denoted by a dashed line.

The display apparatus 100A includes a display portion 162, a circuit 164, a wiring 165, and the like. FIG. 15 illustrates an example in which an IC 173 and an FPC 172 are mounted on the display apparatus 100A. Thus, the structure illustrated in FIG. 15 can be regarded as a display module including the display apparatus 100A, the IC (integrated circuit), and the FPC.

As the circuit 164, a scan line driver circuit can be used, for example.

The wiring 165 has a function of supplying a signal and power to the display portion 162 and the circuit 164. The signal and power are input to the wiring 165 from the outside through the FPC 172 or from the IC 173.

FIG. 15 illustrates an example in which the IC 173 is provided over the substrate 151 by a COG method, a COF (Chip On Film) method, or the like. An IC including a scan line driver circuit, a signal line driver circuit, or the like can be used as the IC 173, for example. Note that the display apparatus 100A and the display module are not necessarily provided with an IC. The IC may be mounted on the FPC by a COF method or the like.

FIG. 16A illustrates an example of cross sections of part of a region including the FPC 172, part of the circuit 164, part of the display portion 162, and part of a region including an end portion of the display apparatus 100A.

The display apparatus 100A illustrated in FIG. 16A includes a transistor 201, a transistor 205, a light-emitting device 130*a*, a light-emitting device 130*b*, a light-emitting device 130*c*, a coloring layer 129*a*, a coloring layer 129*b*, a coloring layer 129*c*, and the like between the substrate 151 and the substrate 152.

The light-emitting device 130*a* emits red light, the light-emitting device 130*b* emits green light, and the light-emitting device 130*c* emits blue light. At this time, for example, it is preferable that the coloring layer 129*a* transmit red light, the coloring layer 129*b* transmit green light, and the coloring layer 129*c* transmit blue light. This can increase the color purity of light emitted from the light-emitting devices, so that a display apparatus with higher display quality can be achieved. Note that the coloring layer 129*a*, the coloring layer 129*b*, and the coloring layer 129*c* are not necessarily provided.

Alternatively, the light-emitting device 130*a*, the light-emitting device 130*b*, and the light-emitting device 130*c* may emit white light. The coloring layer 129*a*, the coloring layer 129*b*, and the coloring layer 129*c* have a function of transmitting different colors. Note that the coloring layer may be called a color filter.

A single structure and a tandem structure are given as the structures capable of white light emission. A tandem structure is suitable for the light-emitting device because high-luminance light emission can be obtained. Furthermore, a display apparatus with a high contrast ratio can be obtained by combining the structure of capable of white light emission (one or both of a single structure and a tandem structure), a color filter, and the MML structure of one embodiment of the present invention.

In the case where a pixel of the display apparatus includes three kinds of subpixels including coloring layers transmitting different colors from each other, the three subpixels can be of three colors of red (R), green (G), and blue (B) or of three colors of yellow (Y), cyan (C), and magenta (M). In the case where four subpixels are included, the four subpixels can be of four colors of R, G, B, and white (W) or of four colors of R, G, B, and Y.

The display apparatus of one embodiment of the present invention can have any of the following structures: a top-emission structure in which light is emitted in a direction opposite to the substrate where the light-emitting device is formed, a bottom-emission structure in which light is emitted toward the substrate where the light-emitting device is formed, and a dual-emission structure in which light is emitted toward both surfaces.

As each of the light-emitting device 130*a*, the light-emitting device 130*b*, and the light-emitting device 130*c*, an EL device such as an OLED (Organic Light Emitting Diode) or a QLED (Quantum-dot Light Emitting Diode) is preferably used. Examples of a light-emitting substance contained in the EL device include a substance exhibiting fluorescence (a fluorescent material), a substance exhibiting phosphorescence (a phosphorescent material), an inorganic compound (such as a quantum dot material), and a substance exhibiting thermally activated delayed fluorescence (a thermally activated delayed fluorescence (TADF) material). Note that as a TADF material, a material in which a singlet excited state and a triplet excited state are in a thermal equilibrium state may be used. Such a TADF material has a short emission lifetime (excitation lifetime), which allows inhibition of a decrease in efficiency in a high-luminance region of a light-emitting device.

The light-emitting device includes an EL layer between a pair of electrodes. In this specification and the like, in some cases, one of the pair of electrodes is referred to as a pixel electrode and the other of the pair of electrodes is referred to as a common electrode.

One of the pair of electrodes of the light-emitting device functions as an anode, and the other electrode functions as a cathode. The case where the pixel electrode functions as an anode and the common electrode functions as a cathode is described below as an example.

The light-emitting device 130*a* includes a pixel electrode 111*a*, a conductive layer 122*a* over the pixel electrode 111*a*, an island-shaped first layer 123*a* over the conductive layer 122*a*, a organic layer 114 over the island-shaped first layer 123*a*, and a common electrode 113 over the organic layer 114. In the light-emitting device 130*a*, the first layer 123*a* and the organic layer 114 can be collectively referred to as an EL layer.

The light-emitting device 130*b* includes a pixel electrode 111*b*, a conductive layer 122*b* over the pixel electrode 111*b*, an island-shaped second layer 123*b* over the conductive layer 122*b*, the organic layer 114 over the island-shaped second layer 123*b*, and the common electrode 113 over the organic layer 114. In the light-emitting device 130*b*, the second layer 123*b* and the organic layer 114 can be collectively referred to as an EL layer.

The light-emitting device 130*c* includes a pixel electrode 111*c*, a conductive layer 122*c* over the pixel electrode 111*c*, an island-shaped third layer 123*c* over the conductive layer 122*c*, the organic layer 114 over the island-shaped third layer 123*c*, and the common electrode 113 over the organic layer 114. In the light-emitting device 130*c*, the third layer 123*c* and the organic layer 114 can be collectively referred to as an EL layer.

The light-emitting devices of the respective colors share the same film as the common electrode. The common electrode shared by the light-emitting devices of the respective colors is electrically connected to a conductive layer provided in a connection portion 204. Thus, the same potential is supplied to the common electrode included in the light-emitting devices of the respective colors.

A conductive film that transmits visible light is used for the electrode through which light is extracted, which is either the pixel electrode or the common electrode. A conductive film that reflects visible light is preferably used as the electrode through which light is not extracted.

As a material that forms the pair of electrodes (the pixel electrode and the common electrode) of the light-emitting device, a metal, an alloy, an electrically conductive compound, a mixture thereof, and the like can be used as appropriate. Specific examples include indium tin oxide (In—Sn oxide, also referred to as ITO), In—Si—Sn oxide (also referred to as ITSO), indium zinc oxide (In—Zn oxide), In—W—Zn oxide, an alloy containing aluminum (an aluminum alloy) such as an alloy of aluminum, nickel, and lanthanum (Al—Ni—La), and an alloy of silver, palladium, and copper (Ag—Pd—Cu, also referred to as APC). In addition, it is possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals. It is also possible to use a Group 1 element or a Group 2 element in the periodic table, which is not described above (e.g., lithium (Li), cesium (Cs), calcium (Ca), or strontium (Sr)), a rare earth metal such as europium (Eu) or ytterbium (Yb), an alloy containing an appropriate combination of any of these elements, graphene, or the like.

The light-emitting devices preferably employ a microcavity structure. Therefore, one of the pair of electrodes of the light-emitting devices is preferably an electrode having properties of transmitting and reflecting visible light (a semi-transmissive and semi-reflective electrode), and the other is preferably an electrode having a property of reflecting visible light (a reflective electrode). When the light-emitting devices have a microcavity structure, light obtained from the light-emitting layers can be resonated between the electrodes, whereby light emitted from the light-emitting devices can be intensified.

The transparent electrode has a light transmittance higher than or equal to 40%. For example, an electrode having a visible light (light with a wavelength greater than or equal to 400 nm and less than 750 nm) transmittance higher than or equal to 40% is preferably used in the light-emitting devices. The visible light reflectivity of the transflective electrode is higher than or equal to 10% and less than or equal to 95%, preferably higher than or equal to 30% and lower than or equal to 80%. The visible light reflectivity of the reflective electrode is higher than or equal to 40% and lower than or equal to 100%, preferably higher than or equal to 70% and lower than or equal to 100%. These electrodes preferably have a resistivity of $1\times10^{-2}$ (2 cm or lower.

The first layer 123*a*, the second layer 123*b*, and the third layer 123*c* are each provided in an island shape. The first layer 123*a*, the second layer 123*b*, and the third layer 123*c* each include a light-emitting layer. Preferably, the first layer

123*a* include a light-emitting layer emitting red light, the second layer 123*b* include a light-emitting layer emitting green light, and the third layer 123*c* include a light-emitting layer emitting blue light The first layer 123*a*, the second layer 123*b*, and the third layer 123*c* may include light-emitting layers that emit white light. Here, the island-shaped first layer 123*a*, the island-shaped second layer 123*b*, and the island-shaped third layer 123*c* preferably contain the same material. That is, the island-shaped first layer 123*a*, the island-shaped second layer 123*b*, and the island-shaped third layer 123*c* are preferably formed by patterning of a film deposited in the same step.

The light-emitting layer is a layer containing a light-emitting substance. The light-emitting layer can contain one or more kinds of light-emitting substances. As the light-emitting substance, a substance that exhibits an emission color of blue, violet, bluish violet, green, yellowish green, yellow, orange, red, or the like is appropriately used. As the light-emitting substance, a substance that emits near-infrared light can also be used.

Examples of the light-emitting substance include a fluorescent material, a phosphorescent material, a TADF material, and a quantum dot material.

Examples of the fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of the phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer may contain one or more kinds of organic compounds (e.g., a host material and an assist material) in addition to the light-emitting substance (a guest material). As one or more kinds of organic compounds, one or both of the hole-transport material and the electron-transport material can be used. Alternatively, as one or more kinds of organic compounds, a bipolar material or a TADF material may be used.

The light-emitting layer preferably includes, for example, a phosphorescent material and a combination of a hole-transport material and an electron-transport material that easily forms an exciplex. With such a structure, light emission can be efficiently obtained by ExTET (Exciplex-Triplet Energy Transfer), which is energy transfer from an exciplex to a light-emitting substance (a phosphorescent material). When a combination of materials is selected so as to form an exciplex that exhibits light emission whose wavelength overlaps with the wavelength of a lowest-energy-side absorption band of the light-emitting substance, energy can be transferred smoothly and light emission can be obtained efficiently. With this structure, high efficiency, low-voltage driving, and a long lifetime of the light-emitting device can be achieved at the same time.

In addition to the light-emitting layer, the first layer 123*a*, the second layer 123*b*, and the third layer 123*c* may further include a layer containing any of a substance with a high hole-injection property, a substance with a high hole-transport property, a hole-blocking material, a substance with a high electron-transport property, a substance with a high electron-injection property, an electron-blocking material, a substance with a bipolar property (a substance with a high electron-transport property and a high hole-transport property), and the like.

Either a low molecular compound or a high molecular compound can be used for the light-emitting device, and an inorganic compound may also be included. Each layer included in the light-emitting device can be formed by an evaporation method (including a vacuum evaporation method), a transfer method, a printing method, an inkjet method, a coating method, or the like.

For example, the first layer 123*a*, the second layer 123*b*, and the third layer 123*c* may each include one or more of a hole-injection layer, a hole-transport layer, a hole-blocking layer, an electron-blocking layer, an electron-transport layer, and an electron-injection layer.

In the EL layer, one or more of a hole-injection layer, a hole-transport layer, a hole-blocking layer (also referred to as a hole-inhibition layer in some cases), an electron-blocking layer (also referred to as an electron-inhibition layer in some cases), an electron-transport layer, and an electron-injection layer can be formed as a layer common to the light-emitting devices. For example, a carrier-injection layer (a hole-injection layer or an electron-injection layer) may be formed as the organic layer 114. Note that all the layers in the EL layer may be separately formed for the respective colors. That is, the EL layer does not necessarily include a layer common to the light-emitting devices of the respective colors.

The first layer 123*a*, the second layer 123*b*, and the third layer 123*c* each preferably include a light-emitting layer and a carrier-transport layer over the light-emitting layer. Accordingly, the light-emitting layer is prevented from being exposed on the outermost surface in the process of manufacturing the display apparatus 100, so that damage to the light-emitting layer can be reduced. As a result, the reliability of the light-emitting devices can be increased.

The hole-injection layer is a layer injecting holes from an anode to the hole-transport layer, and a layer containing a material with a high hole-injection property. As the material with a high hole-injection property, an aromatic amine compound and a composite material containing a hole-transport material and an acceptor material (an electron-accepting material), and the like can be given.

The hole-transport layer is a layer transporting holes, which are injected from the anode by the hole-injection layer, to the light-emitting layer. The hole-transport layer is a layer containing a hole-transport material. The hole-transport material preferably has a hole mobility of $1\times10^{-6}$ $cm^2/Vs$ or higher. Note that other substances can also be used as long as they have a property of transporting more holes than electrons. As the hole-transport material, materials having a high hole-transport property, such as a π-electron rich heteroaromatic compound (e.g., a carbazole derivative, a thiophene derivative, and a furan derivative) and an aromatic amine (a compound having an aromatic amine skeleton), are preferable.

The electron-transport layer is a layer transporting electrons, which are injected from a cathode by the electron-injection layer, to the light-emitting layer. The electron-transport layer is a layer containing an electron-transport material. As the electron-transport material, a substance having an electron mobility greater than or equal to $1\times10^{-6}$ $cm^2/Vs$ is preferable. Note that other substances can also be used as long as they have a property of transporting more electrons than holes. As the electron-transport material, it is possible to use a material having a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a π-electron deficient heteroaromatic compound including a nitrogen-containing heteroaromatic compound.

The electron-transport layer may have a stacked-layer structure, and may include a hole-blocking layer, in contact with the light-emitting layer, which blocks holes moving from the anode side to the cathode side through the light-emitting layer.

The electron-injection layer is a layer injecting electrons from the cathode to the electron-transport layer, and a layer containing a material with a high electron-injection property. As the material with a high electron-injection property, an alkali metal, an alkaline earth metal, or a compound thereof can be used. As the material with a high electron-injection property, a composite material containing an electron-transport material and a donor material (an electron-donating material) can also be used.

As the electron-injection layer, for example, an alkali metal, an alkaline earth metal, or a compound thereof, such as lithium, cesium, ytterbium, lithium fluoride (LiF), cesium fluoride (CsF), calcium fluoride (CaFx, X is a given number), 8-(quinolinolato)lithium (abbreviation: Liq), 2-(2-pyridyl)phenolatolithium (abbreviation: LiPP), 2-(2-pyridyl)-3-pyridinolatolithium (abbreviation: LiPPy), 4-phenyl-2-(2-pyridyl)phenolatolithium (abbreviation: LiPPP), lithium oxide (LiOx), or cesium carbonate can be used. The electron-injection layer may have a stacked-layer structure of two or more layers. For example, it is possible to employ a structure where lithium fluoride is used for a first layer and ytterbium is used for a second layer as the stacked-layer structure.

Alternatively, an electron-transport material may be used for the electron-injection layer. For example, a compound having an unshared electron pair and having an electron deficient heteroaromatic ring can be used as the electron-transport material. Specifically, a compound having at least one of a pyridine ring, a diazine ring (a pyrimidine ring, a pyrazine ring, and a pyridazine ring), and a triazine ring can be used.

Note that the lowest unoccupied molecular orbital (LUMO) of the organic compound having an unshared electron pair is preferably greater than or equal to −3.6 eV and less than or equal to −2.3 eV. In general, the highest occupied molecular orbital (HOMO) level and the LUMO level of the organic compound can be estimated by cyclic voltammetry (CV), photoelectron spectroscopy, optical absorption spectroscopy, inverse photoelectron spectroscopy, or the like.

For example, 4,7-diphenyl-1,10-phenanthroline (abbreviation: BPhen), 2,9-bis(naphthalen-2-yl)-4,7-diphenyl-1,10-phenanthroline (abbreviation: NBPhen), diquinoxalino[2,3-a:2',3'-c]phenazine (abbreviation: HATNA), 2,4,6-tris[3'-(pyridin-3-yl)biphenyl-3-yl]-1,3,5-triazine (abbreviation: TmPPPyTz), or the like can be used as the organic compound having an unshared electron pair. Note that NBPhen has a higher glass transition temperature (Tg) than BPhen and thus has high heat resistance.

In addition, in the case of manufacturing a light-emitting device having a tandem structure, an intermediate layer is provided between two light-emitting units. The intermediate layer has a function of injecting electrons into one of the two light-emitting units and injecting holes to the other when voltage is applied between the pair of electrodes.

For example, the intermediate layer can be suitably formed using a material that can be used for the electron-injection layer, such as lithium. Alternatively, as another example, the intermediate layer can be suitably formed using a material that can be used for the hole-injection layer. A layer containing a hole-transport material and an acceptor material (electron-accepting material) can be used as the intermediate layer. A layer containing an electron-transport material and a donor material can be used as the intermediate layer. Forming the intermediate layer including such a layer can suppress an increase in the driving voltage that would be caused by stacking light-emitting units.

The conductive layer **122*a*, the conductive layer 122*b*, and the conductive layer 122*c* each function as an optical adjustment layer. Note that the conductive layer 122*a*, the conductive layer 122*b*, and the conductive layer 122*c*** are not necessarily provided in some cases.

The side surfaces of the pixel electrode **111*a*, the pixel electrode 111*b*, the pixel electrode 111*c*, the conductive layer 122*a*, the conductive layer 122*b*, the conductive layer 122*c*, the first layer 123*a*, the second layer 123*b*, and the third layer 123*c* are covered with the insulating layer 125 and the insulating layer 127. Thus, the organic layer 114 (or the common electrode 113) can be inhibited from being in contact with the side surface of any of the pixel electrode 111*a*, the pixel electrode 111*b*, the pixel electrode 111*c*, the first layer 123*a*, the second layer 123*b*, and the third layer 123*c*, whereby short circuit of the light-emitting device can be inhibited. The insulating layer 127 corresponds to the resin layer 126** described in Embodiment 1 and the like.

The insulating layer 125 can be an insulating layer containing an inorganic material. As the insulating layer 125, an inorganic insulating film such as an oxide insulating film, a nitride insulating film, an oxynitride insulating film, or a nitride oxide insulating film can be used, for example. The insulating layer 125 may have either a single-layer structure or a stacked-layer structure. Examples of the oxide insulating film include a silicon oxide film, an aluminum oxide film, a magnesium oxide film, an indium gallium zinc oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film, an aluminum oxynitride film, and the like. Examples of the nitride oxide insulating film include a silicon nitride oxide film, an aluminum nitride oxide film, and the like. In particular, an aluminum oxide film is preferable because it has high selectivity with respect to the EL layer in etching and has a function of protecting the EL layer during formation of the insulating layer 127 described later. In particular, when an inorganic insulating film such as an aluminum oxide film, a hafnium oxide film, or a silicon oxide film that is formed by an ALD method is employed for the insulating layer 125, it is possible to form the insulating layer 125 that has few pinholes and an excellent function of protecting the EL layer.

The insulating layer 125 can be formed by a sputtering method, a CVD method, a PLD method, an ALD method, or the like. The insulating layer 125 is preferably formed by an ALD method achieving good coverage.

The insulating layer 127 provided over the insulating layer 125 has a function of filling the depression portion in the insulating layer 125 that is formed between the adjacent light-emitting devices. In other words, the insulating layer 127 brings an effect of improving the planarity of a surface where the common electrode 113 is formed. An insulating layer containing an organic material can be suitably used as the insulating layer 127. For example, the insulating layer 127 can be formed using an acrylic resin, a polyimide resin, an epoxy resin, an imide resin, a polyamide resin, a polyimide-amide resin, a silicone resin, a siloxane resin, a benzocyclobutene-based resin, a phenol resin, precursors of these resins, or the like. The insulating layer 127 may be formed using an organic material such as polyvinyl alcohol (PVA), polyvinyl butyral, polyvinylpyrrolidone, polyethylene glycol, polyglycerin, pullulan, water-soluble cellulose, or an alcohol-soluble polyamide resin. Moreover, the insulating layer 127 can be formed using a photosensitive resin. A photoresist may be used for the photosensitive resin. As the photosensitive resin, a positive photosensitive material or a negative photosensitive material can be used.

The difference between the height of the top surface of the insulating layer 127 and the height of the top surface of one of the first layer 123*a*, the second layer 123*b*, and the third layer 123*c* is preferably less than or equal to 0.5 times, further preferably less than or equal to 0.3 times the thickness of the insulating layer 127, for example. As another example, the insulating layer 127 may be provided so that the height of the top surface of one of the first layer 123*a*, the second layer 123*b*, and the third layer 123*c* is greater than the height of the top surface of the insulating layer 127. As another example, the insulating layer 127 may be provided so that the level of the top surface of the insulating layer 127 is greater than the level of the top surface of the light-emitting layer included in the first layer 123*a*, the second layer 123*b*, or the third layer 123*c*.

The organic layer 114 is formed over the first layer 123*a*, the second layer 123*b*, the third layer 123*c*, the insulating layer 125, and the insulating layer 127. The common electrode 113 is provided over the organic layer 114. A protective layer 131 is provided over the light-emitting device 130*a*, the light-emitting device 130*b*, and the light-emitting device 130*c*. The protective layer 132 is provided over the protective layer 131. Providing the protective layer 131 and the protective layer 132 can improve the reliability of the light-emitting devices.

There is no limitation on the conductivity of the protective layer 131 and the protective layer 132. As the protective layer 131 and the protective layer 132, at least one type of insulating films, semiconductor films, and conductive films can be used.

When the protective layer 131 and the protective layer 132 include an inorganic film, it is possible to inhibit degradation of the light-emitting devices by preventing oxidation of the common electrode 113 or inhibiting entry of impurities (moisture, oxygen, and the like) into the light-emitting device 130*a*, the light-emitting device 130*b*, and the light-emitting device 130*c*, for example; thus, the reliability of the display apparatus can be increased.

As the protective layer 131 and the protective layer 132, an inorganic insulating film such as an oxide insulating film, a nitride insulating film, an oxynitride insulating film, or a nitride oxide insulating film can be used, for example. Examples of the oxide insulating film include a silicon oxide film, an aluminum oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film, an aluminum oxynitride film, and the like. Examples of the nitride oxide insulating film include a silicon nitride oxide film, an aluminum nitride oxide film, and the like.

Each of the protective layer 131 and the protective layer 132 preferably includes a nitride insulating film or a nitride oxide insulating film, and further preferably includes a nitride insulating film.

As the protective layer 131 and the protective layer 132, an inorganic film containing In—Sn oxide (also referred to as ITO), In—Zn oxide, Ga—Zn oxide, Al—Zn oxide, indium gallium zinc oxide (In—Ga—Zn oxide, also referred to as IGZO), or the like can also be used. The inorganic film preferably has high resistance, specifically, higher resistance than the common electrode 113. The inorganic film may further contain nitrogen.

When light emitted from the light-emitting device is extracted through the protective layer 131 and the protective layer 132, the protective layer 131 and the protective layer 132 preferably have a high visible-light-transmitting property. For example, ITO, IGZO, and aluminum oxide are preferable because they are inorganic materials having a high visible-light-transmitting property.

The protective layer 131 and the protective layer 132 can have, for example, a stacked-layer structure of an aluminum oxide film and a silicon nitride film over the aluminum oxide film, or a stacked-layer structure of an aluminum oxide film and an IGZO film over the aluminum oxide film. Such a stacked-layer structure can inhibit entry of impurities (e.g., water and oxygen) into the EL layers.

Furthermore, the protective layer 131 and the protective layer 132 may include an organic film. For example, the protective layer 132 may include both an organic film and an inorganic film.

The protective layer 131 and the protective layer 132 may be formed by different deposition methods. Specifically, the protective layer 131 and the protective layer 132 may be formed by an ALD method and a sputtering method, respectively.

A coloring layer (the coloring layer 129*a*, the coloring layer 129*b*, and the coloring layer 129*c*) is provided over the protective layer 131. The coloring layer 129*a* includes a region overlapping with the light-emitting device 130*a*, the coloring layer 129*b* includes a region overlapping with the light-emitting device 130*b*, and the coloring layer 129*c* includes a region overlapping with the light-emitting device 130*c*. The coloring layer 129*a* includes at least a region overlapping with a light-emitting layer included in the light-emitting device 130*a*, the coloring layer 129*b* includes at least a region overlapping with a light-emitting layer included in the light-emitting device 130*b*, and the coloring layer 129*c* includes at least a region overlapping with a light-emitting layer included in the light-emitting device 130*c*.

The coloring layer 129*a*, the coloring layer 129*b*, and the coloring layer 129*c* have functions of transmitting light of different colors from one another. For example, the coloring layer 129*a* has a function of transmitting red light, the coloring layer 129*b* has a function of transmitting green light, and the coloring layer 129*c* has a function of transmitting blue light. Thus, the display apparatus 100 is capable of full-color display. Note that the coloring layer 129*a*, the coloring layer 129*b*, and the coloring layer 129*c* may each have a function of transmitting light of any of cyan, magenta, and yellow.

The protective layer 132 and the substrate 152 are bonded to each other with an adhesive layer 142. A solid sealing structure, a hollow sealing structure, or the like can be employed to seal the light-emitting devices. In FIG. 16A, a solid sealing structure is employed in which a space between the substrate 152 and the substrate 151 is filled with the adhesive layer 142. Alternatively, a hollow sealing structure in which the space is filled with an inert gas (e.g., nitrogen or argon) may be employed. The adhesive layer 142 may be provided not to overlap with the light-emitting device. The space may be filled with a resin different from that of the frame-like adhesive layer 142.

The pixel electrode 111*a*, the pixel electrode 111*b*, and the pixel electrode 111*c* are each connected to a conductive layer 222*b* included in the transistor 205 through an opening provided in an insulating layer 214.

Depressed portions are formed in the pixel electrode 111*a*, the pixel electrode 111*b*, and the pixel electrode 111*c* to cover the openings provided in the insulating layer 214. A layer 128 is preferably embedded in the depressed portions. Then, it is preferable that the conductive layer 122*a* be formed over the pixel electrode 111*a* and the layer 128, the conductive layer 122*b* be formed over the pixel electrode 111*b* and the layer 128, and the conductive layer 122*c* be formed over the pixel electrode 111*c* and the layer 128. The conductive layer 122*a*, the conductive layer 122*b*, and the conductive layer 122*c* can also be referred to as pixel electrodes.

The layer 128 has a planarization function for the depressed portions of the pixel electrode 111*a*, the pixel electrode 111*b*, and the pixel electrode 111*c*. Providing the layer 128 can reduce unevenness of the formation surface of an EL layer and improve the coverage with the EL layer. Furthermore, the conductive layer 122*a* electrically connected to the pixel electrode 111*a* is provided over the pixel electrode 111*a* and the layer 128, the conductive layer 122*b* electrically connected to the pixel electrode 111*b* is provided over the pixel electrode 111*b* and the layer 128, and the conductive layer 122*c* electrically connected to the pixel electrode 111*c* is provided over the pixel electrode 111*c* and the layer 128, whereby regions overlapping with the depressed portions of the pixel electrode 111*a*, the pixel electrode 111*b*, or the pixel electrode 111*c* can also be used as light-emitting regions in some cases. Therefore, the aperture ratio of a pixel can be increased.

The layer 128 may be an insulating layer or a conductive layer. Any of a variety of inorganic insulating materials, organic insulating materials, and conductive materials can be used for the layer 128 as appropriate. In particular, the layer 128 is preferably formed using an insulating material.

An insulating layer containing an organic material can be suitably used for the layer 128. For the layer 128, an acrylic resin, a polyimide resin, an epoxy resin, a polyamide resin, a polyimide-amide resin, a siloxane resin, a benzocyclobutene-based resin, a phenol resin, a precursor of any of these resins, or the like can be used, for example. A photosensitive resin can also be used for the layer 128. As the photosensitive resin, a positive photosensitive material or a negative photosensitive material can be used.

When a photosensitive resin is used, the layer 128 can be formed through only light-exposure and development steps, reducing the influence of dry etching, wet etching, or the like on the surfaces of the pixel electrode 111*a*, the pixel electrode 111*b*, and the pixel electrode 111*c*. When the layer 128 is formed using a negative photosensitive resin, the layer 128 can sometimes be formed using the same photomask (light-exposure mask) as the photomask used for forming the opening in the insulating layer 214.

The conductive layer 122*a* is provided over the pixel electrode 111*a* and the layer 128. The conductive layer 122*a* includes a first region in contact with a top surface of the pixel electrode 111*a* and a second region in contact with a top surface of the layer 128. It is preferable that the top surface of the pixel electrode 111*a* in contact with the first region and the top surface of the layer 128 in contact with the second region be level or substantially level with each other.

Similarly, the conductive layer 122*b* is provided over the pixel electrode 111*b* and the layer 128. The conductive layer 122*b* includes a first region in contact with a top surface of the pixel electrode 111*b* and a second region in contact with the top surface of the layer 128. It is preferable that the top surface of the pixel electrode 111*b* in contact with the first region and the top surface of the layer 128 in contact with the second region be level or substantially level with each other.

The conductive layer 122*c* is provided over the pixel electrode 111*c* and the layer 128. The conductive layer 122*c* includes a first region in contact with a top surface of the pixel electrode 111*c* and a second region in contact with the top surface of the layer 128. It is preferable that the top surface of the pixel electrode 111*c* in contact with the first region and the top surface of the layer 128 in contact with the second region be level or substantially level with each other.

A pixel electrode contains a material that reflects visible light, and a counter electrode contains a material that transmits visible light.

The display apparatus 100A has a top emission structure. Light from the light-emitting device is emitted toward the substrate 152. For the substrate 152, a material having a high visible-light-transmitting property is preferably used.

The layer 101 includes a stacked-layer structure including the substrate 151 and components thereover up to the insulating layer 214.

The transistor 201 and the transistor 205 are formed over the substrate 151. These transistors can be manufactured using the same material in the same step.

An insulating layer 211, an insulating layer 213, an insulating layer 215, and the insulating layer 214 are provided in this order over the substrate 151. Part of the insulating layer 211 functions as a gate insulating layer of each transistor. Part of the insulating layer 213 functions as a gate insulating layer of each transistor. The insulating layer 215 is provided to cover the transistors. The insulating layer 214 is provided to cover the transistors and has a function of a planarization layer. Note that the number of gate insulating layers and the number of insulating layers covering the transistors are not limited and may have either a single layer or two or more layers.

A material through which impurities such as water and hydrogen do not easily diffuse is preferably used for at least one of the insulating layers covering the transistors. This is because such an insulating layer can function as a barrier layer. Such a structure can effectively inhibit diffusion of impurities into the transistors from the outside and increase the reliability of the display apparatus.

An inorganic insulating film is preferably used as each of the insulating layer 211, the insulating layer 213, and the insulating layer 215. As the inorganic insulating film, a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used.

Here, an organic insulating film often has a lower barrier property against impurities than an inorganic insulating film. Therefore, the organic insulating film preferably has an opening in the vicinity of an end portion of the display apparatus 100A. This can inhibit entry of impurities from the end portion of the display apparatus 100A through the organic insulating film. Alternatively, the organic insulating film may be formed so that its end portion is positioned more inwardly than the end portion of the display apparatus 100A, to prevent the organic insulating film from being exposed at the end portion of the display apparatus 100A.

An organic insulating film is suitable for the insulating layer 214 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins. Alternatively, a stacked film of an organic insulating film and an inorganic insulating film may be used as the insulating layer 214. The outermost layer of the insulating layer 214 preferably functions as an etching protective film. Accordingly, a depressed portion can be prevented from being formed in the insulating layer 214 at the time of processing the pixel electrode 111*a*, the conductive layer 122*a*, or the like. Alternatively, a depressed portion may be formed in the insulating layer 214 at the time of processing the pixel electrode 111*a*, the conductive layer 122*a*, or the like.

In a region 228 illustrated in FIG. 16A, an opening is formed in the insulating layer 214. This can inhibit entry of impurities into the display portion 162 from the outside through the insulating layer 214 even when an organic insulating film is used as the insulating layer 214. Consequently, the reliability of the display apparatus 100A can be increased.

Each of the transistor 201 and the transistor 205 includes a conductive layer 221 functioning as a gate, the insulating layer 211 functioning as a gate insulating layer, a conductive layer 222*a* and the conductive layer 222*b* functioning as a source and a drain, a semiconductor layer 231, the insulating layer 213 functioning as a gate insulating layer, and a conductive layer 223 functioning as a gate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display apparatus in this embodiment. For example, a planar transistor, a staggered transistor, or an inverted staggered transistor can be used. A top-gate or bottom-gate transistor structure can be used. Alternatively, gates may be provided above and below a semiconductor layer where a channel is formed.

The structure in which the semiconductor layer where a channel is formed is provided between two gates is used for the transistor 201 and the transistor 205. The two gates may be connected to each other and supplied with the same signal to drive the transistor. Alternatively, the threshold voltage of the transistor may be controlled by supplying a potential for controlling the threshold voltage to one of the two gates and a potential for driving to the other.

There is no particular limitation on the crystallinity of a semiconductor material used in the semiconductor layer of the transistor, and any of an amorphous semiconductor and a semiconductor having crystallinity (a microcrystalline semiconductor, a polycrystalline semiconductor, a single crystal semiconductor, or a semiconductor partly including crystal regions) may be used. It is preferable to use a semiconductor having crystallinity, in which case degradation of the transistor characteristics can be inhibited.

It is preferable that a semiconductor layer of a transistor contain a metal oxide (also referred to as an oxide semiconductor). That is, a transistor using a metal oxide in its channel formation region (hereinafter, an OS transistor) is preferably used for the display apparatus in this embodiment.

In this specification and the like, a metal oxide is an oxide of a metal in a broad sense. Metal oxides are classified into an oxide insulator, an oxide conductor (including a transparent oxide conductor), an oxide semiconductor (also simply referred to as an OS), and the like. For example, in the case where a metal oxide is used in an active layer of a transistor, the metal oxide is referred to as an oxide semiconductor in some cases. That is, an OS transistor can also be called a transistor including a metal oxide or an oxide semiconductor.

The band gap of a metal oxide used for the semiconductor layer of the transistor is preferably 2 eV or more, further preferably 2.5 eV or more. With use of a metal oxide having a wide bandgap, the off-state current of the OS transistor can be reduced.

A metal oxide preferably contains at least indium or zinc and further preferably contains indium and zinc. A metal oxide preferably contains indium, M (M is one or more kinds selected from gallium, aluminum, yttrium, tin, silicon, boron, copper, vanadium, beryllium, titanium, iron, nickel, germanium, zirconium, molybdenum, lanthanum, cerium, neodymium, hafnium, tantalum, tungsten, magnesium, and cobalt), and zinc, for example. In particular, M is preferably one or more kinds selected from gallium, aluminum, yttrium, and tin, and M is further preferably gallium. Hereinafter, a metal oxide containing indium, M, and zinc is referred to as In-M-Zn oxide in some cases.

It is particularly preferable to use an oxide containing indium (In), gallium (Ga), and zinc (Zn) (also referred to as IGZO) for the semiconductor layer of the transistor. Alternatively, an oxide containing indium (In), aluminum (Al), and zinc (Zn) (also referred to as IAZO) may be used for the semiconductor layer of the transistor. Alternatively, an oxide containing indium (In), aluminum (Al), gallium (Ga), and zinc (Zn) (also referred to as IAGZO) may be used for the semiconductor layer.

When the metal oxide is an In-M-Zn oxide, the atomic ratio of In is preferably greater than or equal to the atomic ratio of M in the In-M-Zn oxide. Examples of the atomic ratio of the metal elements in such an In-M-Zn oxide include In:M:Zn=1:1:1 or a composition in the neighborhood thereof, In:M:Zn=1:1:1.2 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composition in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neighborhood thereof. Note that a composition in the neighborhood includes the range of +30% of an intended atomic ratio. By increasing the proportion of the number of indium atoms in the metal oxide, the on-state current, field-effect mobility, or the like of the transistor can be improved.

For example, when the atomic ratio is described as In:M:Zn=4:2:3 or a composition in the neighborhood thereof, the case is included where M is greater than or equal to 1 and less than or equal to 3 and Zn is greater than or equal to 2 and less than or equal to 4 with In being 4. When the atomic ratio is described as In: M:Zn=5:1:6 or a composition in the neighborhood thereof, the case is included where M is greater than 0.1 and less than or equal to 2 and Zn is greater than or equal to 5 and less than or equal to 7 with In being 5. When the atomic ratio is described as In: M:Zn=1:1:1 or a composition in the neighborhood thereof, the case is included where M is greater than 0.1 and less than or equal to 2 and Zn is greater than 0.1 and less than or equal to 2 with In being 1.

The atomic ratio of In may be less than the atomic ratio of M in the In-M-Zn oxide. Examples of the atomic ratio of the metal elements in such an In-M-Zn oxide include In:M:Zn=1:3:2 or a composition in the neighborhood thereof, In:M:Zn=1:3:3 or a composition in the neighborhood thereof, In:M:Zn=1:3:4 or a composition in the neighborhood thereof. By increasing the proportion of the number of M atoms in the metal oxide, the band gap of the In-M-Zn oxide is further increased; thus, the resistance to a negative bias stress test with light irradiation can be improved. Specifically, the amount of change in the threshold voltage or the amount of change in the shift voltage (Vsh) measured in a NBTIS (Negative Bias Temperature Illumination Stress) test of the transistor can be decreased. Note that the shift voltage (Vsh) is defined as Vg at which, in a drain current (Id)-gate voltage (Vg) curve of a transistor, the tangent at a point where the slope of the curve is the steepest intersects the straight line of Id=1 pA.

Alternatively, a semiconductor layer of a transistor may contain silicon. Examples of silicon include amorphous silicon and crystalline silicon (e.g., low-temperature polysilicon or single crystal silicon).

Alternatively, a semiconductor layer of a transistor may contain a layered material that functions as a semiconductor. The layered material is a general term of a group of materials having a layered crystal structure. In the layered crystal structure, layers formed by covalent bonding or ionic bonding are stacked with bonding such as the Van der Waals force, which is weaker than covalent bonding or ionic bonding. The layered material has high electrical conductivity in a monolayer, that is, high two-dimensional electrical conductivity. When a material functioning as a semiconductor and having high two-dimensional electrical conductivity is used for a channel formation region, a transistor having a high on-state current can be provided.

Examples of the layered materials include graphene, silicene, and chalcogenide. Chalcogenide is a compound containing chalcogen (an element belonging to Group 16). Examples of chalcogenide include transition metal chalcogenide and chalcogenide of Group 13 elements. Specific examples of the transition metal chalcogenide which can be used for a semiconductor layer of a transistor include molybdenum sulfide (typically $MoS_2$), molybdenum selenide (typically $MoSe_2$), molybdenum telluride (typically $MoTe_2$), tungsten sulfide (typically $WS_2$), tungsten selenide (typically $WSe_2$), tungsten telluride (typically $WTe_2$), hafnium sulfide (typically $HfS_2$), hafnium selenide (typically $HfSe_2$), zirconium sulfide (typically $ZrS_2$), and zirconium selenide (typically $ZrSe_2$).

The transistor included in the circuit 164 and the transistor included in the display portion 162 may have the same structure or different structures. One structure or two or more kinds of structures may be employed for a plurality of transistors included in the circuit 164. Similarly, one structure or two or more kinds of structures may be employed for a plurality of transistors included in the display portion 162.

A connection portion 204 is provided in a region of the substrate 151 where the substrate 152 does not overlap. In the connection portion 204, the wiring 165 is electrically connected to the FPC 172 through a conductive layer 166 and a connection layer 242. An example is illustrated in which the conductive layer 166 has a stacked-layer structure of a conductive film obtained by processing the same conductive film as the pixel electrode 111*a*, the pixel electrode 111*b*, and the pixel electrode 111*c* and a conductive film obtained by processing the same conductive film as the conductive layer 122*a*, the conductive layer 122*b*, and the conductive layer 122*c*. On a top surface of the connection portion 204, the conductive layer 166 is exposed. Thus, the connection portion 204 and the FPC 172 can be electrically connected to each other through the connection layer 242.

A light-blocking layer 117 is preferably provided on the surface of the substrate 152 on the substrate 151 side. In addition, the coloring layer 129*a*, the coloring layer 129*b*, and the coloring layer 129*c* may be provided on the surface of the substrate 152 on the substrate 151 side. In FIG. 16A, when the substrate 152 is viewed through the substrate 151, the coloring layer 129*a*, the coloring layer 129*b*, and the coloring layer 129*c* are provided to cover part of the light-blocking layer 117.

A variety of optical members can be arranged on the outer surface of the substrate 152. Examples of the optical members include a polarizing plate, a retardation plate, a light diffusion layer (e.g., a diffusion film), an anti-reflective layer, and a light-condensing film. Furthermore, an antistatic film preventing the attachment of dust, a water repellent film suppressing the attachment of stain, a hard coat film suppressing generation of a scratch caused by the use, an impact-absorbing layer, or the like may be arranged on the outer surface of the substrate 152.

The protective layer 131 and the protective layer 132 covering the light-emitting device can inhibit an impurity such as water from entering the light-emitting device, and increase the reliability of the light-emitting device.

In the region 228 in the vicinity of the end portion of the display apparatus 100A, the insulating layer 215 and the protective layer 131 or the protective layer 132 are preferably in contact with each other through an opening in the insulating layer 214. In particular, the inorganic insulating films are preferably in contact with each other. Thus, entry of impurities from the outside into the display portion 162 through the organic insulating film can be inhibited. Consequently, the reliability of the display apparatus 100A can be increased.

For each of the substrate 151 and the substrate 152, glass, quartz, ceramics, sapphire, a resin, a metal, an alloy, a semiconductor, or the like can be used. For the substrate on the side from which light from the light-emitting device is extracted, a material that transmits the light is used. When the substrate 151 and the substrate 152 are formed using a flexible material, the flexibility of the display apparatus can be increased. Furthermore, a polarizing plate may be used as the substrate 151 or the substrate 152.

For each of the substrate 151 and the substrate 152, any of the following can be used, for example: polyester resins such as polyethylene terephthalate (PET) and polyethylene naphthalate (PEN), a polyacrylonitrile resin, an acrylic resin, a polyimide resin, a polymethyl methacrylate resin, a polycarbonate (PC) resin, a polyethersulfone (PES) resin, polyamide resins (e.g., nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, and cellulose nanofiber. Glass that is thin enough to have flexibility may be used for one or both of the substrate 151 and the substrate 152.

In the case where a circularly polarizing plate overlaps with the display apparatus, a highly optically isotropic substrate is preferably used as the substrate included in the display apparatus. A highly optically isotropic substrate has a low birefringence (in other words, a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of a highly optically isotropic film include a triacetyl cellulose (TAC, also referred to as cellulose triacetate) film, a cycloolefin polymer (COP) film, a cycloolefin copolymer (COC) film, and an acrylic film.

When a film is used for the substrate and the film absorbs water, the shape of the display panel might be changed, e.g., creases are generated. Thus, for the substrate, a film with a low water absorption rate is preferably used. For example, the water absorption rate of the film is preferably 1% or lower, further preferably 0.1% or lower, still further preferably 0.01% or lower.

As the adhesive layer 142, a variety of curable adhesives, e.g., a photocurable adhesive such as an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. A two-component-mixture-type resin may be used. An adhesive sheet or the like may be used.

As the connection layer 242, an anisotropic conductive film (ACF), an anisotropic conductive paste (ACP), or the like can be used.

As materials for the gates, the source, and the drain of a transistor and conductive layers such as a variety of wirings and electrodes included in the display apparatus, any of metals such as aluminum, titanium, chromium, nickel, copper, yttrium, zirconium, molybdenum, silver, tantalum, and tungsten, or an alloy containing any of these metals as its main component can be used. A single-layer structure or a stacked-layer structure including a film containing any of these materials can be used.

As a light-transmitting conductive material, a conductive oxide such as indium oxide, indium tin oxide, indium zinc oxide, zinc oxide, or zinc oxide containing gallium, or graphene can be used. It is also possible to use a metal material such as gold, silver, platinum, magnesium, nickel, tungsten, chromium, molybdenum, iron, cobalt, copper, palladium, or titanium; or an alloy material containing any of these metal materials. Alternatively, a nitride of the metal material (e.g., titanium nitride) or the like may be used. Note that in the case of using the metal material or the alloy material (or the nitride thereof), the thickness is preferably set small enough to transmit light. Alternatively, a stacked film of any of the above materials can be used for the conductive layers. For example, a stacked film of indium tin oxide and an alloy of silver and magnesium is preferably used because conductivity can be increased. They can also be used for conductive layers such as wirings and electrodes included in the display apparatus, and conductive layers (e.g., a conductive layer functioning as a pixel electrode or a common electrode) included in a light-emitting device.

Examples of insulating materials that can be used for the insulating layers include resins such as an acrylic resin and an epoxy resin, and inorganic insulating materials such as silicon oxide, silicon oxynitride, silicon nitride oxide, silicon nitride, and aluminum oxide.

FIG. 16B and FIG. 16C illustrate other structure examples of transistors.

The transistor 209 and the transistor 210 each include the conductive layer 221 functioning as a gate, the insulating layer 211 functioning as a gate insulating layer, the semiconductor layer 231 including a channel formation region 231*i* and a pair of low-resistance regions 231*n*, the conductive layer 222*a* connected to one of the low-resistance regions 231*n*, the conductive layer 222*b* connected to the other low-resistance region 231*n*, the insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231*i*. The insulating layer 225 is positioned at least between the conductive layer 223 and the channel formation region 231*i*. Furthermore, an insulating layer 218 covering the transistor may be provided.

FIG. 16B illustrates an example of the transistor 209 in which the insulating layer 225 covers a top surface and a side surface of the semiconductor layer 231. The conductive layer 222*a* and the conductive layer 222*b* are connected to the corresponding low-resistance regions 231*n* through openings provided in the insulating layer 225 and the insulating layer 215. One of the conductive layer 222*a* and the conductive layer 222*b* functions as a source, and the other functions as a drain.

In the transistor 210 illustrated in FIG. 16C, the insulating layer 225 overlaps with the channel formation region 231*i* of the semiconductor layer 231 and does not overlap with the low-resistance regions 231*n*. The structure illustrated in FIG. 16C is obtained by processing the insulating layer 225 with the conductive layer 223 as a mask, for example. In FIG. 16C, the insulating layer 215 is provided to cover the insulating layer 225 and the conductive layer 223, and the conductive layer 222*a* and the conductive layer 222*b* are connected to the corresponding low-resistance regions 231*n* through the openings in the insulating layer 215.

Transistors containing silicon in their semiconductor layers where channels are formed (hereinafter also referred to as a Si transistor) may be used as all transistors included in the pixel circuit for driving the light-emitting device. As a material used for a silicon transistor, single crystal silicon, polycrystalline silicon, amorphous silicon, and the like can be given. In particular, a transistor containing low-temperature polysilicon (LTPS) in its semiconductor layer (hereinafter also referred to as an LTPS transistor) can be used. The LTPS transistor has high field-effect mobility and favorable frequency characteristics.

With the use of Si transistors such as LTPS transistors, a circuit required to be driven at a high frequency (e.g., a source driver circuit) can be formed on the same substrate as the display portion. Thus, external circuits mounted on the display apparatus can be simplified, whereby parts costs and mounting costs can be reduced.

It is preferable to use an OS transistor as at least one of the transistors included in the pixel circuit. An OS transistor has extremely higher field-effect mobility than a transistor using amorphous silicon. In addition, the OS transistor has an extremely low leakage current between a source and a drain in an off state (hereinafter also referred to as off-state current), and charge accumulated in a capacitor that is connected in series to the transistor can be retained for a long period. Furthermore, power consumption of the display apparatus can be reduced with the use of an OS transistor.

The off-state current value per micrometer of channel width of an OS transistor at room temperature can be lower than or equal to 1 aA ($1\times10^{-18}$ A), lower than or equal to 1 zA ($1\times10^{-21}$ A), or lower than or equal to 1 yA ($1\times10^{-24}$ A). Note that the off-state current value per micrometer of channel width of a Si transistor at room temperature is higher than or equal to 1 fA ($1\times10^{-15}$ A) and lower than or equal to 1 pA ($1\times10^{-12}$ A). In other words, the off-state current of an OS transistor is lower than the off-state current of a Si transistor by approximately ten orders of magnitude.

When an LTPS transistor is used as one or more of the transistors included in the pixel circuit and an OS transistor is used as the rest, a display apparatus with low power consumption and high driving capability can be achieved. Note that a structure where an LTPS transistor and an OS transistor are used in combination is referred to as LTPO in some cases. Note that as a more preferable example, it is preferable to use an OS transistor as, for example, a transistor functioning as a switch for controlling electrical continuity between wirings and an LTPS transistor as, for example, a transistor for controlling current.

For example, one of the transistors included in the pixel circuit functions as a transistor for controlling current flowing through the light-emitting device and can be referred to as a driving transistor. One of a source and a drain of the driving transistor is electrically connected to the pixel electrode of the light-emitting device. An LTPS transistor is preferably used as the driving transistor. In this case, the amount of current flowing through the light-emitting device can be increased in the pixel circuit.

Another transistor included in the pixel circuit functions as a switch for controlling selection and non-selection of the pixel and can be referred to as a selection transistor. A gate of the selection transistor is electrically connected to a gate line, and one of a source and a drain thereof is electrically connected to a source line (signal line). An OS transistor is preferably used as the selection transistor. Accordingly, the gray level of the pixel can be maintained even with an extremely low frame frequency (e.g., 1 fps or less); thus, power consumption can be reduced by stopping the driver in displaying a still image.

As described above, the display apparatus of one embodiment of the present invention can have all of a high aperture ratio, a high definition, high display quality, and low power consumption.

Note that the display apparatus of one embodiment of the present invention has a structure including the OS transistor and the light-emitting device having an MML (metal maskless) structure. With this structure, leakage current that might flow through the transistor and leakage current that might flow between adjacent light-emitting devices (also referred to as lateral leakage current, side leakage current, or the like) can become extremely low. With this structure, a viewer can notice any one or more of the image crispness, the image sharpness, a high chroma, and a high contrast ratio in an image displayed on the display apparatus. With the structure where the leakage current that might flow through the transistor and the lateral leakage current between light-emitting devices are extremely low, display with little leakage of light at the time of black display (i.e., with few phenomena in which the black image looks whitish) (such display is also referred to as deep black display) can be achieved.

In particular, in the case where a light-emitting device having an MML structure employs the above-described SBS structure, a layer provided between light-emitting devices (for example, also referred to as an organic layer or a common layer which is commonly used between the light-emitting devices) is disconnected; accordingly, display with no or extremely small side leakage can be achieved.

To increase the emission luminance of the light-emitting device included in the pixel circuit, the amount of current flowing through the light-emitting device needs to be increased. For that purpose, the source-drain voltage of the driving transistor included in the pixel circuit needs to be increased. Since an OS transistor has a higher withstand voltage between the source and the drain than a Si transistor, a high voltage can be applied between the source and the drain of the OS transistor. Accordingly, when an OS transistor is used as the driving transistor included in the pixel circuit, the amount of current flowing through the light-emitting device can be increased, so that the emission luminance of the light-emitting device can be increased.

When transistors operate in a saturation region, a change in source-drain current relative to a change in gate-source voltage can be smaller in an OS transistor than in a Si transistor. Accordingly, when an OS transistor is used as the driving transistor included in the pixel circuit, the amount of current flowing between the source and the drain can be set minutely by a change in gate-source voltage; hence, the amount of current flowing through the light-emitting device can be controlled. Accordingly, the gray level in the pixel circuit can be increased.

Regarding saturation characteristics of current flowing when transistors operate in a saturation region, even in the case where the source-drain voltage of an OS transistor increases gradually, more stable constant current (saturation current) can be fed through the OS transistor than through a Si transistor. Thus, by using an OS transistor as the driving transistor, stable constant current can be fed through light-emitting devices that contain an EL material even when the current-voltage characteristics of the light-emitting devices vary, for example. In other words, when the OS transistor operates in a saturation region, the source-drain current hardly changes with an increase in the source-drain voltage; hence, the emission luminance of the light-emitting device can be stable.

As described above, the use of the OS transistor as the driving transistor included in the pixel circuit enables "inhibition of black floating", "an increase in emission luminance", "an increase in gray levels", "inhibition of variation in the light-emitting devices", and the like.

Display Apparatus 100B

Figure 17:
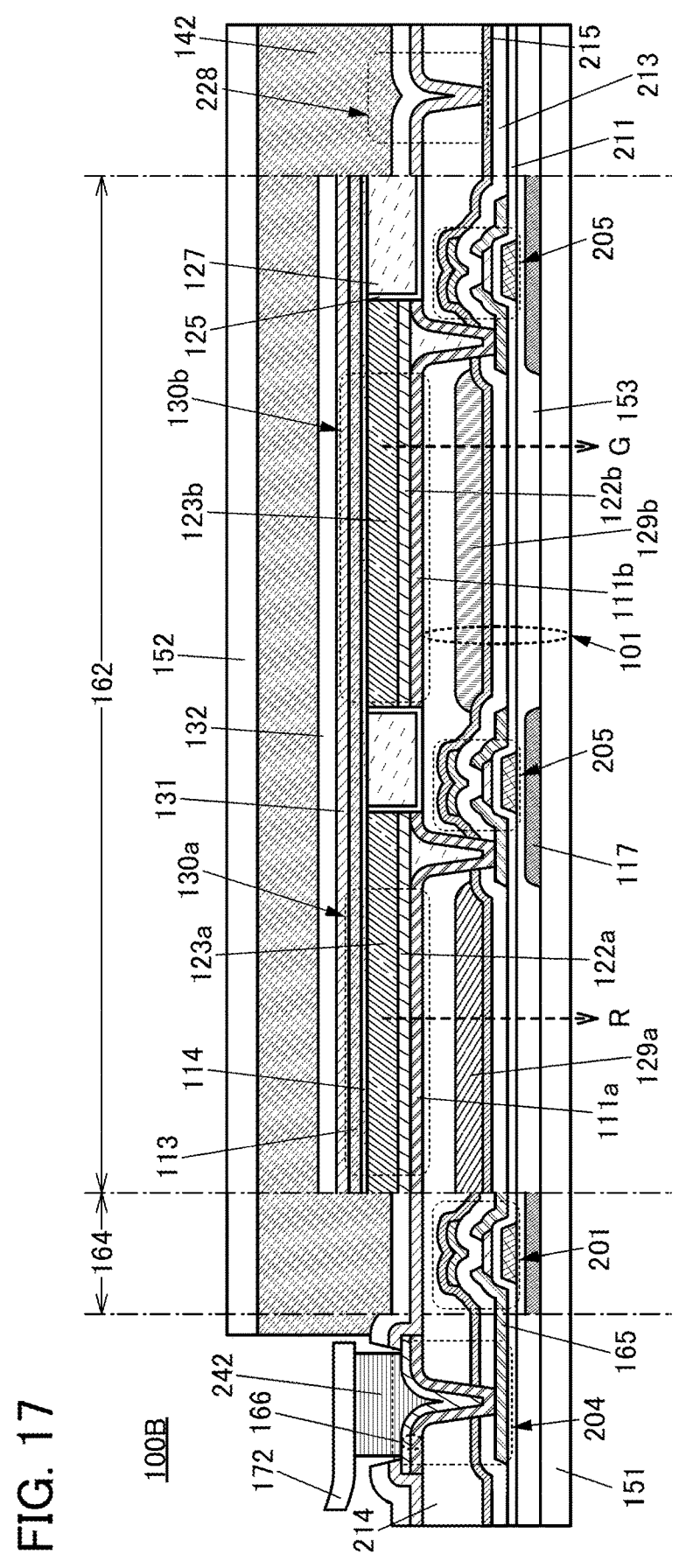

A display apparatus 100B illustrated in FIG. 17 is different from the display apparatus 100A mainly in having a bottom-emission structure. Note that portions similar to those in the display apparatus 100A are not described. Note that although FIG. 17 illustrates a subpixel including the first layer 123*a* and a subpixel including the second layer 123*b*, three or more kinds of subpixels can be provided as in FIG. 16A.

Light from the light-emitting device is emitted toward the substrate 151 side. For the substrate 151, a material having a high visible-light-transmitting property is preferably used. By contrast, there is no limitation on the light-transmitting property of a material used for the substrate 152.

In the display apparatus 100B, the pixel electrode 111*a* and the pixel electrode 111*b* and the conductive layer 122*a* and the conductive layer 122*b* contain a material that transmits visible light, and the common electrode 113 contains a material that reflects visible light. Here, the conductive layer 166 that is obtained by processing the same conductive film as the pixel electrode 111*a* and the pixel electrode 111*b* and the conductive layer 122*a* and the conductive layer 122*b* also contains a material that transmits visible light.

The light-blocking layer 117 is preferably formed between the substrate 151 and the transistor 201 and between the substrate 151 and the transistor 205. FIG. 17 illustrates an example in which the light-blocking layer 117 is provided over the substrate 151, an insulating layer 153 is provided over the light-blocking layer 117, and the transistor 201 and the transistor 205 and the like are provided over the insulating layer 153.

Moreover, in the display apparatus 100B, the coloring layer 129*a* and the coloring layer 129*b* are provided between the insulating layer 215 and the insulating layer 214. End portions of the coloring layer 129*a* and the coloring layer 129*b* preferably overlap with the light-blocking layer 117.

FIG. 18A to FIG. 18D illustrate cross-sectional structures of a region 138 including the pixel electrode 111*a*, the layer 128, and the vicinity thereof in the display apparatus 100A and the display apparatus 100B. Note that as the description relating to FIG. 18A to FIG. 18D, the same can apply to the light-emitting device 130*b* and the light-emitting device 130*c*.

Figure 18A:
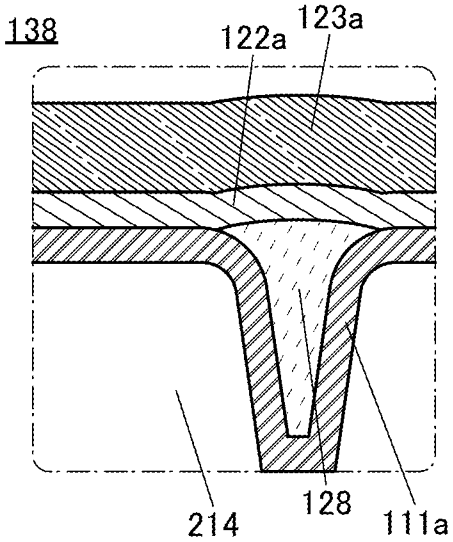
FIG. 18A to FIG. 18D are cross-sectional views illustrating examples of a display apparatus.

FIG. 16A and FIG. 17 each illustrate an example in which the top surface of the layer 128 and the top surface of the pixel electrode 111*a* are substantially at the same level; however, the present invention is not limited to such an example. For example, as illustrated in FIG. 18A, the top surface of the layer 128 may be at a higher level than the top surface of the pixel electrode 111*a*. Moreover, the top surface of the layer 128 has a convex shape that is gently bulged toward the center.

Figure 18B:
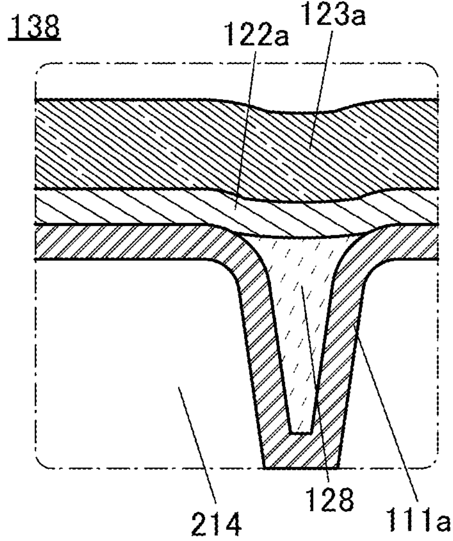

As illustrated in FIG. 18B, the top surface of the layer 128 may be at a lower level than the top surface of the pixel electrode 111*a*. Moreover, the top surface of the insulating layer 128 has a concave shape that is gently recessed toward the center.

Figure 18C:
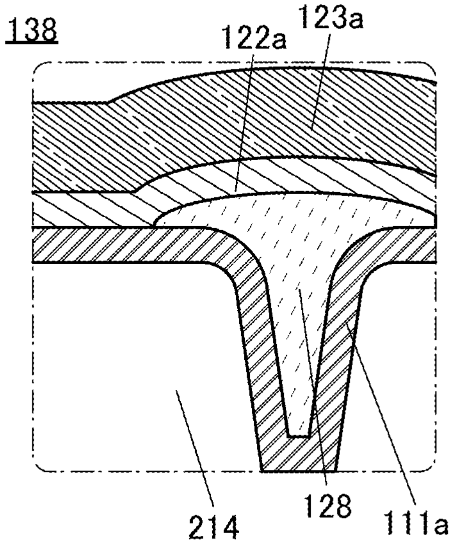

When the top surface of the layer 128 is at a higher level than the top surface of the pixel electrode 111*a* as illustrated in FIG. 18C, the upper portion of the layer 128 is formed to extend beyond a recessed portion in the pixel electrode 111*a* in some cases. In this case, part of the layer 128 may be formed to cover part of the pixel electrode 111*a* which is substantially flat.

Figure 18D:
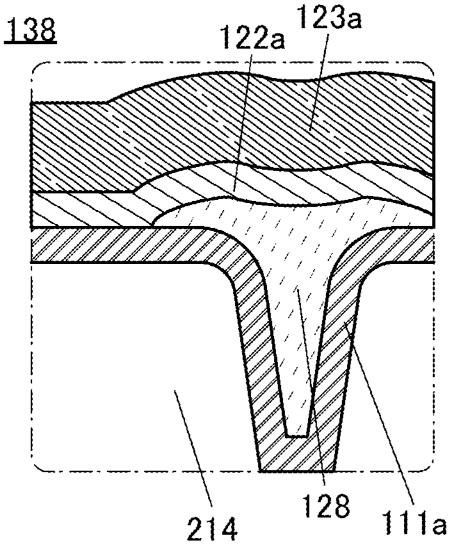

As illustrated in FIG. 18D, a part of the top surface of layer 128 has another depression portion in the structure of FIG. 18C, in some cases. The recessed portion has a shape that is gently recessed toward the middle.

Pixel Layout

Next, a pixel layout is described. There is no particular limitation on the arrangement of subpixels, and a variety of methods can be employed. Examples of the arrangement of subpixels include stripe arrangement, S-stripe arrangement, matrix arrangement, delta arrangement, Bayer arrangement, and PenTile arrangement.

Examples of a top surface shape of the subpixel include polygons such as a triangle, a tetragon (including a rectangle, a trapezoid, and the like), and a pentagon; polygons with rounded corners; an ellipse; and a circle. Here, a top surface shape of the subpixel corresponds to a top surface shape of a light-emitting region of the light-emitting device.

A pixel 110 illustrated in FIG. 19A employs stripe arrangement. The pixel 110 illustrated in FIG. 19A consists of three subpixels 110*a*, 110*b*, and 110*c*. For example, as illustrated in FIG. 20A, the subpixel 110*a* may be a red subpixel R, the subpixel 110*b* may be a green subpixel G, and the subpixel 110*c* may be a blue subpixel B.

The pixel 110 illustrated in FIG. 19B employs S-stripe arrangement. The pixel 110 illustrated in FIG. 19B consists of three subpixels 110*a*, 110*b*, and 110*c*. For example, as illustrated in FIG. 20B, the subpixel 110*a* may be a blue subpixel B, the subpixel 110*b* may be a red subpixel R, and the subpixel 110*c* may be a green subpixel G.

FIG. 19C illustrates an example where subpixels of different colors are arranged in a zigzag manner. Specifically, the positions of the top sides of two subpixels arranged in the column direction (e.g., the subpixel 110*a* and the subpixel 110*b* or the subpixel 110*b* and the subpixel 110*c*) are not aligned in the top view. For example, as illustrated in FIG. 20C, the subpixel 110*a* may be a red subpixel R, the subpixel 110*b* may be a green subpixel G, and the subpixel 110*c* may be a blue subpixel B.

Figure 19D:
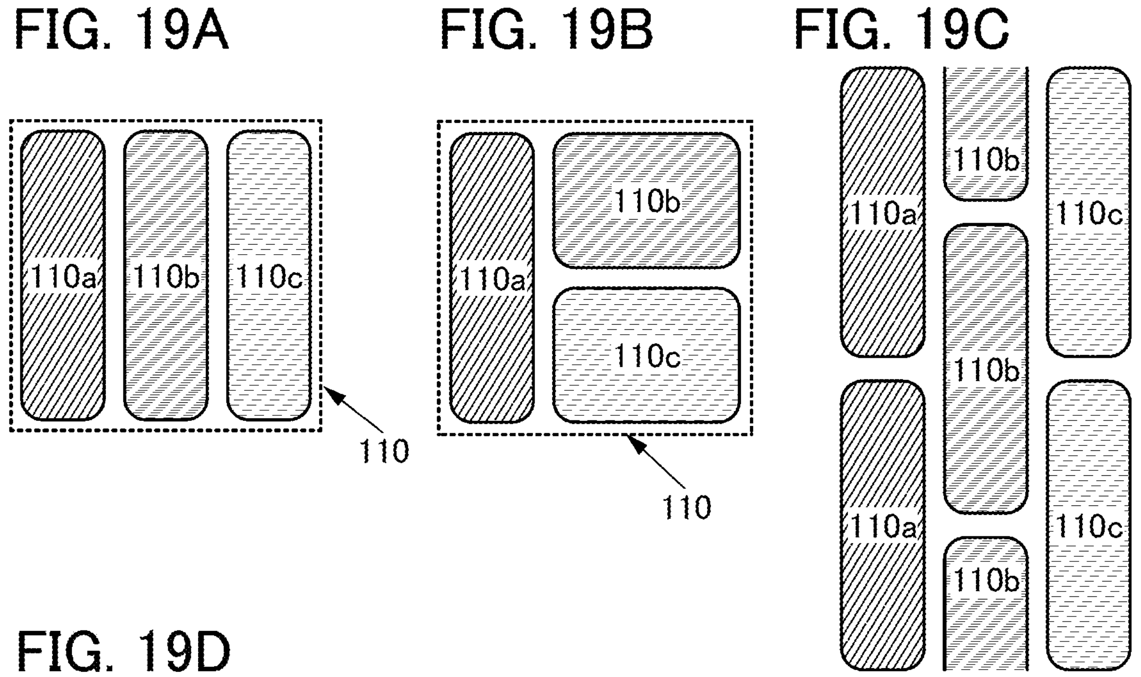
Figure 20D:
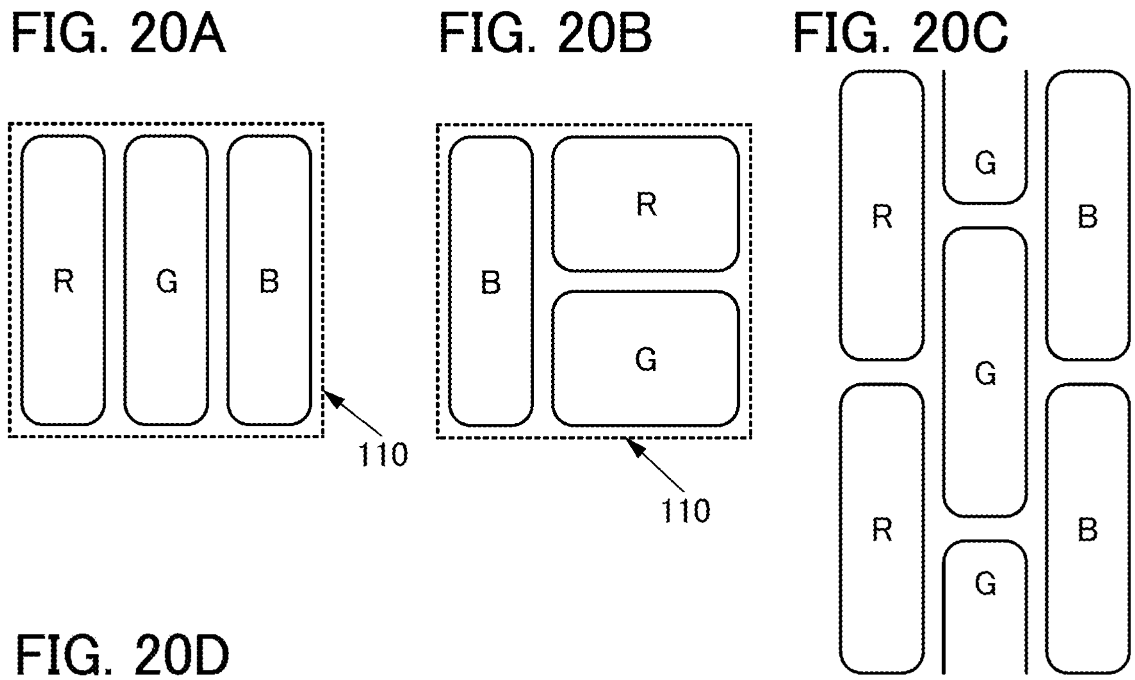

The pixel 110 illustrated in FIG. 19D includes the subpixel 110*a* whose top surface shape is a rough trapezoid with rounded corners, the subpixel 110*b* whose top surface shape is a rough triangle with rounded corners, and the subpixel 110*c* whose top surface shape is a rough tetragon or rough hexagon with rounded corners. The subpixel 110*a* has a larger light-emitting area than the subpixel 110*b*. In this manner, the shapes and sizes of the subpixels can be determined independently. For example, the size of a subpixel including a light-emitting device with higher reliability can be smaller. For example, as illustrated in FIG. 20D, the subpixel 110*a* may be a green subpixel G, the subpixel 110*b* may be a red subpixel R, and the subpixel 110*c* may be a blue subpixel B.

In a photolithography method, as a pattern to be processed becomes finer, the influence of light diffraction becomes more difficult to ignore; therefore, the fidelity in transferring a photomask pattern by light exposure is degraded, and it becomes difficult to process a resist mask into a desired shape. Thus, a pattern with rounded corners is likely to be formed even with a rectangular photomask pattern. Consequently, the top surface of a subpixel can have a polygonal shape with rounded corners, an elliptical shape, a circular shape, or the like.

Furthermore, in the method of manufacturing the display apparatus of one embodiment of the present invention, the EL layer is processed into an island shape with use of a resist mask. A resist film formed over the EL layer needs to be cured at a temperature lower than the upper temperature limit of the EL layer. Therefore, the resist film is insufficiently cured in some cases depending on the upper temperature limit of the material of the EL layer and the curing temperature of the resist material. An insufficiently cured resist film may have a shape different from a desired shape by processing. As a result, the top surface of the EL layer may have a polygonal shape with rounded corners, an elliptical shape, a circular shape, or the like. For example, when a resist mask with a square top surface is intended to be formed, a resist mask with a circular top surface may be formed, and the top surface of the EL layer may be circular.

To obtain a desired top surface shape of the EL layer, a technique of correcting a mask pattern in advance so that a transferred pattern agrees with a design pattern (an optical proximity correction (OPC) technique) may be used. Specifically, with the OPC technique, a pattern for correction is added to a corner portion or the like of a figure on a mask pattern.

Figures 21A, 21B, 21C, 21D, 21E:
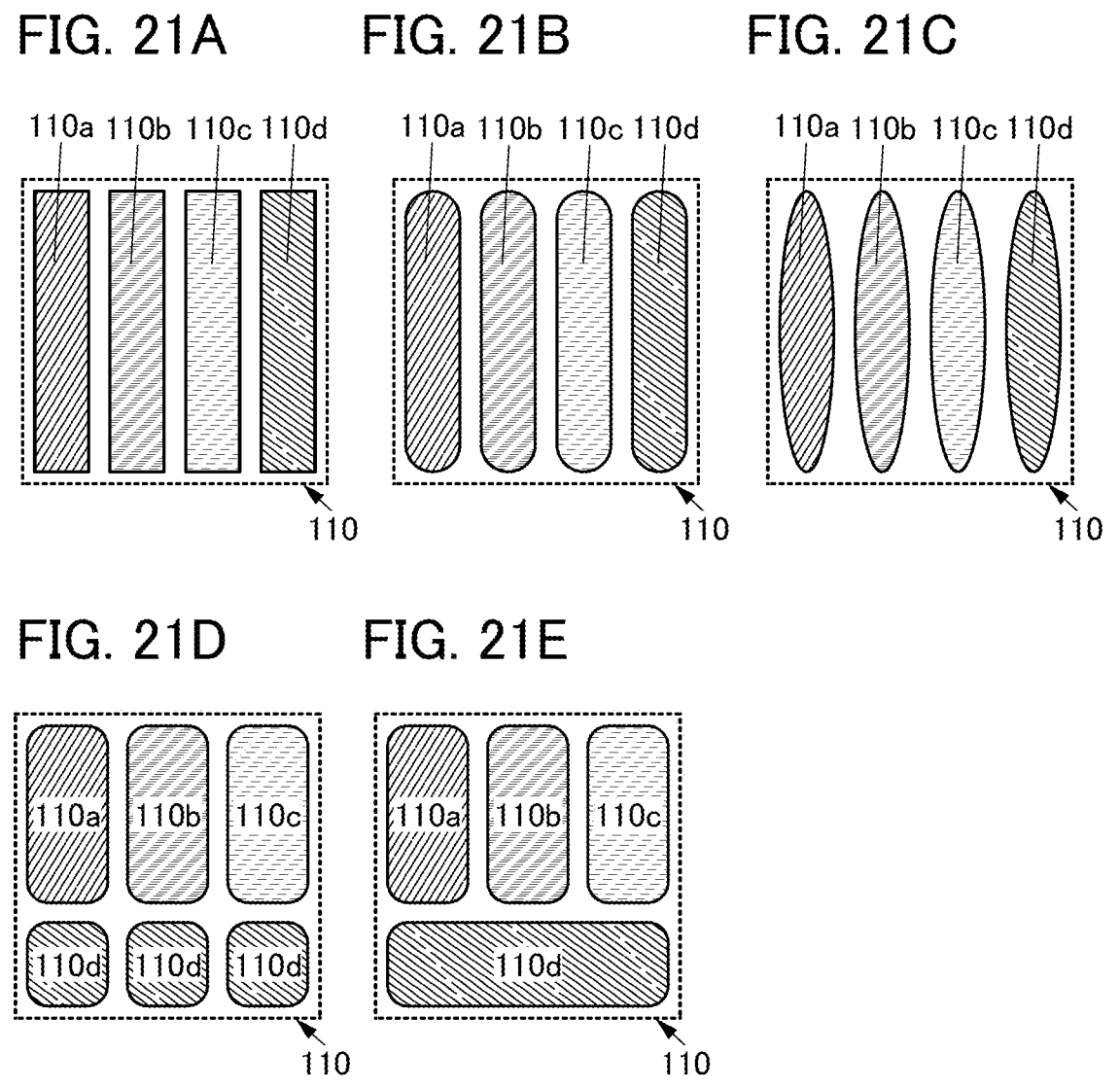

The pixels 110 illustrated in FIG. 21A to 21C each employ stripe arrangement.

FIG. 21A illustrates an example where each subpixel has a rectangular top surface. FIG. 21B illustrates an example where each subpixel has a top surface shape formed by combining two half circles and a rectangle (also referred to as an oval shape). FIG. 21C illustrates an example where each subpixel has an elliptical top surface.

Figures 22A, 22B, 22C:
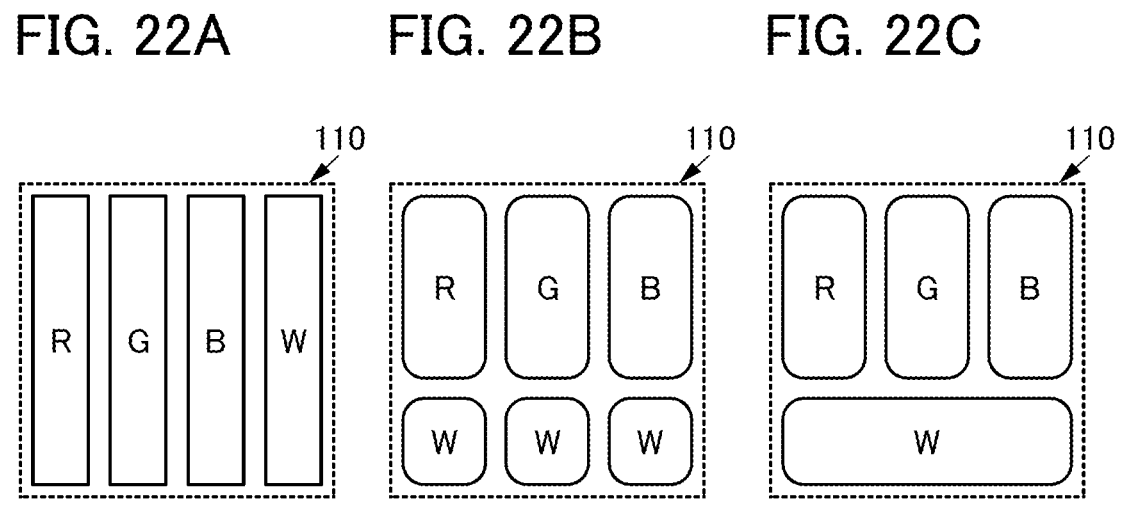

The pixel 110 illustrated in FIG. 21A to FIG. 21C consists of four subpixels 110*a*, 110*b*, 110*c*, and 110*d*. The subpixel 110*a*, the subpixel 110*b*, the subpixel 110*c*, and the subpixel 110*d* include light-emitting devices that emit light of different colors from one another. For example, the subpixel 110*a*, the subpixel 110*b*, the subpixel 110*c*, and the subpixel 110*d* can be red, green, blue, and white subpixels, respectively. For example, the subpixel 110*a*, the subpixel 110*b*, the subpixel 110*c*, and the subpixel 110*d* can be red, green, blue, and white subpixels, respectively, as illustrated in FIG. 22A. Alternatively, the subpixel 110*a*, the subpixel 110*b*, the subpixel 110*c*, and the subpixel 110*d* can be red, green, blue, and infrared-light subpixels, respectively.

The subpixel 110*d* includes a light-emitting device. The light-emitting device includes a pixel electrode, an island-shaped fourth layer over the pixel electrode, the organic layer 114 over the island-shaped fourth layer, and the common electrode 113 over the organic layer 114. In the light-emitting device, the fourth layer and the organic layer 114 can be collectively referred to as an EL layer. The pixel electrode is formed using a material similar to that for the pixel electrode 111*a*, the pixel electrode 111*b*, and the pixel electrode 111*c*. The fourth layer is formed using a material similar to that for the first layer 123*a*, the second layer 123*b*, and the third layer 123*c*.

FIG. 21D illustrates an example in which one pixel 110 consists of two rows and three columns. The pixel 110 includes three subpixels (the subpixel 110*a*, the subpixel 110*b*, and the subpixel 110*c*) in the upper row (first row) and three subpixels 110*d* in the lower row (second row). In other words, the pixel 110 includes the subpixel 110*a* and the subpixel 110*d* in the left column (first column), the subpixel 110*b* and another subpixel 110*d* in the center column (second column), and the subpixel 110*c* and another subpixel 110*d* in the right column (third column). Matching the positions of the subpixels in the upper row and the lower row as illustrated in FIG. 21D enables dust and the like that would be produced in the manufacturing process to be removed efficiently. Accordingly, a display apparatus that has high display quality can be provided.

FIG. 21E illustrates an example in which one pixel 110 consists of two rows and three columns. The pixel 110 includes three subpixels (the subpixel 110*a*, the subpixel 110*b*, and the subpixel 110*c*) in the upper row (first row) and one subpixel (the subpixel 110*d*) in the lower row (second row). In other words, the pixel 110 includes the subpixel 110*a* in the left column (first column), the subpixel 110*b* in the center column (second column), the subpixel 110*c* in the right column (third column), and the subpixel 110*d* across these three columns.

In the pixel 110 in each of FIG. 21D and FIG. 21E, for example, the subpixel 110*a* can be the red subpixel R, the subpixel 110*b* can be the green subpixel G, the subpixel 110*c* can be the blue subpixel B, and the subpixel 110*d* can be a white subpixel W, as illustrated in FIG. 22B and FIG. 22C.

The display apparatus of one embodiment of the present invention may include a light-receiving device (also referred to as a light-receiving element) in the pixel.

Three of the four subpixels included in the pixel 110 in FIG. 21D or FIG. 21E may include a light-emitting device and the other one may include a light-receiving device.

For example, a pn or pin photodiode can be used as the light-receiving device. The light-receiving device functions as a photoelectric conversion device (also referred to as a photoelectric conversion element) that detects light entering the light-receiving device and generates electric charge. The amount of electric charge generated from the light-receiving device depends on the amount of light entering the light-receiving device.

It is particularly preferable to use an organic photodiode including a layer containing an organic compound, as the light-receiving device. An organic photodiode, which is easily made thin, lightweight, and large in area and has a high degree of freedom for shape and design, can be used in a variety of display apparatuses.

In one embodiment of the present invention, organic EL devices are used as the light-emitting devices, and organic photodiodes are used as the light-receiving devices. The organic EL device and the organic photodiode can be formed over the same substrate. Thus, the organic photodiodes can be incorporated in a display apparatus including the organic EL devices.

The light-receiving device includes at least an active layer that functions as a photoelectric conversion layer between a pair of electrodes. In this specification and the like, in some cases, one of the pair of electrodes is referred to as a pixel electrode and the other of the pair of electrodes is referred to as a common electrode.

For example, the subpixel 110*a*, the subpixel 110*b*, and the subpixel 110*c* may be subpixels for three colors of R, G, and B, and the subpixel 110*d* may be a subpixel including the light-receiving device. In that case, the fourth layer includes at least an active layer.

One of the pair of electrodes of the light-receiving device functions as an anode, and the other electrode functions as a cathode. The case where the pixel electrode functions as an anode and the common electrode functions as a cathode is described below as an example. When the light-receiving device is driven by application of reverse bias between the pixel electrode and the common electrode, light entering the light-receiving device can be sensed and charge can be generated and extracted as current. Alternatively, the pixel electrode may function as a cathode and the common electrode may function as an anode.

A manufacturing method similar to that of the light-emitting device can be employed for the light-receiving device. An island-shaped active layer (also referred to as a photoelectric conversion layer) included in the light-receiving device is formed by processing a film that is to be the active layer and formed on the entire surface, not by using a pattern of a metal mask; thus, the island-shaped active layer with a uniform thickness can be formed. In addition, a sacrificial layer provided over the active layer can reduce damage to the active layer in the manufacturing process of the display apparatus, increasing the reliability of the light-receiving device.

Here, a layer shared by the light-receiving device and the light-emitting device might have different functions in the light-emitting device and the light-receiving device. In this specification, the name of a component is based on its function in the light-emitting device in some cases. For example, a hole-injection layer functions as a hole-injection layer in the light-emitting device and functions as a hole-transport layer in the light-receiving device. Similarly, an electron-injection layer functions as an electron-injection layer in the light-emitting device and functions as an electron-transport layer in the light-receiving device. A layer shared by the light-receiving device and the light-emitting device might have the same function in both the light-emitting device and the light-receiving device. For example, the hole-transport layer functions as a hole-transport layer in both the light-emitting device and the light-receiving device, and the electron-transport layer functions as an electron-transport layer in both the light-emitting device and the light-receiving device.

The active layer included in the light-receiving device includes a semiconductor. Examples of the semiconductor include an inorganic semiconductor such as silicon and an organic semiconductor including an organic compound. This embodiment shows an example in which an organic semiconductor is used as the semiconductor contained in the active layer. The use of an organic semiconductor is preferable because the light-emitting layer and the active layer can be formed by the same method (e.g., a vacuum evaporation method) and thus the same manufacturing apparatus can be used.

Examples of an n-type semiconductor material included in the active layer are electron-accepting organic semiconductor materials such as fullerene (e.g., $C_{60}$ and $C_{70}$) and fullerene derivatives. Fullerene has a soccer ball-like shape, which is energetically stable. Both the HOMO level and the LUMO level of fullerene are deep (low). Having a deep LUMO level, fullerene has an extremely high electron-accepting property (acceptor property). When π-electron conjugation (resonance) spreads in a plane as in benzene, the electron-donating property (donor property) usually increases. Although I-electron conjugation widely spreads in fullerene having a spherical shape, its electron-accepting property is high. The high electron-accepting property efficiently causes rapid charge separation and is useful for the light-receiving element. Both $C_{60}$ and $C_{70}$ have a wide absorption band in the visible light region, and $C_{70}$ is especially preferable because of having a larger π-electron conjugation system and a wider absorption band in the long wavelength region than $C_{60}$. Other examples of fullerene derivatives include[6,6]-phenyl-$C_{71}$-butyric acid methyl ester (abbreviation: $PC_{70}BM$), [6,6]-phenyl-$C_{61}$-butyric acid methyl ester (abbreviation: $PC_{60}BM$), and 1',1",4',4"-tetrahydro-di[1,4]methanonaphthaleno[1,2:2',3',56,60:2", 3"][5,6]fullerene-$C_{60}$ (abbreviation: ICBA).

Other examples of an n-type semiconductor material include a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative, a benzoquinoline derivative, a quinoxaline derivative, a dibenzoquinoxaline derivative, a pyridine derivative, a bipyridine derivative, a pyrimidine derivative, a naphthalene derivative, an anthracene derivative, a coumarin derivative, a rhodamine derivative, a triazine derivative, and a quinone derivative.

Examples of a p-type semiconductor material contained in the active layer include electron-donating organic semiconductor materials such as copper(II) phthalocyanine (CuPc), tetraphenyldibenzoperiflanthene (DBP), zinc phthalocyanine (ZnPc), tin phthalocyanine (SnPc), and quinacridone.

Examples of a p-type semiconductor material include a carbazole derivative, a thiophene derivative, a furan derivative, and a compound having an aromatic amine skeleton. Other examples of the p-type semiconductor material include a naphthalene derivative, an anthracene derivative, a pyrene derivative, a triphenylene derivative, a fluorene derivative, a pyrrole derivative, a benzofuran derivative, a benzothiophene derivative, an indole derivative, a dibenzofuran derivative, a dibenzothiophene derivative, an indolocarbazole derivative, a porphyrin derivative, a phthalocyanine derivative, a naphthalocyanine derivative, a quinacridone derivative, a polyphenylene vinylene derivative, a polyparaphenylene derivative, a polyfluorene derivative, a polyvinylcarbazole derivative, and a polythiophene derivative.

The HOMO level of the electron-donating organic semiconductor material is preferably shallower (higher) than the HOMO level of the electron-accepting organic semiconductor material. The LUMO level of the electron-donating organic semiconductor material is preferably shallower (higher) than the LUMO level of the electron-accepting organic semiconductor material.

Fullerene having a spherical shape is preferably used as the electron-accepting organic semiconductor material, and an organic semiconductor material having a substantially planar shape is preferably used as the electron-donating organic semiconductor material. Molecules of similar shapes tend to aggregate, and aggregated molecules of similar kinds, which have molecular orbital energy levels close to each other, can increase the carrier-transport property.

For example, the active layer is preferably formed by co-evaporation of an n-type semiconductor and a p-type semiconductor. Alternatively, the active layer may be formed by stacking an n-type semiconductor and a p-type semiconductor.

In addition to the active layer, the light-receiving device may further include a layer containing any of a substance with a high hole-transport property, a substance with a high electron-transport property, a substance with a bipolar property (a substance with a high electron-transport property and a high hole-transport property), and the like. Without limitation to the above, the light-receiving device may further include a layer containing a substance with a high hole-injection property, a hole-blocking material, a material with a high electron-injection property, an electron-blocking material, or the like.

Either a low molecular compound or a high molecular compound can be used in the light-receiving device, and an inorganic compound may also be included. Each layer included in the light-receiving device can be formed by an evaporation method (including a vacuum evaporation method), a transfer method, a printing method, an inkjet method, a coating method, or the like.

As the hole-transport material or an electron-blocking material, a high molecular compound such as poly(3,4-ethylenedioxythiophene)/poly(styrenesulfonic acid) (PEDOT/PSS), or an inorganic compound such as a molybdenum oxide or copper iodide (CuI) can be used, for example. As the electron-transport material or the hole-blocking material, an inorganic compound such as zinc oxide (ZnO), or an organic compound such as polyethylenimine ethoxylate (PEIE) can be used. The light-receiving device may include a mixed film of PEIE and ZnO, for example.

For the active layer, a high molecular compound such as poly[4,8-bis[5-(2-ethylhexyl)-2-thienyl]benzo[1,2-b:4,5-b']dithiophene-2,6-diyl]-2,5-thiophenediyl[5,7-bis(2-ethylhexyl)-4,8-dioxo-4H,8H-benzo[1,2-c:4,5-c']dithiophene-1,3-diyl] polymer (abbreviation: PBDB-T) or a PBDB-T derivative, which functions as a donor, can be used. For example, a method in which an acceptor material is dispersed to PBDB-T or a PBDB-T derivative can be used.

The active layer may contain a mixture of three or more kinds of materials. For example, a third material may be mixed with an n-type semiconductor material and a p-type semiconductor material in order to extend the wavelength range. The third material may be a low molecular compound or a high molecular compound.

The display apparatus can sense the touch or approach of an object while displaying an image because the pixel included in the display apparatus includes the light-emitting device and the light-receiving device and thus has a light-receiving function. For example, all the subpixels included in the display apparatus can display an image; alternatively, some of the subpixels can emit light as a light source and the other subpixels can display an image.

In the display apparatus of one embodiment of the present invention, the light-emitting devices are arranged in a matrix in a display portion, and an image can be displayed on the display portion. Furthermore, the light-receiving devices are arranged in a matrix in the display portion, and the display portion has one or both of an image capturing function and a sensing function in addition to an image displaying function. The display portion can be used as an image sensor or a touch sensor. That is, by sensing light with the display portion, an image can be captured or an approach or touch of an object (e.g., a finger, a hand, or a pen) can be sensed. Furthermore, in the display apparatus of one embodiment of the present invention, the light-emitting devices can be used as a light source of the sensor. Accordingly, a light-receiving portion and a light source do not need to be provided separately from the display apparatus; hence, the number of components of an electronic device can be reduced.

In the display apparatus of one embodiment of the present invention, when an object reflects (or scatters) light emitted from the light-emitting device included in the display portion, the light-receiving device can sense reflected light (or scattered light); thus, image capturing or touch sensing is possible even in a dark place.

In the case where the light-receiving devices are used as the image sensor, the display apparatus can capture an image with use of the light-receiving devices. For example, the display apparatus of this embodiment can be used as a scanner.

For example, data on biological information such as a fingerprint or a palm print can be obtained with use of the image sensor. That is, a biometric authentication sensor can be incorporated in the display apparatus. When the display apparatus incorporates a biometric authentication sensor, the number of components of an electronic device can be reduced as compared to the case where a biometric authentication sensor is provided separately from the display apparatus; thus, the size and weight of the electronic device can be reduced.

In the case where the light-receiving devices are used as the touch sensor, the display apparatus can sense an approach or touch of an object with use of the light-receiving devices.

Figures 23A, 23B, 23C:
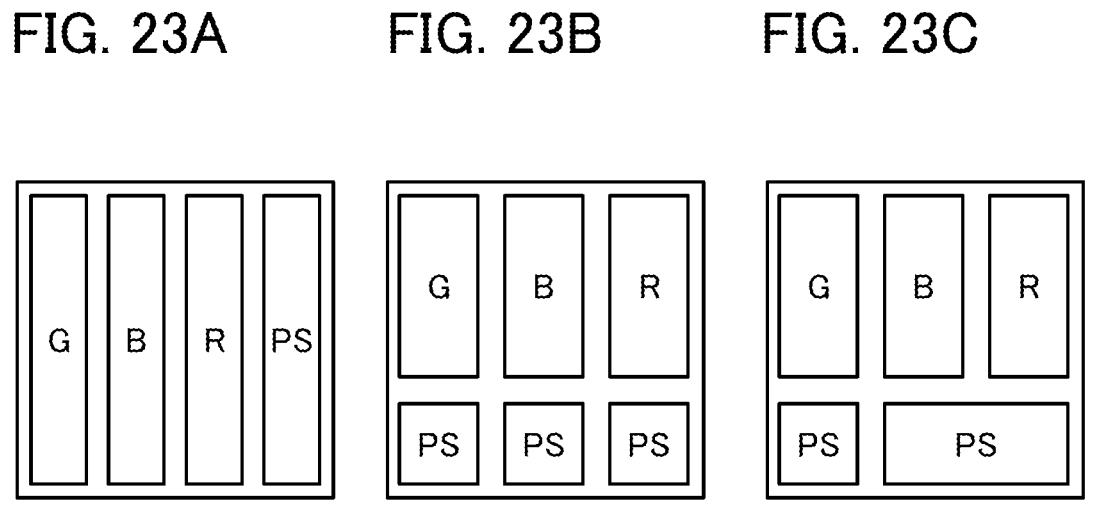

Pixels illustrated in FIG. 23A to FIG. 23C each include the subpixel G, the subpixel B, the subpixel R, and a subpixel PS.

The pixel illustrated in FIG. 23A employs stripe arrangement.

FIG. 23B and FIG. 23C illustrate an example in which one pixel is provided in two rows and three columns. Three subpixels (the subpixel G, the subpixel B, and the subpixel R) are provided in the upper row (first row). In FIG. 23B, three subpixels PS are provided in the lower row (second row). In FIG. 23C, two subpixels PS are provided in the lower row (second row). Matching the positions of the subpixels in the upper row and the lower row as illustrated in FIG. 23B enables dust and the like that would be produced in the manufacturing process to be removed efficiently. Accordingly, a display apparatus that has high display quality can be provided. Note that the layout of the subpixels is not limited to the structures illustrated in FIG. 23A to FIG. 23C.

The subpixel R includes a light-emitting device emitting red light, the subpixel G includes a light-emitting device emitting green light, and the subpixel B includes a light-emitting device emitting blue light. Alternatively, each of the subpixel R, the subpixel G, and the subpixel B includes a light-emitting device emitting white light. In the case where each of the subpixel R, the subpixel G, and the subpixel B includes a light-emitting device emitting white light, the respective coloring layers are provided over the light-emitting devices in the subpixel R, the subpixel G, and the subpixel B.

The subpixel PS includes the light-receiving device. The wavelength of light sensed by the subpixel PS is not particularly limited.

The light-receiving device included in the subpixel PS preferably senses visible light, and preferably senses one or more of blue light, violet light, bluish violet light, green light, yellowish green light, yellow light, orange light, red light, and the like. The light-receiving device included in the subpixel PS may sense infrared light.

Note that the structure illustrated in FIG. 23A and the like includes a light-emitting device and a light-receiving device in a pixel. In the display apparatus of one embodiment of the present invention, the pixel has a light-receiving function, so that the contact or approach of an object can be detected while an image is displayed. Moreover, the display apparatus of one embodiment of the present invention includes a subpixel emitting infrared light; thus, with the use of the subpixels included in the display apparatus, an image can be displayed while infrared light is emitted as a light source. In other words, the display apparatus of one embodiment of the present invention has a structure with high affinity for a function other than a display function (here, a light-receiving function).

Note that the light-receiving device included in the pixel illustrated in FIG. 23A and the like may be used for a touch sensor, a contactless sensor, or the like.

Here, a touch sensor or a contactless sensor can detect an approach or contact of an object (e.g., a finger, a hand, or a pen). The touch sensor can detect an object when the electronic device and the object come in direct contact with each other. The contactless sensor can detect an object even when the object is not in contact with the electronic device. For example, the display apparatus (or the electronic device) is preferably capable of detecting an object when the distance between the display apparatus and the object is greater than or equal to 0.1 mm and less than or equal to 300 mm, preferably greater than or equal to 3 mm and less than or equal to 50 mm. This structure enables the electronic device to be operated without direct contact of an object; in other words, the display apparatus can be operated in a contactless (touchless) manner. With the above-described structure, the electronic device can have a reduced risk of being dirty or damaged, or can be operated without the object directly touching a dirt (e.g., dust, or a virus) attached to the electronic device.

Note that the contactless sensor function can also be referred to as a hover sensor function, a hover touch sensor function, a near-touch sensor function, a touchless sensor function, or the like. The touch sensor function can also be referred to as a direct touch sensor function or the like.

The refresh rate of the display apparatus of one embodiment of the present invention can be variable. For example, the refresh rate is adjusted (adjusted in the range from 0.01 Hz to 240 Hz, for example) in accordance with contents displayed on the display apparatus, whereby power consumption can be reduced. Moreover, driving with a lowered refresh rate that reduces the power consumption of the display apparatus may be referred to as idling stop (IDS) driving.

The driving frequency of a touch sensor or a near-touch sensor may be changed in accordance with the refresh rate. In the case where the refresh rate of the display apparatus is 120 Hz, for example, the drive frequency of the touch sensor or the near touch sensor can be higher than 120 Hz (typically 240 Hz). With this structure, low power consumption can be achieved, and the response speed of the touch sensor or the near touch sensor can be increased.

This embodiment can be combined with any of the other embodiments as appropriate.

Embodiment 4

The display apparatus described in Embodiments above may include a light-receiving element. In this embodiment, a display apparatus including a light-emitting element and a light-receiving element (also referred to as a light-emitting and light-receiving apparatus) is described.

A light-emitting and light-receiving portion of the light-emitting and light-receiving apparatus of one embodiment of the present invention includes light-receiving elements (also referred to as light-receiving devices) and light-emitting elements (also referred to as light-emitting devices). The light-emitting and light-receiving portion has a function of displaying an image with the use of the light-emitting elements. Furthermore, the light-emitting and light-receiving portion has one or both of a function of capturing an image with the use of the light-receiving elements and a sensing function. Thus, the light-emitting and light-receiving apparatus of one embodiment of the present invention can be expressed as a display apparatus, and the light-emitting and light-receiving portion can be expressed as a display portion.

Alternatively, the light-emitting and light-receiving apparatus of one embodiment of the present invention may have a structure including light-emitting and light-receiving elements (also referred to as light-emitting and light-receiving devices) and light-emitting elements.

First, a light-emitting and light-receiving apparatus including light-receiving elements and light-emitting elements is described.

The light-emitting and light-receiving apparatus of one embodiment of the present invention includes a light-receiving element and a light-emitting element in a light-emitting and light-receiving portion. In the light-emitting and light-receiving apparatus of one embodiment of the present invention, the light-emitting elements are arranged in a matrix in the light-emitting and light-receiving portion, and an image can be displayed on the light-emitting and light-receiving portion. Furthermore, the light-receiving elements are arranged in a matrix in the light-emitting and light-receiving portion, and the light-emitting and light-receiving portion has one or both of an image capturing function and a sensing function. The light-emitting and light-receiving portion can be used as an image sensor, a touch sensor, or the like. That is, by detecting light with the light-emitting and light-receiving portion, an image can be captured and touch operation of an object (e.g., a finger or a stylus) can be detected. Furthermore, in the light-emitting and light-receiving apparatus of one embodiment of the present invention, the light-emitting elements can be used as a light source of the sensor. Accordingly, a light-receiving portion and a light source do not need to be provided separately from the light-emitting and light-receiving apparatus; hence, the number of components of an electronic device can be reduced.

In the light-emitting and light-receiving apparatus of one embodiment of the present invention, when an object reflects (or scatters) light emitted from the light-emitting element included in the light-emitting and light-receiving portion, the light-receiving element can detect the reflected light (or the scattered light); thus, image capturing, touch operation detection, or the like is possible even in a dark place.

The light-emitting element included in the light-emitting and light-receiving apparatus of one embodiment of the present invention functions as a display element (also referred to as a display device).

As the light-emitting element, an EL element (also referred to as an EL device) such as an OLED or a QLED is preferably used. Examples of a light-emitting substance contained in the EL element include a substance emitting fluorescent light (a fluorescent material), a substance emitting phosphorescent light (a phosphorescent material), an inorganic compound (such as a quantum dot material), and a substance exhibiting thermally activated delayed fluorescence (a thermally activated delayed fluorescent (TADF) material). An LED such as a micro LED can also be used as the light-emitting element.

The light-emitting and light-receiving apparatus of one embodiment of the present invention has a function of detecting light with the use of a light-receiving element.

When the light-receiving elements are used as an image sensor, the light-emitting and light-receiving apparatus can capture an image using the light-receiving elements. For example, the light-emitting and light-receiving apparatus can be used as a scanner.

An electronic device including the light-emitting and light-receiving apparatus of one embodiment of the present invention can obtain data related to biological information such as a fingerprint or a palm print by using a function of an image sensor. That is, a biometric authentication sensor can be incorporated in the light-emitting and light-receiving apparatus. When the light-emitting and light-receiving apparatus incorporates a biometric authentication sensor, the number of components of an electronic device can be reduced as compared to the case where a biometric authentication sensor is provided separately from the light-emitting and light-receiving apparatus; thus, the size and weight of the electronic device can be reduced.

When the light-receiving elements are used as the touch sensor, the light-emitting and light-receiving apparatus can detect touch operation of an object with the use of the light-receiving elements.

For the components and the like of the light-receiving element, description of components and the like of the light-receiving device described in Embodiment 3 can be referred to.

In one embodiment of the present invention, organic EL elements (also referred to as organic EL devices) are used as the light-emitting elements, and organic photodiodes are used as the light-receiving elements. The organic EL elements and the organic photodiodes can be formed over one substrate. Thus, the organic photodiodes can be incorporated in the display apparatus including the organic EL elements.

In the case where all the layers of the organic EL elements and the organic photodiodes are formed separately, the number of deposition steps becomes extremely large. However, a large number of layers of the organic photodiodes can have a structure in common with the organic EL elements; thus, concurrently depositing the layers that can have a common structure can inhibit an increase in the number of deposition steps.

For example, one of a pair of electrodes (a common electrode) can be a layer shared by the light-receiving element and the light-emitting element. For example, at least one of a hole-injection layer, a hole-transport layer, an electron-transport layer, and an electron-injection layer may be a layer shared by the light-receiving element and the light-emitting element. When the light-receiving element and the light-emitting element include common layers in such a manner, the number of deposition steps and the number of masks can be reduced, whereby the number of manufacturing steps and the manufacturing cost of the light-emitting and light-receiving apparatus can be reduced. Furthermore, the light-emitting and light-receiving apparatus including the light-receiving element can be manufactured using an existing manufacturing apparatus and an existing manufacturing method for the display apparatus.

Next, a light-emitting and light-receiving apparatus including light-emitting and light-receiving elements and light-emitting elements is described. Note that functions, behavior, effects, and the like similar to those in the above are not described in some cases.

In the light-emitting and light-receiving apparatus of one embodiment of the present invention, a subpixel exhibiting any color includes a light-emitting and light-receiving element instead of a light-emitting element, and subpixels exhibiting the other colors each include a light-emitting element. The light-emitting and light-receiving element has both a function of emitting light (a light-emitting function) and a function of receiving light (a light-receiving function). For example, in the case where a pixel includes three subpixels of a red subpixel, a green subpixel, and a blue subpixel, at least one of the subpixels includes a light-emitting and light-receiving element, and the other subpixels each include a light-emitting element. Thus, the light-emitting and light-receiving portion of the light-emitting and light-receiving apparatus of one embodiment of the present invention has a function of displaying an image using both light-emitting and light-receiving elements and light-emitting elements.

The light-emitting and light-receiving element functions as both a light-emitting element and a light-receiving element, whereby the pixel can have a light-receiving function without an increase in the number of subpixels included in the pixel. Thus, the light-emitting and light-receiving portion of the light-emitting and light-receiving apparatus can be provided with one or both of an image capturing function and a sensing function while keeping the aperture ratio of the pixel (aperture ratio of each subpixel) and the definition of the light-emitting and light-receiving apparatus. Accordingly, in the light-emitting and light-receiving apparatus of one embodiment of the present invention, the aperture ratio of the pixel can be more increased and the definition can be increased more easily than in a light-emitting and light-receiving apparatus provided with a subpixel including a light-receiving element separately from a subpixel including a light-emitting element.

In the light-emitting and light-receiving portion of the light-emitting and light-receiving apparatus of one embodiment of the present invention, the light-emitting and light-receiving elements and the light-emitting elements are arranged in a matrix, and an image can be displayed on the light-emitting and light-receiving portion. The light-emitting and light-receiving portion can be used as an image sensor, a touch sensor, or the like. In the light-emitting and light-receiving apparatus of one embodiment of the present invention, the light-emitting elements can be used as a light source of the sensor. Thus, image capturing, touch operation detection, or the like is possible even in a dark place.

The light-emitting and light-receiving element can be manufactured by combining an organic EL element and an organic photodiode. For example, by adding an active layer of an organic photodiode to a stacked-layer structure of an organic EL element, the light-emitting and light-receiving element can be manufactured. Furthermore, in the light-emitting and light-receiving element formed of a combination of an organic EL element and an organic photodiode, concurrently depositing layers that can be shared with the organic EL element can inhibit an increase in the number of deposition steps.

For example, one of a pair of electrodes (a common electrode) can be a layer shared by the light-emitting and light-receiving element and the light-emitting element. For example, at least one of a hole-injection layer, a hole-transport layer, an electron-transport layer, and an electron-injection layer may be a layer shared by the light-emitting and light-receiving element and the light-emitting element.

Note that a layer included in the light-emitting and light-receiving element might have a different function between the case where the light-emitting and light-receiving element functions as a light-receiving element and the case where the light-emitting and light-receiving element functions as a light-emitting element. In this specification, the name of a component is based on its function in the case where the light-emitting and light-receiving element functions as a light-emitting element.

The light-emitting and light-receiving apparatus of this embodiment has a function of displaying an image with the use of the light-emitting elements and the light-emitting and light-receiving elements. That is, the light-emitting elements and the light-emitting and light-receiving elements function as display elements.

The light-emitting and light-receiving apparatus of this embodiment has a function of detecting light with the use of the light-emitting and light-receiving elements. The light-emitting and light-receiving element can detect light having a shorter wavelength than light emitted from the light-emitting and light-receiving element itself.

When the light-emitting and light-receiving elements are used as an image sensor, the light-emitting and light-receiving apparatus of this embodiment can capture an image using the light-emitting and light-receiving elements. When the light-emitting and light-receiving elements are used as a touch sensor, the light-emitting and light-receiving apparatus of this embodiment can detect touch operation of an object with the use of the light-emitting and light-receiving elements.

The light-emitting and light-receiving element functions as a photoelectric conversion element. The light-emitting and light-receiving element can be manufactured by adding an active layer of the light-receiving element to the above-described structure of the light-emitting element. For the light-emitting and light-receiving element, an active layer of a pn photodiode or a pin photodiode can be used, for example.

It is particularly preferable to use an active layer of an organic photodiode including a layer containing an organic compound as the light-receiving element. An organic photodiode, which is easily made thin, lightweight, and large in area and has a high degree of freedom for shape and design, can be used in a variety of devices.

The display apparatus that is an example of the light-emitting and light-receiving apparatus of one embodiment of the present invention is specifically described below with reference to drawings.

Structure Example of Display Apparatus

Structure Example 1

Figure 24A:
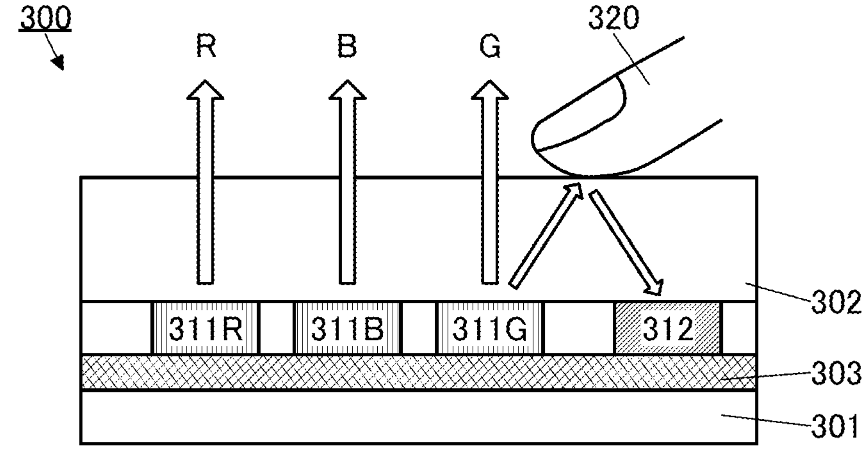
FIG. 24A, FIG. 24B, and FIG. 24D are cross-sectional views illustrating an example of a display apparatus.

FIG. 24A is a schematic view of a display panel 300. The display panel 300 includes a substrate 301, a substrate 302, a light-receiving element 312, a light-emitting element 311R, a light-emitting element 311G, a light-emitting element 311B, a functional layer 303, and the like.

The light-emitting element 311R, the light-emitting element 311G, the light-emitting element 311B, and the light-receiving element 312 are provided between the substrate 301 and the substrate 302. The light-emitting element 311R, the light-emitting element 311G, and the light-emitting element 311B emit red (R) light, green (G) light, and blue (B) light, respectively. Note that in the following description, the term "light-emitting element 311" may be used when the light-emitting element 311R, the light-emitting element 311G, and the light-emitting element 311B are not distinguished from each other.

The display panel 300 includes a plurality of pixels arranged in a matrix. One pixel includes one or more subpixels. One subpixel includes one light-emitting element. For example, the pixel can have a structure including three subpixels (e.g., three colors of R, G, and B or three colors of yellow (Y), cyan (C), and magenta (M)) or four subpixels (e.g., four colors of R, G, B, and white (W) or four colors of R, G, B, and Y). The pixel further includes the light-receiving element 312. The light-receiving element 312 may be provided in all the pixels or may be provided in some of the pixels. In addition, one pixel may include a plurality of light-receiving elements 312.

FIG. 24A illustrates a finger 320 touching a surface of the substrate 302. Part of light emitted from the light-emitting element 311G is reflected at a contact portion of the substrate 302 and the finger 320. In the case where part of the reflected light is incident on the light-receiving element 312, the contact of the finger 320 with the substrate 302 can be detected. That is, the display panel 300 can function as a touch panel.

The functional layer 303 includes a circuit for driving the light-emitting element 311R, the light-emitting element 311G, and the light-emitting element 311B and a circuit for driving the light-receiving element 312. The functional layer 303 is provided with a switch, a transistor, a capacitor, a wiring, and the like. Note that in the case where the light-emitting element 311R, the light-emitting element 311G, the light-emitting element 311B, and the light-receiving element 312 are driven by a passive-matrix method, a structure not provided with a switch, a transistor, or the like may be employed.

Figure 24B:
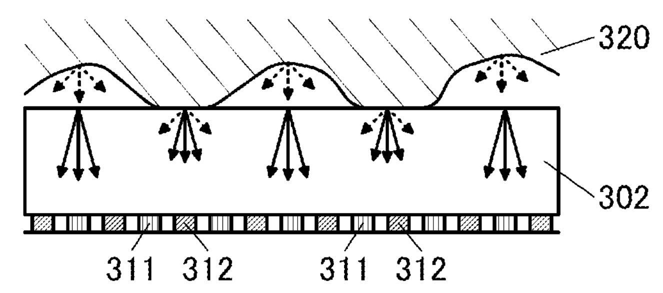

The display panel 300 preferably has a function of detecting a fingerprint of the finger 320. FIG. 24B schematically illustrates an enlarged view of the contact portion in a state where the finger 320 touches the substrate 302. FIG. 24B illustrates light-emitting elements 311 and the light-receiving elements 312 that are alternately arranged.

The fingerprint of the finger 320 is formed of depressions and projections. Therefore, as illustrated in FIG. 24B, the projections of the fingerprint touch the substrate 302.

Reflection of light from a surface, an interface, or the like is categorized into regular reflection and diffuse reflection. Regularly reflected light is highly directional light with an angle of reflection equal to the angle of incidence. Diffusely reflected light has low directionality and low angular dependence of intensity. As for regular reflection and diffuse reflection, diffuse reflection components are dominant in the light reflected from the surface of the finger 320. Meanwhile, regular reflection components are dominant in the light reflected from the interface between the substrate 302 and the air.

The intensity of light that is reflected from contact surfaces or non-contact surfaces between the finger 320 and the substrate 302 and is incident on the light-receiving elements 312 positioned directly below the contact surfaces or the non-contact surfaces is the sum of intensities of regularly reflected light and diffusely reflected light. As described above, regularly reflected light (indicated by solid arrows) is dominant near the depressions of the finger 320, where the finger 320 is not in contact with the substrate 302; whereas diffusely reflected light (indicated by dashed arrows) from the finger 320 is dominant near the projections of the finger 320, where the finger 320 is in contact with the substrate 302. Thus, the intensity of light received by the light-receiving element 312 positioned directly below the depression is higher than the intensity of light received by the light-receiving element 312 positioned directly below the projection. Accordingly, a fingerprint image of the finger 320 can be captured.

In the case where an arrangement interval between the light-receiving elements 312 is smaller than a distance between two projections of a fingerprint, preferably a distance between a depression and a projection adjacent to each other, a clear fingerprint image can be obtained. The distance between a depression and a projection of a human's fingerprint is approximately 200 μm; thus, the arrangement interval between the light-receiving elements 312 is, for example, less than or equal to 400 μm, preferably less than or equal to 200 μm, further preferably less than or equal to 150 μm, still further preferably less than or equal to 100 μm, even still further preferably less than or equal to 50 μm and greater than or equal to 1 μm, preferably greater than or equal to 10 μm, further preferably greater than or equal to 20 μm.

Figure 24C:
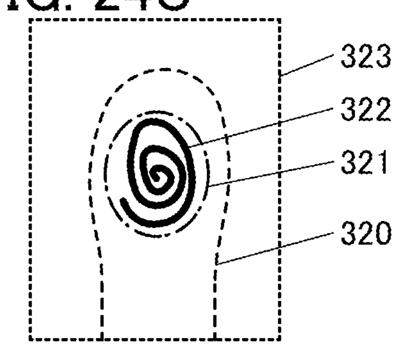
FIG. 24C and FIG. 24E are diagrams illustrating examples of an image.

FIG. 24C illustrates an example of a fingerprint image captured by the display panel 300. In an image-capturing range 323 in FIG. 24C, the outline of the finger 320 is indicated by a dashed line and the outline of a contact portion 321 is indicated by a dashed-dotted line. In the contact portion 321, a high-contrast image of a fingerprint 322 can be captured owing to a difference in the amount of light incident on the light-receiving elements 312.

Figure 24D:
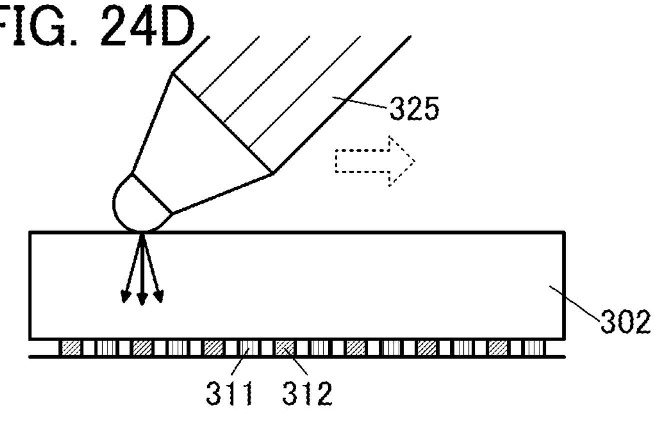

The display panel 300 can also function as a touch panel or a pen tablet. FIG. 24D illustrates a state where a tip of a stylus 325 slides in a direction indicated with a dashed arrow while the tip of the stylus 325 touches the substrate 302.

As illustrated in FIG. 24D, when diffusely reflected light that is diffused at the contact surface of the tip of the stylus 325 and the substrate 302 is incident on the light-receiving element 312 that overlaps with the contact surface, the position of the tip of the stylus 325 can be detected with high accuracy.

Figure 24E:
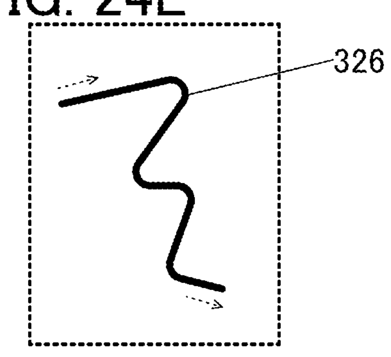

FIG. 24E illustrates an example of a path 326 of the stylus 325 that is detected by the display panel 300. The display panel 300 can detect the position of a detection target, such as the stylus 325, with high position accuracy, so that high-definition drawing can be performed using a drawing application or the like. Unlike the case of using a capacitive touch sensor, an electromagnetic induction touch pen, or the like, the display panel 300 can detect even the position of a highly insulating object to be detected, the material of a tip portion of the stylus 325 is not limited, and a variety of writing materials (e.g., a brush, a glass pen, a quill pen, and the like) can be used.

Figure 24F:
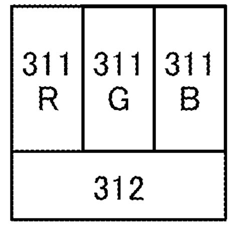
FIG. 24F and FIG. 24G are top views illustrating examples of a pixel.
Figure 24G:
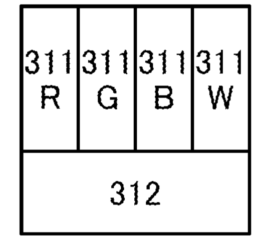

Here, FIG. 24F to FIG. 24G illustrate examples of a pixel that can be used in the display panel 300.

The pixel illustrated in FIG. 24F includes the light-emitting element 311R for red (R), the light-emitting element 311G for green (G), the light-emitting element 311B for blue (B), and the light-receiving element 312. The pixels each include a pixel circuit for driving the light-emitting element 311R, the light-emitting element 311G, the light-emitting element 311B, and the light-receiving element 312.

FIG. 24F illustrates an example in which three light-emitting elements are arranged in one line and one laterally long light-receiving element 312 is provided below the three light-emitting elements.

The pixel illustrated in FIG. 24G is an example including a light-emitting element 311W for white (W). Here, four light-emitting elements are arranged in one line and the light-receiving element 312 is provided below the four light-emitting elements.

Note that the pixel structure is not limited to the above structure, and a variety of arrangement methods can be employed.

Structure Example 2

An example of a structure including light-emitting elements emitting visible light, a light-emitting element emitting infrared light, and a light-receiving element is described below.

A display panel 300A illustrated in FIG. 25A includes a light-emitting element 311R in addition to the components illustrated in FIG. 24A as an example. The light-emitting element 311R is a light-emitting element emitting infrared light IR. Moreover, in that case, an element capable of receiving at least the infrared light IR emitted from the light-emitting element 311R is preferably used as the light-receiving element 312. As the light-receiving element 312, an element capable of receiving visible light and infrared light is further preferably used.

As illustrated in FIG. 25A, when the finger 320 touches the substrate 302, the infrared light IR emitted from the light-emitting element 311R is reflected by the finger 320 and part of reflected light is incident on the light-receiving element 312, so that the positional information of the finger 320 can be obtained.

FIG. 25B and FIG. 25C illustrate examples of a pixel that can be used in the display panel 300A.

FIG. 25B illustrates an example in which three light-emitting elements are arranged in one line and the light-emitting element 311R and the light-receiving element 312 are arranged below the three light-emitting elements in a horizontal direction. FIG. 25C illustrates an example in which four light-emitting elements including the light-emitting element 311R are arranged in one line and the light-receiving element 312 is provided below the four light-emitting elements.

Note that in the pixels illustrated in FIG. 25B and FIG. 25C, the positions of the light-emitting elements can be interchangeable, or the positions of the light-emitting element and the light-receiving element can be interchangeable.

Structure Example 3

An example of a structure including a light-emitting element emitting visible light and a light-emitting and light-receiving element emitting and receiving visible light is described below.

A display panel 300B illustrated in FIG. 25D includes the light-emitting element 311B, the light-emitting element 311G, and a light-emitting and light-receiving element 313R. The light-emitting and light-receiving element 313R has a function of a light-emitting element that emits red (R) light, and a function of a photoelectric conversion element that receives visible light. FIG. 25D illustrates an example in which the light-emitting and light-receiving element 313R receives green (G) light emitted from the light-emitting element 311G. Note that the light-emitting and light-receiving element 313R may receive blue (B) light emitted from the light-emitting element 311B. Alternatively, the light-emitting and light-receiving element 313R may receive both green light and blue light.

For example, the light-emitting and light-receiving element 313R preferably receives light having a shorter wavelength than light emitted from itself. Alternatively, the light-emitting and light-receiving element 313R may receive light (e.g., infrared light) having a longer wavelength than light emitted from itself. The light-emitting and light-receiving element 313R may receive light having approximately the same wavelength as light emitted from itself; however, in that case, the light-emitting and light-receiving element 313R also receives light emitted from itself, whereby its emission efficiency might be decreased. Therefore, the peak of the emission spectrum and the peak of the absorption spectrum of the light-emitting and light-receiving element 313R preferably overlap as little as possible.

Here, light emitted from the light-emitting and light-receiving element is not limited to red light. Furthermore, the light emitted from the light-emitting elements is not limited to the combination of green light and blue light. For example, the light-emitting and light-receiving element can be an element that emits green or blue light and receives light having a different wavelength from light emitted from itself.

The light-emitting and light-receiving element 313R serves as both a light-emitting element and a light-receiving element as described above, whereby the number of elements provided in one pixel can be reduced. Thus, higher definition, a higher aperture ratio, higher resolution, and the like can be easily achieved.

FIG. 25E and FIG. 25F illustrate examples of a pixel that can be used in the display panel 300B.

FIG. 25E illustrates an example in which the light-emitting and light-receiving element 313R, the light-emitting element 311G, and the light-emitting element 311B are arranged in one column. FIG. 25F illustrates an example in which the light-emitting element 311G and the light-emitting element 311B are alternately arranged in the vertical direction and the light-emitting and light-receiving element 313R is provided alongside the light-emitting elements.

The top surface shape of the light-emitting elements and the light-emitting and light-receiving elements is not particularly limited and can be a circular shape, an elliptical shape, a polygonal shape, a polygonal shape with rounded corners, or the like. The top surface shape of the light-emitting elements and the light-emitting and light-receiving elements may vary depending on the color thereof, or the light-emitting elements and the light-emitting and light-receiving elements of some colors or every color may have the same top surface shape. The sizes of light-emitting regions (or light-emitting and light-receiving regions) of the light-emitting elements and the light-emitting and light-receiving elements may vary depending on the color thereof, or the light-emitting elements and the light-emitting and light-receiving elements of some colors or every color may have light-emitting regions of the same size.

In the case where touch operation is detected with the light-emitting and light-receiving elements, for example, it is preferable that light emitted from a light source be hard for a user to recognize. Since blue light has lower visibility than green light, light-emitting elements that emit blue light are preferably used as a light source. Accordingly, the light-emitting and light-receiving elements preferably have a function of receiving blue light. Note that without limitation to the above, light-emitting elements used as a light source can be selected as appropriate depending on the sensitivity of the light-emitting and light-receiving elements.

As described above, the display apparatus of this embodiment can employ any of various types of pixel arrangements.

At least part of this embodiment can be implemented as appropriate in combination with any of the other embodiments described in this specification.

Embodiment 5

In this embodiment, a light-emitting device (also referred to as a light-emitting element) and a light-receiving device (also referred to as a light-receiving element) that can be used in a light-emitting and light-receiving apparatus of one embodiment of the present invention will be described.

Light-Emitting Device

Figures 26A, 26B, 26C, 26D, 26E, 26F:
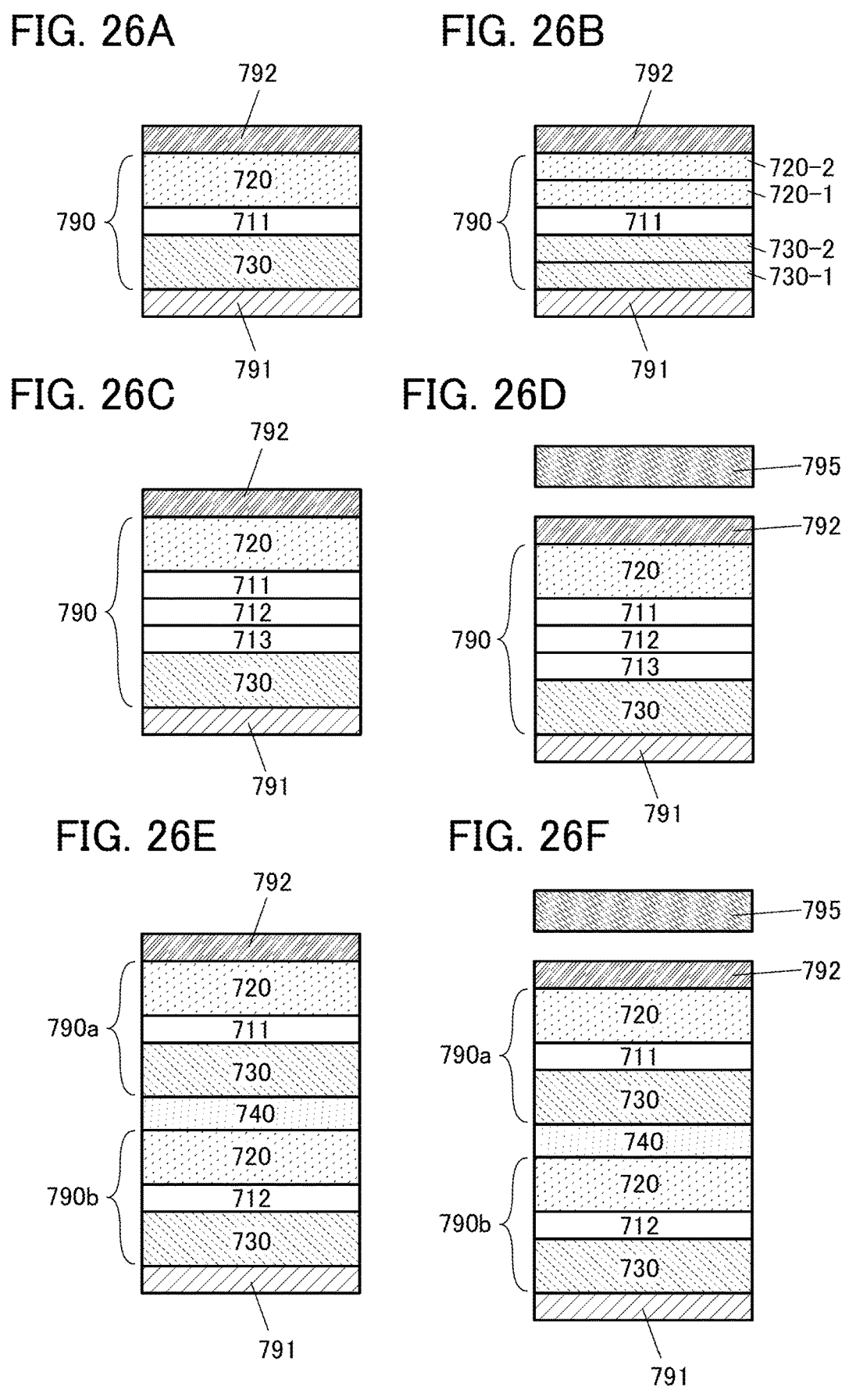

As illustrated in FIG. 26A, the light-emitting device includes an EL layer 790 between a pair of electrodes (a lower electrode 791 and an upper electrode 792). The EL layer 790 can be formed of a plurality of layers such as a layer 720, a light-emitting layer 711, and a layer 730. The layer 720 can include, for example, a layer containing a substance with a high electron-injection property (an electron-injection layer) and a layer containing a substance with a high electron-transport property (an electron-transport layer). The light-emitting layer 711 contains a light-emitting compound, for example. The layer 730 can include, for example, a layer containing a substance with a high hole-injection property (a hole-injection layer) and a layer containing a substance with a high hole-transport property (a hole-transport layer).

The structure including the layer 720, the light-emitting layer 711, and the layer 730, which is provided between a pair of electrodes, can function as a single light-emitting unit, and the structure in FIG. 26A is referred to as a single structure in this specification.

FIG. 26B is a modification example of the EL layer 790 included in the light-emitting device illustrated in FIG. 26A. Specifically, the light-emitting device illustrated in FIG. 26B includes a layer 730-1 over the lower electrode 791, a layer 730-2 over the layer 730-1, the light-emitting layer 711 over the layer 730-2, a layer 720-1 over the light-emitting layer 711, a layer 720-2 over the layer 720-1, and the upper electrode 792 over the layer 720-2. For example, when the lower electrode 791 is an anode and the upper electrode 792 is a cathode, the layer 730-1 functions as a hole-injection layer, the layer 730-2 functions as a hole-transport layer, the layer 720-1 functions as an electron-transport layer, and the layer 720-2 functions as an electron-injection layer. Alternatively, when the lower electrode 791 is a cathode and the upper electrode 792 is an anode, the layer 730-1 functions as an electron-injection layer, the layer 730-2 functions as an electron-transport layer, the layer 720-1 functions as a hole-transport layer, and the layer 720-2 functions as a hole-injection layer. With such a layered structure, carriers can be efficiently injected to the light-emitting layer 711, and the efficiency of the recombination of carriers in the light-emitting layer 711 can be enhanced.

Note that structures in which a plurality of light-emitting layers (light-emitting layers 711, 712, and 713) are provided between the layer 720 and the layer 730 as illustrated in FIG. 26C and FIG. 26D are variations of the single structure.

Structures in which a plurality of light-emitting units (EL layer 790*a* and EL layer 790*b*) are connected in series with an intermediate layer 740 therebetween as illustrated in FIG. 26E and FIG. 26F are referred to as a tandem structure in this specification. Note that the intermediate layer 740 is referred to as a charge-generation layer in some cases. In this specification and the like, the structures illustrated in FIG. 26E and FIG. 26F are referred to as a tandem structure; however, without being limited to this, a tandem structure may be referred to as a stack structure, for example. The tandem structure enables a light-emitting device capable of high-luminance light emission.

In FIG. 26C, light-emitting materials that emit the same light may be used for the light-emitting layer 711, the light-emitting layer 712, and the light-emitting layer 713.

Alternatively, different light-emitting materials may be used for the light-emitting layer 711, the light-emitting layer 712, and the light-emitting layer 713. White light can be obtained in the case where the light-emitting layer 711, the light-emitting layer 712, and the light-emitting layer 713 emit light of complementary colors. FIG. 26D illustrates an example in which a coloring layer 795 functioning as a color filter is provided. When white light passes through a color filter, light of a desired color can be obtained.

In FIG. 26E, the same light-emitting material may be used for the light-emitting layer 711 and the light-emitting layer

712. Alternatively, light-emitting materials that emit light of different colors may be used for the light-emitting layer 711 and the light-emitting layer 712. White light can be obtained when the light-emitting layer 711 and the light-emitting layer 712 emit light of complementary colors. FIG. 26F illustrates an example in which the coloring layer 795 is further provided.

In FIG. 26C, FIG. 26D, FIG. 26E, and FIG. 26F, the layer 720 and the layer 730 may each have a layered structure of two or more layers as illustrated in FIG. 26B.

In FIG. 26D, the same light-emitting material may be used for the light-emitting layer 711, the light-emitting layer 712, and the light-emitting layer 713. Similarly, in FIG. 26F, the same light-emitting material may be used for the light-emitting layer 711 and the light-emitting layer 712. In that case, by using a color conversion layer instead of the coloring layer 795, light of a desired color different from the emission color of the light-emitting material can be obtained. For example, a blue-light-emitting material is used for each light-emitting layer and blue light passes through the color conversion layer, whereby light with a wavelength longer than that of blue light (e.g., red light or green light) can be obtained. For the color conversion layer, a fluorescent material, a phosphorescent material, quantum dots, or the like can be used.

The emission color of the light-emitting device can be red, green, blue, cyan, magenta, yellow, white, or the like depending on the material of the EL layer 790. Furthermore, the color purity can be further increased when the light-emitting device has a microcavity structure.

The light-emitting device that emits white light preferably contains two or more kinds of light-emitting substances in the light-emitting layer. To obtain white light emission, two or more kinds of light-emitting substances are selected such that their emission colors are complementary. For example, when emission colors of a first light-emitting layer and a second light-emitting layer are complementary colors, the light-emitting device as a whole can be configured to emit white light. The same applies to a light-emitting device including three or more light-emitting layers.

The light-emitting layer preferably contains two or more selected from light-emitting substances that emit light of red (R), green (G), blue (B), yellow (Y), orange (O), and the like. Alternatively, the light-emitting layer preferably contains two or more light-emitting substances that emit light containing two or more of spectral components of R, G, and B.

Light-Receiving Device

Figure 27A:
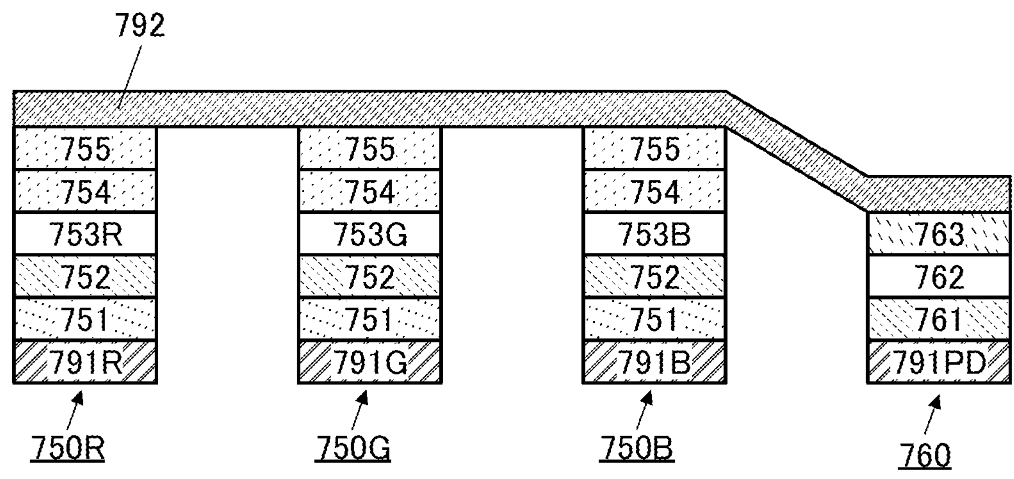
FIG. 27A and FIG. 27B are diagrams illustrating structure examples of light-emitting devices and a light-receiving device.

FIG. 27A is a schematic cross-sectional view of a light-emitting device 750R, a light-emitting device 750G, a light-emitting device 750B, and a light-receiving device 760. The light-emitting device 750R, the light-emitting device 750G, the light-emitting device 750B, and the light-receiving device 760 share an upper electrode 792.

The light-emitting device 750R includes a pixel electrode 791R, a layer 751, a layer 752, a light-emitting layer 753R, a layer 754, a layer 755, and the upper electrode 792. The light-emitting device 750G includes the pixel electrode 791G and a light-emitting layer 753G. The light-emitting device 750B includes the pixel electrode 791B and a light-emitting layer 753B.

The layer 751 includes, for example, a layer containing a substance with a high hole-injection property (a hole-injection layer). The layer 752 includes, for example, a layer containing a substance with a high hole-transport property (a hole-transport layer). The layer 754 includes, for example, a layer containing a substance with a high electron-transport property (an electron-transport layer). The layer 755 includes, for example, a layer containing a substance with a high electron-injection property (an electron-injection layer).

Alternatively, the layer 751 may include an electron-injection layer, the layer 752 may include an electron-transport layer, the layer 754 may include a hole-transport layer, and the layer 755 may include a hole-injection layer.

FIG. 27A illustrates the layer 751 and the layer 752 separately; however, one embodiment of the present invention is not limited thereto. For example, the layer 752 may be omitted when the layer 751 has functions of both a hole-injection layer and a hole-transport layer or the layer 751 has functions of both an electron-injection layer and an electron-transport layer.

Note that the light-emitting layer 753R included in the light-emitting device 750R contains a light-emitting substance that emits red light, the light-emitting layer 753G included in the light-emitting device 750G contains a light-emitting substance that emits green light, and the light-emitting layer 753B included in the light-emitting device 750B contains a light-emitting substance that emits blue light. Note that the light-emitting device 750G and the light-emitting device 750B have a structure in which the light-emitting layer 753R included in the light-emitting device 750R is replaced with the light-emitting layer 753G and the light-emitting layer 753B, respectively, and the other components are similar to those of the light-emitting device 750R.

The structure (e.g., material and thickness) of the layer 751, the layer 752, the layer 754, and the layer 755 may be the same or different from each other among the light-emitting devices of different colors.

The light-receiving device 760 includes a pixel electrode 791PD, a layer 761, a layer 762, a layer 763, and the upper electrode 792. The light-receiving device 760 can be configured not to include a hole-injection layer or an electron-injection layer.

The layer 762 includes an active layer (also referred to as a photoelectric conversion layer). The layer 762 has a function of absorbing light in a specific wavelength range and generating carriers (electrons and holes).

The layer 761 and the layer 763 each include, for example, a hole-transport layer or an electron-transport layer. In the case where the layer 761 includes a hole-transport layer, the layer 763 includes an electron-transport layer. In the case where the layer 761 includes an electron-transport layer, the layer 763 includes a hole-transport layer.

In the light-receiving device 760, the pixel electrode 791PD may be an anode and the upper electrode 792 may be a cathode, or the pixel electrode 791PD may be a cathode and the upper electrode 792 may be an anode.

Figure 27B:
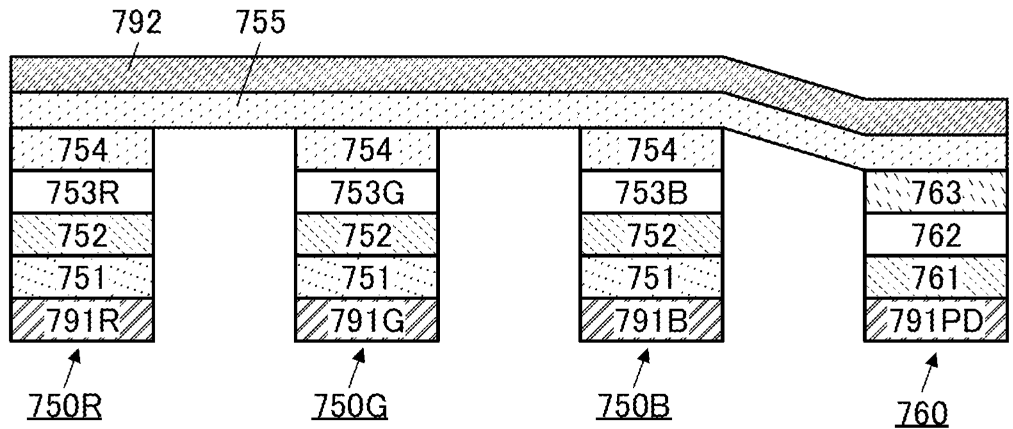

FIG. 27B is a modification example of FIG. 27A. FIG. 27B illustrates an example in which the light-emitting devices and the light-receiving device share the layer 755 as well as the upper electrode 792. In this case, the layer 755 can be referred to as a common layer. The light-emitting devices and the light-receiving device share one or more common layers in this manner, whereby the manufacturing process can be simplified, resulting in reduced manufacturing cost.

Here, the layer 755 functions as an electron-injection layer or a hole-injection layer of the light-emitting device 750. In this case, the layer 755 functions as an electron-transport layer or a hole-transport layer of the light-receiving device 760. Thus, the light-receiving device 760 illustrated in FIG. 27B is not necessarily provided with the layer 763 functioning as an electron-transport layer or a hole-transport layer.

The above is the description of the light-receiving device.

At least part of this embodiment can be implemented as appropriate in combination with any of the other embodiments described in this specification.

Embodiment 6

In this embodiment, a metal oxide (also referred to as an oxide semiconductor) that can be used in the OS transistor described in the above embodiment is described.

The metal oxide used in the OS transistor preferably contains at least indium or zinc, and further preferably contains indium and zinc. The metal oxide preferably contains indium, M (M is one or more kinds selected from gallium, aluminum, yttrium, tin, silicon, boron, copper, vanadium, beryllium, titanium, iron, nickel, germanium, zirconium, molybdenum, lanthanum, cerium, neodymium, hafnium, tantalum, tungsten, magnesium, and cobalt), and zinc, for example. Specifically, M is preferably one or more kinds selected from gallium, aluminum, yttrium, and tin, and further preferably M is gallium.

The metal oxide can be formed by a sputtering method, a CVD method such as an MOCVD method, an ALD method, or the like.

Hereinafter, an oxide containing indium (In), gallium (Ga), and zinc (Zn) is described as an example of the metal oxide. Note that an oxide containing indium (In), gallium (Ga), and zinc (Zn) may be referred to as an In—Ga—Zn oxide.

Classification of Crystal Structure

Amorphous (including a completely amorphous structure), CAAC (c-axis-aligned crystalline), nc (nanocrystalline), CAC (cloud-aligned composite), single-crystal, and polycrystalline (poly crystal) structures can be given as examples of a crystal structure of an oxide semiconductor.

Note that a crystal structure of a film or a substrate can be evaluated with an X-ray diffraction (XRD) spectrum. For example, evaluation is possible using an XRD spectrum which is obtained by GIXD (Grazing-Incidence XRD) measurement. Note that a GIXD method is also referred to as a thin film method or a Seemann-Bohlin method. The XRD spectrum obtained by GIXD measurement may be hereinafter simply referred to as an XRD spectrum.

For example, the XRD spectrum of the quartz glass substrate shows a peak with a substantially bilaterally symmetrical shape. On the other hand, the peak of the XRD spectrum of the In—Ga—Zn oxide film having a crystal structure has a bilaterally asymmetrical shape. The bilaterally asymmetrical peak of the XRD spectrum clearly shows the existence of crystals in the film or the substrate. In other words, the crystal structure of the film or the substrate cannot be regarded as "amorphous" unless it has a bilaterally symmetrical peak in the XRD spectrum.

A crystal structure of a film or a substrate can also be evaluated with a diffraction pattern obtained by a nanobeam electron diffraction (NBED) method (such a pattern is also referred to as a nanobeam electron diffraction pattern). For example, a halo pattern is observed in the diffraction pattern of the quartz glass substrate, which indicates that the quartz glass substrate is in an amorphous state. Furthermore, not a halo pattern but a spot-like pattern is observed in the diffraction pattern of the In—Ga—Zn oxide film deposited at room temperature. Thus, it is suggested that the In—Ga—Zn oxide deposited at room temperature is in an intermediate state, which is neither a single crystal nor polycrystal nor an amorphous state, and it cannot be concluded that In—Ga—Zn oxide film is in an amorphous state.

Structure of Oxide Semiconductor

Note that oxide semiconductors might be classified in a manner different from the above-described one when classified in terms of the structure. Oxide semiconductors are classified into a single crystal oxide semiconductor and a non-single-crystal oxide semiconductor, for example. Examples of the non-single-crystal oxide semiconductors include the above-described CAAC-OS and nc-OS. Other examples of the non-single-crystal oxide semiconductors include a polycrystalline oxide semiconductor, an amorphous-like oxide semiconductor (a-like OS), and an amorphous oxide semiconductor.

Here, the above-described CAAC-OS, nc-OS, and a-like OS are described in detail.

CAAC-OS

The CAAC-OS is an oxide semiconductor having a plurality of crystal regions each of which has c-axis alignment in a particular direction. Note that the particular direction refers to the thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more minute crystals (crystals each of which has a maximum diameter of less than 10 nm). In the case where the crystal region is formed of one minute crystal, the maximum diameter of the crystal region is less than 10 nm. In the case where the crystal region is formed of a large number of minute crystals, the maximum diameter of the crystal region may be approximately several tens of nanometers.

In the case of an In—Ga—Zn oxide, the CAAC-OS tends to have a layered crystal structure (also referred to as a layered structure) in which a layer containing indium (In) and oxygen (hereinafter, an In layer) and a layer containing gallium (Ga), zinc (Zn), and oxygen (hereinafter, a (Ga, Zn) layer) are stacked. Indium and gallium can be replaced with each other. Therefore, indium may be contained in the (Ga,Zn) layer. In addition, gallium may be contained in the In layer. Note that zinc may be contained in the In layer. Such a layered structure is observed as a lattice image in a high-resolution TEM (Transmission Electron Microscope) image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (also referred to as grain boundary) cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

Note that a crystal structure in which a clear crystal grain boundary is observed is what is called polycrystal. It is highly probable that the crystal grain boundary becomes a recombination center and traps carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, a reduction in electron mobility due to the crystal grain boundary is unlikely to occur. Moreover, since the crystallinity of an oxide semiconductor might be decreased by entry of impurities, formation of defects, or the like, the CAAC-OS can be regarded as an oxide semiconductor having small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperatures in the manufacturing process (what is called thermal budget). Accordingly, the use of the CAAC-OS for the OS transistor can extend the degree of flexibility of the manufacturing process.

nc-OS

In the nc-OS, a microscopic region (e.g., a region with a size greater than or equal to 1 nm and less than or equal to 10 nm, specifically, a region with a size greater than or equal to 1 nm and less than or equal to 3 nm) has a periodic atomic arrangement. In other words, the nc-OS includes a minute crystal. Note that the size of the minute crystal is, for example, greater than or equal to 1 nm and less than or equal to 10 nm, particularly greater than or equal to 1 nm and less than or equal to 3 nm; thus, the minute crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis by out-of-plane XRD measurement with an XRD apparatus using θ/2θ scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., larger than or equal to 1 nm and smaller than or equal to 30 nm).

a-Like OS

The a-like OS is an oxide semiconductor having a structure between those of the nc-OS and the amorphous oxide semiconductor. The a-like OS has a void or a low-density region. That is, the a-like OS has low crystallinity as compared with the nc-OS and the CAAC-OS. Moreover, the a-like OS has a higher hydrogen concentration in the film than the nc-OS and the CAAC-OS.

Structure of Oxide Semiconductor

Next, the above-described CAC-OS will be described in detail. Note that the CAC-OS relates to the material composition.

CAC-OS

The CAC-OS refers to one composition of a material in which elements included in a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. Alternatively, for example, the first region has [In] higher than [In] in the second region and [Ga] lower than [Ga] in the second region. Moreover, the second region has [Ga] higher than [Ga] in the first region and [In] lower than [In] in the first region.

Specifically, the first region includes indium oxide, indium zinc oxide, or the like as its main component. The second region includes gallium oxide, gallium zinc oxide, or the like as its main component. That is, the first region can be rephrased as a region containing In as its main component. The second region can be rephrased as a region containing Ga as its main component.

Note that a clear boundary between the first region and the second region cannot be observed in some cases.

In a material composition of a CAC-OS in an In—Ga—Zn oxide that contains In, Ga, Zn, and O, regions containing Ga as a main component are observed in part of the CAC-OS and regions containing In as a main component are observed in part thereof and these regions are randomly present to form a mosaic pattern. Thus, it is suggested that the CAC-OS has a structure in which metal elements are unevenly distributed.

The CAC-OS can be formed by a sputtering method under a condition where a substrate is not heated, for example. Moreover, in the case of forming the CAC-OS by a sputtering method, any one or more selected from an inert gas (typically, argon), an oxygen gas, and a nitrogen gas are used for a deposition gas. The proportion of the flow rate of an oxygen gas in the total flow rate of the deposition gas during deposition is preferably as low as possible. For example, the proportion of the flow rate of an oxygen gas in the total flow rate of the deposition gas is higher than or equal to 0% and lower than 30%, preferably higher than or equal to 0% and lower than or equal to 10%.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

Here, the first region has a higher conductivity than the second region. In other words, when carriers flow through the first region, the conductivity of a metal oxide is exhibited. Accordingly, when the first regions are distributed in a metal oxide like a cloud, high field-effect mobility ($\mu$) can be achieved.

On the other hand, the second region has a higher insulating property than the first region. In other words, when the second regions are distributed in a metal oxide, leakage current can be inhibited.

Thus, in the case where a CAC-OS is used for a transistor, by the complementary action of the conductivity due to the first region and the insulating property due to the second region, the CAC-OS can have a switching function (On/Off function). That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current (Ion), high field-effect mobility (u), and excellent switching operation can be achieved.

A transistor using the CAC-OS has high reliability. Thus, the CAC-OS is the most suitable for a variety of semiconductor devices such as display apparatuses.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

Transistor Including Oxide Semiconductor

Next, the case where the above oxide semiconductor is used for a transistor will be described.

When the above oxide semiconductor is used for a transistor, a transistor with high field-effect mobility can be achieved. In addition, a transistor having high reliability can be achieved.

An oxide semiconductor having a low carrier concentration is preferably used in a transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon. Note that impurities in an oxide semiconductor refer to, for example, elements other than the main components of an oxide semiconductor. For example, an element with a concentration lower than 0.1 atomic % can be regarded as an impurity.

Impurities

Here, the influence of each impurity in the oxide semiconductor will be described.

When silicon or carbon, which is one of Group 14 elements, is contained in the oxide semiconductor, defect states are formed in the oxide semiconductor. Thus, the concentration of silicon or carbon (the concentration obtained by secondary ion mass spectrometry (SIMS)) in the oxide semiconductor is set to $2\times10^{18}$ atoms/cm$^3$ or lower, preferably $2\times10^{17}$ atoms/cm$^3$ or lower.

When the oxide semiconductor contains an alkali metal or an alkaline earth metal, defect states are formed and carriers are generated in some cases. Accordingly, a transistor including an oxide semiconductor that contains alkali metal or alkaline earth metal tends to have normally-on characteristics. Thus, the concentration of alkali metal or alkaline earth metal in the oxide semiconductor, which is obtained by SIMS, is lower than or equal to $1\times10^{18}$ atoms/cm$^3$, preferably lower than or equal to $2\times10^{16}$ atoms/cm$^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, a trap state is sometimes formed. This might make the electrical characteristics of the transistor unstable. Therefore, the concentration of nitrogen in the oxide semiconductor, which is obtained by SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, and still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1\times10^{20}$ atoms/cm$^3$, preferably lower than $1\times10^{19}$ atoms/cm$^3$, further preferably lower than $5\times10^{18}$ atoms/cm$^3$, and still further preferably lower than $1\times10^{18}$ atoms/cm$^3$.

When an oxide semiconductor with sufficiently reduced impurities is used for the channel formation region of the transistor, stable electrical characteristics can be given.

At least part of this embodiment can be implemented as appropriate in combination with any of the other embodiments described in this specification.

Embodiment 7

In this embodiment, structure examples and application examples of a stacked-layer panel that is one embodiment of a display panel that can easily have a larger size are described with reference to drawings.

One embodiment of the present invention is a display panel capable of increasing its size by arranging a plurality of display panels to partly overlap one another. In two of the overlapping display panels, at least a display panel positioned on the display surface side (upper side) includes a region transmitting visible light that is adjacent to a display portion. A pixel of a display panel positioned on the lower side and the region transmitting visible light of the display panel positioned on the upper side are provided to overlap with each other. Thus, the two of the overlapping display panels can display a seamless and contiguous image when seen from the display surface side (in a plan view).

For example, one embodiment of the present invention is a stacked-layer panel including a first display panel and a second display panel. The first display panel includes a first region, and the first region includes a first pixel and a second pixel. The second display panel includes a second region, a third region, and a fourth region. The second region includes a third pixel. The third region has a function of transmitting visible light. The fourth region has a function of blocking visible light. The second pixel of the first display panel and the third region of the second display panel have a region where they overlap with each other. The aperture ratio of the second pixel is preferably higher than the aperture ratio of the first pixel.

For one or both of the first display panel and the second display panel, the display apparatus described above as an example, which includes a light-emitting element and a light-receiving element, can be used. In other words, at least one of the first pixel, the second pixel, and the third pixel includes a light-emitting element and a light-receiving element.

Specifically, the following structure can be employed, for example.

Structure Example 1

Display Panel

Figure 28A:
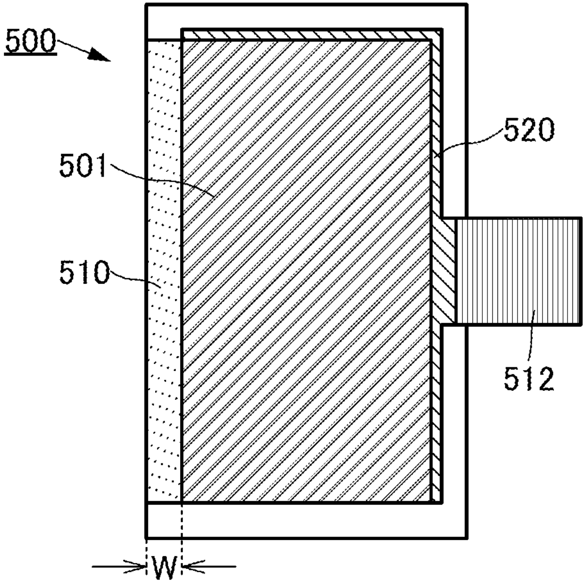
FIG. 28A and FIG. 28B are diagrams illustrating structure examples of display apparatuses.

FIG. 28A is a schematic top view of a display panel 500 included in a display apparatus of one embodiment of the present invention.

The display panel 500 includes a display region 501, and a region 510 transmitting visible light and a region 520 having a portion blocking visible light that are adjacent to the display region 501. FIG. 28A illustrates an example in which the display panel 500 is provided with an FPC 512.

Here, an image can be displayed on the display region 501 even when the display panel 500 is used independently. Moreover, an image can be captured by the display region 501 even when the display panel 500 is used independently.

In the region 510, for example, a pair of substrates included in the display panel 500, a sealant or the like for sealing the display element interposed between the pair of substrates may be provided. Here, for a member provided in the region 510, a material with a visible-light-transmitting property is used.

In the region 520, for example, a wiring electrically connected to pixels included in the display region 501 is provided. In addition to such a wiring, a circuit such as a driver circuit (e.g., a scan line driver circuit and a signal line driver circuit) for driving the pixels or a protective circuit may be provided. Furthermore, the region 520 includes a region where a terminal electrically connected to the FPC 512 (also referred to as a connection terminal), a wiring electrically connected to the terminal, or the like is provided.

For specific description of a cross-sectional structure example and the like of the display panel, the other embodiments can be referred to.

Note that although FIG. 28A illustrates an example in which the display panel 500 has a rectangular shape for easy understanding, the display panel can have a non-rectangular shape depending on the design of a practitioner.

FIG. 29A is a schematic top view of an unfolded display panel, and FIG. 29B is an external view of the display apparatus of one embodiment of the present invention.

A display panel 61 illustrated in FIG. 29A includes the display region 63 and a non-display region 64. Pixel regions formed in a matrix are provided in the display region 63, and driver circuits electrically connected to the pixel regions are provided in the non-display region 64. Note that some of the driver circuits provided in the non-display region 64 may be provided in the pixel regions in the display region 63. Such a structure can reduce the area of the non-display region.

An example of a method for manufacturing a display apparatus is described below. A plurality of pixels are arranged in a matrix over a flexible substrate. The flexible substrate including the plurality of pixels arranged in a matrix is also referred to as a flexible display. A method in which a transistor or a light-emitting element is directly formed on a flexible substrate may be employed, or a method in which a transistor or a light-emitting element is formed over a glass substrate or the like, separated from the glass substrate, and then bonded to a flexible substrate with an adhesive layer may be employed. Although there are various kinds of separation methods and transfer methods, there is no particular limitation and a known technique is employed as appropriate.

In the case where a glass substrate is used, a glass substrate with a size of, for example, the 3rd generation (550 mm×650 mm), the 3.5th generation (600 mm×720 mm or 620 mm×750 mm), the 4th generation (680 mm×880 mm or 730 mm×920 mm), the 5th generation (1100 mm×1300 mm), the 6th generation (1500 mm×1850 mm), the 7th generation (1870 mm×2200 mm), the 8th generation (2200 mm×2400 mm), the 9th generation (2400 mm×2800 mm or 2450 mm×3050 mm), or the 10th generation (2950 mm×3400 mm), or a larger size can be used. A glass substrate can withstand heat treatment temperatures higher than that in the case of forming a transistor directly on a flexible substrate; thus, a glass substrate is suitable for the case where the process temperature for forming a transistor is high.

Examples of flexible substrates include polyester resins such as PET and PEN, a polyacrylonitrile resin, an acrylic resin, a polyimide resin, a polymethyl methacrylate resin, a PC resin, a PES resin, polyamide resins (such as nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a PTFE resin, and an ABS resin. In particular, a material with a low coefficient of linear expansion is preferred, and for example, a polyamide imide resin, a polyimide resin, a polyamide resin, and PET can be suitably used. A substrate in which a fibrous body is impregnated with a resin and a substrate whose coefficient of linear expansion is reduced by mixing an inorganic filler with a resin can also be used, for example.

Alternatively, a metal film can be used as the flexible substrate. As the metal film, stainless steel, aluminum, or the like can be used.

The flexible substrate may have a structure in which a layer of any of the materials given above and at least one of a hard coat layer (e.g., a silicon nitride layer) by which a surface of a device is protected from damage or the like, a layer for dispersing pressure (e.g., an aramid resin layer), and the like are stacked.

As the adhesive layer, a variety of curable adhesives, e.g., a photocurable adhesive such as an ultraviolet curable adhesive, a reactive curable adhesive, a thermosetting adhesive, and an anaerobic adhesive can be used. An adhesive sheet or the like may be used.

Then, the flexible substrate is processed or cut into a non-rectangular shape illustrated in FIG. 29A.

Eight tips of non-rectangles each with an angle of about 45° are gathered in one place to form one hemisphere, and the other eight tips each with an angle of about 45° are gathered in one place to form the other hemisphere, so that one substantially spherical display apparatus is obtained.

When eight tips are gathered in one place, bending is performed at the boundary between the display region 63 and the non-display region 64 so that the display region 63 is stacked on top of the non-display region 64, whereby the driver circuit can be positioned under the pixel region. This state can also be expressed as the driver circuit being provided on the rear side of the pixel region. This structure enables the display panel 61 that has a spherical surface without affecting display to be provided as illustrated in FIG. 29B. Ideally, it is preferable that the display panel be assembled by stacking the non-display region 64 and the display region 63 so that the width of a seam is as small as possible.

Before the display panel 61 is assembled, the flexible substrate may be heated while being pressed against, for example, a sphere mold to be rounded. Since a flexible substrate, depending on its material or thickness, is unlikely to have a curved surface in some cases, a resulting display panel cannot be exactly called spherical. Although a shape that can be called a octahedron is obtained in some cases when the shape illustrated in FIG. 29B is formed, the shape is called substantially spherical in this specification. Since parts of the display panel illustrated in FIG. 29A are connected at the constricted portions, the whole display panel 61 can also be regarded as one surface even when the display panel is assembled to have the shape illustrated in FIG. 29B.

By providing the driver circuits over one flexible substrate, the number of components such as driver ICs can be reduced. Furthermore, space saving can be achieved.

A framework is preferably included in a hollow of the display apparatus so that a substantially spherical surface is held or fixed. As the framework, a wire-like material or a frame made of thinned plastic, wood, or bamboo can be used as well as a metal. The display panel may be attached to a metal sphere (e.g., aluminum) that is hollow. In the case where the metal sphere has a specular surface, light can be efficiently emitted. The display panel may be attached to a paper sphere fixed with glue like papier-mache. In the hollow of the display apparatus, a transistor provided in the display region 63 or a driver circuit, a memory device, and a power source that are electrically connected to an EL element can be provided, for example. The power source includes a power source circuit or a power storage device. In the memory device, a video signal or the like for displaying full-color images on the display region 63 can be stored.

A wireless circuit may be provided in the hollow of the display apparatus so that a video signal and the like from the outside are received and stored in the memory device. An image signal stored in the memory device is converted, by an image processing circuit, into a signal for displaying an image on the display region 63, whereby full-color display on the display region 63 can be achieved.

The display apparatus includes a light-emitting element including pixel regions formed in a matrix; an organic EL element is used in this embodiment.

A quantum dot can be used as a color conversion (wavelength conversion) material of an organic EL element. A quantum dot is a semiconductor nanocrystal with a diameter of several nanometers and contains approximately $1\times10^3$ to $1\times10^6$ atoms. A quantum dot confines an electron or a hole, and an exciton, which results in discrete energy states and an energy shift depending on the size of a quantum dot. This means that quantum dots made of the same substance emit light with different wavelengths depending on their size;

accordingly, emission wavelengths can be easily adjusted by changing the size of quantum dots.

The display region 63 can have a function of a touch panel. The touch panel can be operated when a user touches it or holds his/her hand over it, or by gesture.

The display panel 61 has the display region 63 on its entire surface. When the display panel is fixed, a string, a metal wire, or the like is fixed at a certain portion in a seam to hang the display panel on the ceiling of a car. The display panel 61 may be fixed after removing part where an element, a wiring, and the like are not provided. In that case, the entire surface does not serve as the display region 63. In the case where the display panel 61 is fixed after removing part thereof, a video signal, electric power, or the like for driving can be supplied from the outside through the fixed portion without placing a power source inside the display panel 61.

FIG. 29A and FIG. 29B illustrate examples of display apparatuses including the substantially spherical display region 63; however, one embodiment of the present invention is not limited thereto, and the display apparatus may have a substantially hemispherical surface or surfaces with other three-dimensional shapes. Such a structure enables a video signal, electric power, or the like for driving to be supplied from the outside.

For example, when an unfolded display panel illustrated in FIG. 29C is formed, a display portion 61A that has a shape illustrated in FIG. 29D in which on one flat surface of a cylinder, a hemisphere with the same diameter as the cylinder is stacked can be formed. For another example, when an unfolded display panel illustrated in FIG. 29E is formed, a display portion 61B with a substantially hemispherical surface illustrated in FIG. 29F can be formed.

Stacked-Layer Panel

Figure 28B:
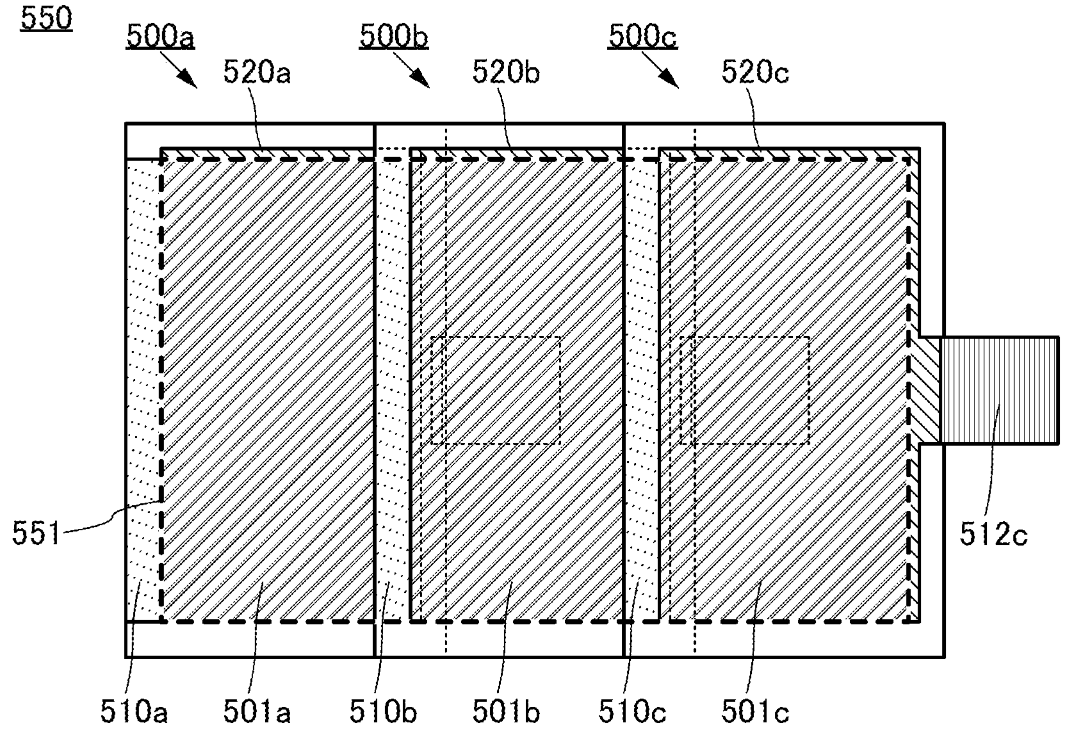

A stacked-layer panel 550 of one embodiment of the present invention includes a plurality of display panels 500 described above. FIG. 28B is a schematic top view of the stacked-layer panel 550 including three display panels.

Hereinafter, to distinguish display panels from each other, components included in the display panels from each other, or components relating to the display panels from each other, letters are added to reference numerals of them. Unless otherwise specified, "a" is appended to a reference numeral of a display panel of a plurality of display panels partly overlapping with each other, which is positioned on the lowest side (the side opposite to the display surface) and components and the like thereof, and alphabetical letters are appended in alphabetical order to a reference numeral/reference numerals of one or more display panels positioned thereover and components and the like thereof. Furthermore, unless otherwise specified, even in describing a structure that includes a plurality of display panels, matters common to the display panels or components and the like thereof are described without alphabetical letters.

The stacked-layer panel 550 illustrated in FIG. 28B includes a display panel 500*a*, a display panel 500*b*, and a display panel 500*c*.

The display panel 500*b* is placed so that part of the display panel 500*b* is stacked over an upper side (a display surface side) of the display panel 500*a*. Specifically, the display panel 500*b* is placed so that a display region 501*a* of the display panel 500*a* and a region 510*b* transmitting visible light of the display panel 500*b* overlap with each other and the display region 501*a* of the display panel 500*a* and a region 520*b* blocking visible light of the display panel 500*b* do not overlap with each other.

Similarly, the display panel 500*c* is placed so as to partly overlap with an upper side (display surface side) of the display panel 500*b*. Specifically, the display panel 500*c* is placed so that a display region 501*b* of the display panel 500*b* and a region 510*c* transmitting visible light of the display panel 500*c* overlap with each other and the display region 501*b* of the display panel 500*b* and a region 520*c* blocking visible light of the display panel 500*c* do not overlap with each other.

The region 510*b* transmitting visible light overlaps with the display region 501*a*; thus, the whole display region 501*a* can be visually recognized from the display surface side. Similarly, the whole display region 501*b* can also be visually recognized from the display surface side when the region 510*c* overlaps with the display region 501*b*. Therefore, a region where the display region 501*a*, the display region 501*b*, and a display region 501*c* are placed seamlessly can serve as a display region 551 of the stacked-layer panel 550.

The display region 551 of the stacked-layer panel 550 can be enlarged by the number of display panels 500. Here, by using display panels each having an image capturing function (i.e., display panels each including a light-emitting element and a light-receiving element) as all the display panels 500, the entire display region 551 can serve as an imaging region.

Note that without limitation to the above, a display panel having an image capturing function and a display panel not having an image capturing function (e.g., a display panel having no light-receiving element) may be combined. For example, a display panel having an image capturing function can be used only where needed, and a display panel not having an image capturing function can be used in other portions.

Note that although an example in which the display panel 500 has a rectangular shape is illustrated for easy understanding, the display panel can have a non-rectangular shape, depending on the design of a practitioner.

Figure 30A:
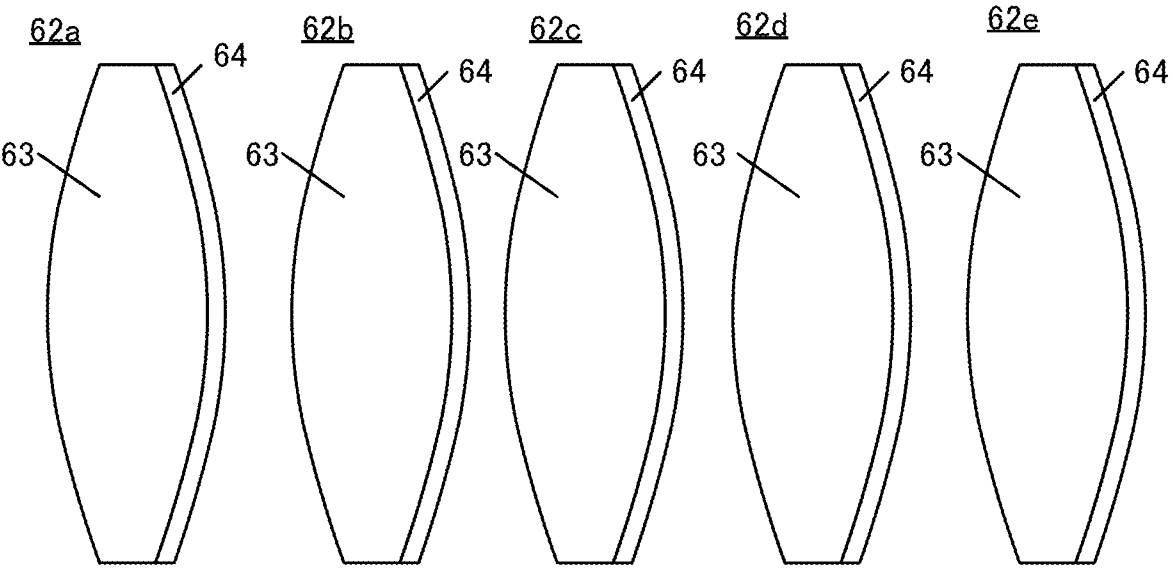
FIG. 30A is a schematic top view illustrating a plurality of display panels before being overlapped.
Figure 30B:
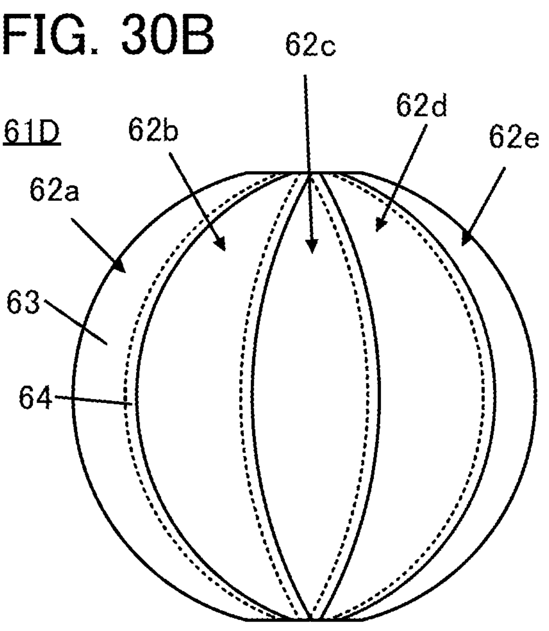
FIG. 30B is an external view of a display apparatus of one embodiment of the present invention.

FIG. 30A is a top view of the plurality of display regions 63 before overlapping, here, a member 62*a*, a member 62*b*, a member 62*c*, a member 62*d*, and a member 62*e* representing five display regions 63. FIG. 30B is an external view of a display panel of one embodiment of the present invention.

For example, a display region is designed to have the shape illustrated in FIG. 30A and is formed over a flexible rectangular substrate, and then the flexible rectangular substrate is partly cut and taken out, whereby the display region 63 illustrated in FIG. 30A can be formed.

The five display regions 63 each include the non-display region 64. The non-display regions 64 are made to overlap and bent, whereby a hemispherical display portion 61D illustrated in FIG. 30B can be obtained. FIG. 30A illustrates the example in which the five display regions 63 are used; however, the number of display regions 63 is not particularly limited, may be selected as appropriate by a practitioner in accordance with a desired shape, and may be two or more.

The display portion 61D can be installed on an inner wall of a car, specifically, on a dashboard, a ceiling, or a wall. The display portion 61D can also be installed on a wristwatch dial.

Although the hemispherical display portion 61D is described here as an example, a spherical structure, a structure in which a hemisphere and a cylinder are combined, a structure in which a curved surface of a concave region emits light, or the like can be obtained by combining the display portion 61D and an other structure.

A defect called a point defect or a line defect might occur in a display panel for some reason. This embodiment makes it possible to assemble display panels with good display quality selected from among a plurality of display panels. Furthermore, part of the display panel can be replaced in the case of malfunction.

Structure Example 2

In FIG. 28B, the plurality of display panels 500 overlap with each other in one direction; however, the plurality of display panels 500 may overlap with each other in two directions of the vertical and horizontal directions.

Figure 31A:
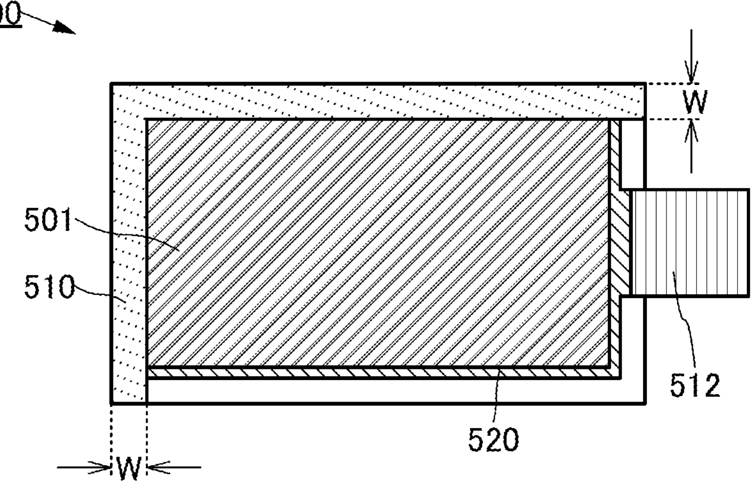
FIG. 31A to FIG. 31C are diagrams illustrating structure examples of a display apparatus.

FIG. 31A illustrates an example of the display panel 500 that differs from that in FIG. 28A in the shape of the region 510. In the display panel 500 illustrated in FIG. 31A, the region 510 transmitting visible light is positioned along two sides of the display region 501.

Figure 31B:
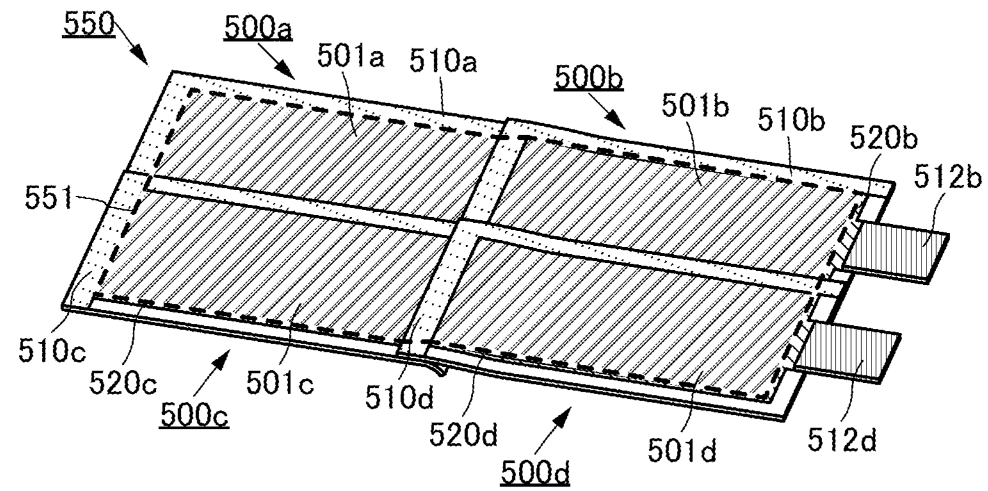
Figure 31C:
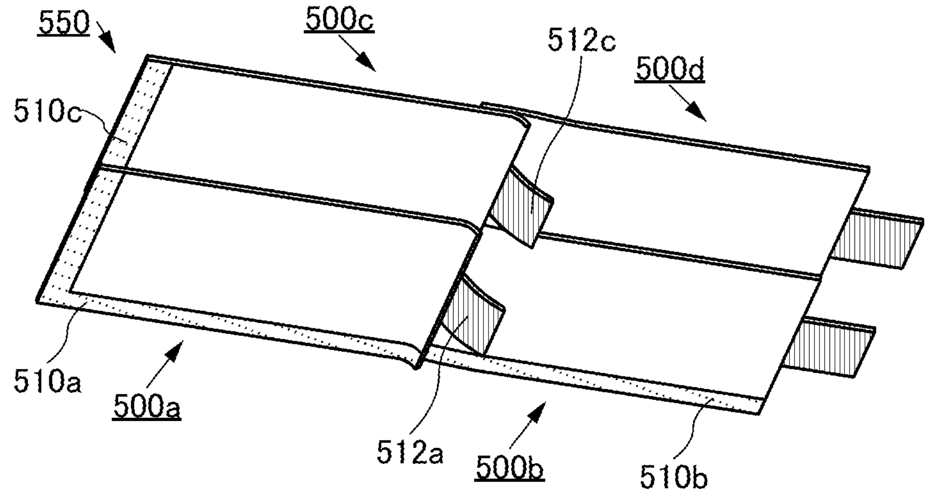

FIG. 31B is a schematic perspective view of the stacked-layer panel 550 in which the display panels 500 illustrated in FIG. 31A are arranged two by two in the vertical and horizontal directions. FIG. 31C is a schematic perspective view of the stacked-layer panel 550 when seen from a side opposite to the display surface side.

In FIG. 31B and FIG. 31C, a region along a short side of the display region 501*a* of the display panel 500*a* overlaps with part of the region 510*b* of the display panel 500*b*. In addition, a region along a long side of the display region 501*a* of the display panel 500*a* overlaps with part of the region 510*c* of the display panel 500*c*. Moreover, a region 510*d* of a display panel 500*d* overlaps with a region along a long side of the display region 501*b* of the display panel 500*b* and a region along a short side of the display region 501*c* of the display panel 500*c*.

Therefore, as illustrated in FIG. 31B, a region where the display region 501*a*, the display region 501*b*, the display region 501*c*, and the display region 501*d* are arranged seamlessly can serve as the display region 551 of the stacked-layer panel 550.

Here, it is preferable that a flexible material be used for the pair of substrates included in the display panel 500 and the display panel 500 have flexibility. In that case, as in the display panel 500*a* in FIG. 31B and FIG. 31C, for example, when an FPC 512*a* or the like is provided on the display surface side, part of the display panel 500*a* on the side where the FPC 512*a* is provided is curved, whereby the FPC 512*a* can be placed under the display region 501*b* of the adjacent display panel 500*b* so as to overlap with the display region 501*b*. As a result, the FPC 512*a* can be placed without physical interference with the rear surface of the display panel 500*b*. Furthermore, when the display panel 500*a* and the display panel 500*b* overlap with and are bonded to each other, it is not necessary to consider the thickness of the FPC 512*a*; thus, a difference in height between the top surface of the region 510*b* of the display panel 500*b* and the top surface of the display region 501*a* of the display panel 500*a* can be reduced. As a result, it is possible to prevent an end portion of the display panel 500*b* over the display region 501*a* from being visible.

Moreover, each display panel 500 is made flexible, whereby the display panel 500*b* can be curved gently so that the level of the top surface of the display region 501*b* of the display panel 500*b* is the same as the level of the top surface of the display region 501*a* of the display panel 500*a*. Thus, the display regions can have the same height except in the vicinity of a region where the display panel 500*a* and the display panel 500*b* overlap with each other, and the display quality of an image displayed on the display region 551 of the stacked-layer panel 550 can be improved.

Although the relation between the display panel 500*a* and the display panel 500*b* is taken as an example in the above description, the same applies to the relation between any other two adjacent display panels.

To reduce the step between two adjacent display panels 500, the thickness of the display panel 500 is preferably small. For example, the thickness of the display panel 500 is preferably less than or equal to 1 mm, further preferably less than or equal to 300 μm, still further preferably less than or equal to 100 μm.

A substrate for protecting the display region 551 of the stacked-layer panel 550 may be provided. In that case, the substrate may be provided for each display panel, or one substrate may be provided for a plurality of display panels.

Note that although the structure where the four rectangular display panels 500 are stacked is described here, an extremely large stacked-layer panel can be obtained by increasing the number of display panels 500. By changing a method for arranging the plurality of display panels 500, the shape of the contour of the display region of the stacked-layer panel can be a non-rectangular shape, for example, one of various shapes such as a circular shape, an elliptical shape, and a polygonal shape. By arranging the display panels 500 three-dimensionally, a stacked-layer panel including display regions with a three-dimensional shape, for example, a circular cylindrical shape, a spherical shape, or a hemispherical shape can be obtained.

At least part of this embodiment can be implemented as appropriate in combination with any of the other embodiments described in this specification.

Embodiment 8

In this embodiment, electronic devices each including the display panel of one embodiment of the present invention will be described with reference to FIG. 32 and FIG. 33.

In this embodiment, an example in which the display apparatus described in Embodiment 7 is installed in a car will be described.

Figure 32A:
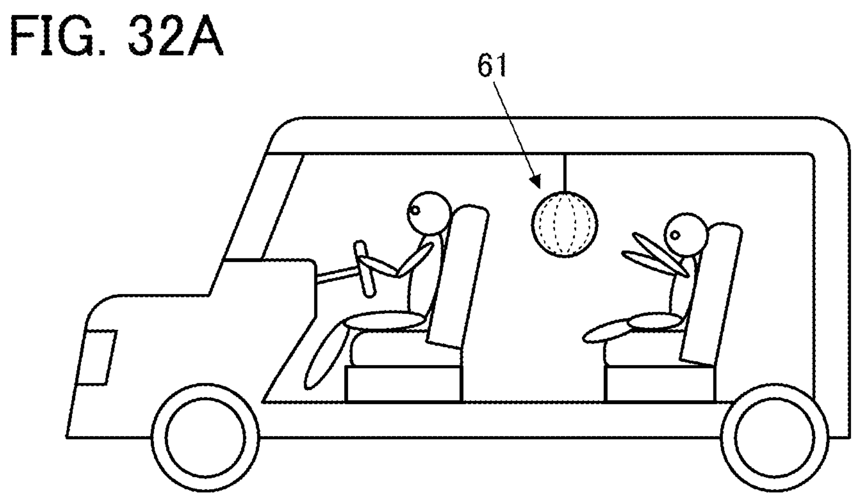
FIG. 32A and FIG. 32B are schematic views of vehicles using a display panel.

FIG. 32A illustrates the spherical display panel 61 that is suspended from the ceiling of a car by a wiring cord. The display panel 61 can function as an interior accessory as well as an interior light. Moreover, the display panel 61 can display television images. Furthermore, if the wiring cord is stretchable, a passenger can pick up and operate the display panel 61.

In the case where an omnidirectional camera is installed outside the car as an in-vehicle camera, images captured by the omnidirectional camera can be displayed on the display panel 61 at once in an easy-to-see matter for a user.

Figure 32B:
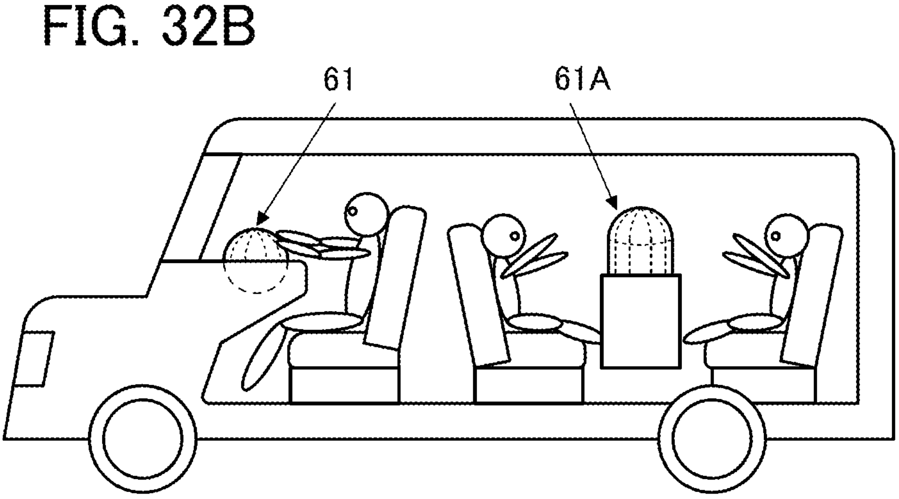

FIG. 32B illustrates another example. The light-emitting and light-receiving apparatus described in Embodiment 4 is suitably used in a light-emitting and light-receiving portion of a vehicle control apparatus. Half of the vehicle control apparatus with a spherical shape is inset into a concave portion so as to be fixed, and the spherical display panel 61 in Embodiment 7 is freely rotated on the concave portion.

The vehicle control apparatus may be formed with use of a hemispherical display portion 61D instead of the spherical display panel 61 in Embodiment 7. In that case, the hemispherical display portion 61D is preferably fixed onto, for example, a flat dashboard.

FIG. 32B illustrates an example in which the display portion 61A that has a shape in which on one flat surface of a cylinder, a hemisphere with the same diameter as the cylinder is stacked is provided on the backseat side. The display portion 61A can be supplied with electric power or a video signal from the bottom. The display portion 61A can also be used as an interior light.

Note that the example illustrated in FIG. 32 is a vehicle such as an electric vehicle but is not particularly limited as long as it is a vehicle. Agricultural machines, motorized bicycles including motor-assisted bicycles, motorcycles, electric wheelchairs, electric carts, boats and ships, submarines, and aircraft such as fixed-wing aircraft and rotary-wing aircraft may be provided with a display panel with a curved surface, typically a spherical shape or a hemispherical shape. Moreover, transport vehicles such as buses, passenger airplanes, helicopters, and spacecraft can be provided with a display panel with a curved surface, typically a spherical shape or a hemispherical shape.

Furthermore, electronic devices such as wristwatches and personal computers can be provided with a display panel with a curved surface, typically a spherical shape or a hemispherical shape. For example, the light-emitting and light-receiving apparatus described in Embodiment 4 can be provided as a small hemispherical or spherical member in the position of a mousepad of a notebook computer.

Figure 33A:
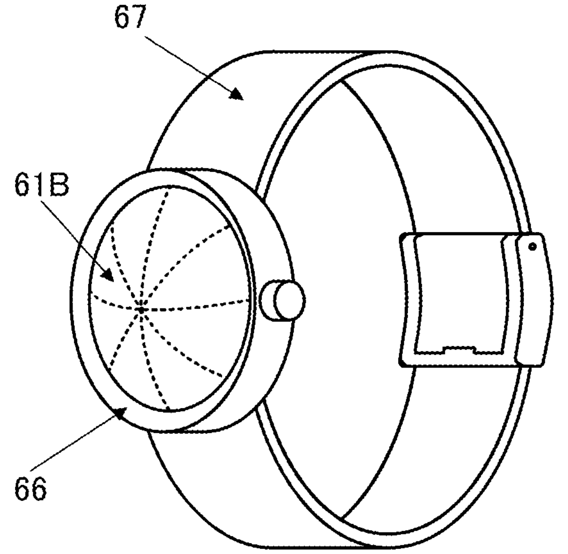
FIG. 33A and FIG. 33B are diagrams illustrating examples of an electronic device using a display panel.

FIG. 33A illustrates an example of a wristwatch in which the display portion 61B described in Embodiment 7 is fixed as a hemisphere to an electronic member 66 to be used as a dial. The wristwatch includes a belt 67 to fix the electronic member 66 to the arm. Moreover, a sphere instead of a hemisphere may be framed to form a wristwatch. The display panel equipped with a touch sensor or a near touch sensor can detect approach or touch of an object (e.g., a finger, a hand, or a pen) and control the display.

A hemispherical wristwatch dial allows a user to check the time without bothering to move the arm.

If a display panel is spherical, part of the display panel touches the user's arm; thus, when the display panel is equipped with a sensor, biological information can be obtained.

Figure 33B:
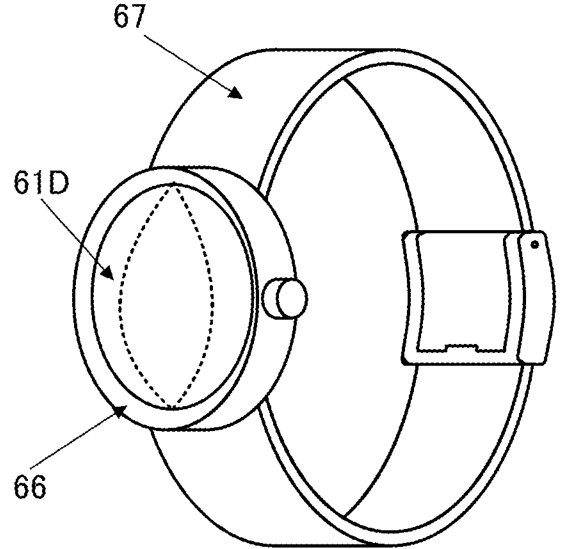

FIG. 33B illustrates an example of a wristwatch in which the display portion 61D described in Embodiment 7 is used in a dial. Since FIG. 33B is the same as FIG. 33A except for the assembling method, a detailed description is omitted here.

This embodiment can be freely combined with the other embodiments.

Embodiment 9

In this embodiment, a vehicle using the display panel of one embodiment of the present invention will be described with reference to FIG. 34.

In this embodiment, an example in which one or more display apparatuses described in Embodiment 7 are combined and set in a vehicle will be described.

Figure 34:
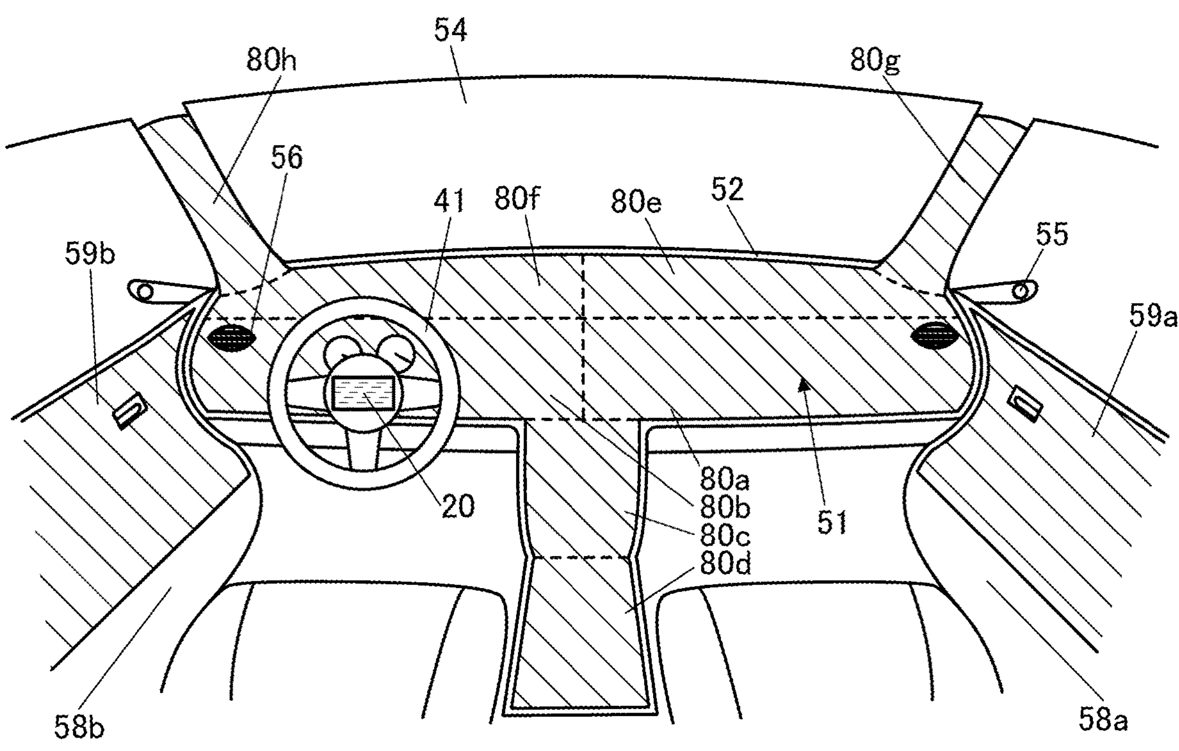
FIG. 34 is a diagram illustrating a structure example of a vehicle.

FIG. 34 is a diagram illustrating a structure example of a vehicle. FIG. 34 illustrates a dashboard 52, a steering wheel 41, a windshield 54, cameras 55, an air outlet 56, a front-passenger-side door 58*a*, a driver-side door 58*b*, and the like that are arranged around the driver's seat and the front passenger's seat. A display portion 51 is provided horizontally across the dashboard 52.

The display portion 51 is preferably provided with a touch sensor or a non-contact proximity sensor. Alternatively, the display portion 51 is preferably operated by gestures with use of a camera or the like that is separately provided.

The steering wheel 41 includes a light-emitting and light-receiving portion 20. The light-emitting and light-receiving portion 20 has a function of emitting light and a function of capturing an image. The light-emitting and light-receiving portion 20 enables biological information such as a fingerprint, a palmprint, or a vein of a driver to be obtained; the driver can be authenticated on the basis of the biological information. Therefore, only drivers registered in advance are allowed to start the vehicle, resulting in a vehicle with an extremely high security level.

A plurality of cameras 55 that capture images of the situations on the rear side may be provided outside the vehicle. Although the camera 55 is provided instead of a side mirror in the example in FIG. 34, both the side mirror and the camera may be provided. As the camera 55, a CCD camera or a CMOS camera can be used, for example. In addition, an infrared camera may be used in combination with such a camera. The infrared camera, which has a higher output level with a higher temperature of an object, can sense or extract a living body such as a human or an animal.

An image captured by the camera 55 can be output to one or both of the display portion 51 and the light-emitting and light-receiving portion 20. The display portion 51 or the light-emitting and light-receiving portion 20 is mainly used to assist driving of the vehicle. An image of the situation on the rear side is captured at a wide angle of view by the camera 55, and the image is displayed on the display portion 51 or the light-emitting and light-receiving portion 20 so that the driver can see a blind area to avoid an accident.

Furthermore, a distance image sensor may be provided over a roof or the like of the vehicle, and an image obtained by the distance image sensor may be displayed on the display portion 51. As the distance image sensor, an image sensor or LIDAR (Light Detection and Ranging) can be used, for example. An image obtained by the image sensor and the image obtained by the distance image sensor are displayed on the display portion 51, whereby more information can be provided to the driver to assist driving.

The display portion 51 may also have a function of displaying map information, traffic information, television images, DVD images, and the like. For example, map information can be displayed on a display panel 80*a* and a display panel 80*b* as a large display screen. Note that the number of display panels can be increased depending on the image to be displayed.

In FIG. 34, the display portion 51 is provided on the dashboard, a front console, and left and right pillars. In the example illustrated in FIG. 34, the display portion 51 includes eight display panels (the display panel 80*a* to a display panel 80*h*); however, the number of display panels is not limited thereto and may be seven or less or nine or more. A display panel 80*c* and a display panel 80*d* are provided in a position corresponding to the center console. The display panel 80*d* with a rectangular shape and the display panel 80*c* with a non-rectangular shape are combined. In the case where the display panel 80*c* and the display panel 80*d* are used as one panel, a resulting panel is a non-rectangular panel. A display panel 80*e* and a display panel 80*f* are provided on the far side of the dashboard from the driver. A display panel 80*g* and the display panel 80*h* are provided along the pillars. One or more of the display panel 80*a* to the display panel 80*h* are provided along a curved surface.

Images to be displayed on the display panel 80*a* to the display panel 80*h* can be freely set according to the driver's preference. For example, television images, DVD images, online videos, or the like can be displayed on the display panel 80*a*, the display panel 80*e*, or the like on the left side; map information can be displayed on the display panel 80*c* or the like at the center; meters such as a speedometer and a tachometer can be displayed on the display panel 80*b*, the display panel 80*f*, or the like on the driver side; and audio information can be displayed on the display panel 80*d* or the like between the driver's seat and the front passenger's seat. External views in the driver's line of sight are displayed in real time on the display panel 80*g* and the display panel 80*h* provided on the pillars, which enables the vehicle to be a pseudo-pillarless vehicle and to have fewer blind spots, resulting in a highly safe vehicle.

Furthermore, in FIG. 34, a display portion 59*a* and a display portion 59*b* are provided along a surface of the front-passenger-side door 58*a* and a surface of the driver-side door 58*b*, respectively. Each of the display portion 59*a* and the display portion 59*b* can be formed using one or a plurality of display panels.

The display portion 59*a* and the display portion 59*b* are placed to face each other, and the display portion 51 is provided on the dashboard 52 so as to connect an end portion of the display portion 59*a* and an end portion of the display portion 59*b*. Accordingly, a driver and a passenger in the front passenger's seat are surrounded by the display portion 51, the display portion 59*a*, and the display portion 59*b* in the front and on both sides. For example, displaying one image across the display portion 59*a*, the display portion 51, and the display portion 59*b* enables the driver or the passenger to have an enhanced sense of immersion.

In addition, the plurality of cameras 55 that capture images of the situations on the rear side may be provided outside the vehicle. Although the camera 55 is provided instead of a side mirror in the example in FIG. 34, both the side mirror and the camera may be provided. As the camera 55, a CCD camera or a CMOS camera can be used.

As the camera 55, a CCD camera, a CMOS camera, or the like can be used. In addition, an infrared camera may be used in combination with such a camera. The infrared camera, which has a higher output level with a higher temperature of an object, can sense or extract a living body such as a human or an animal.

An image captured by the camera 55 can be output to any one or more of the display panels. The image displayed on the display portion 51 can be mainly used to assist driving of the vehicle. For example, an image of the situation on the rear side is captured at a wide angle of view by the camera 55, and the image is displayed on any one or more of the display panels so that the driver can see a blind area to avoid an accident.

In addition, the display portion 59*a* and the display portion 59*b* can display an image synchronized with the scenery from the window, which is obtained by synthesizing images obtained by the camera 55 or the like. That is, an image that the driver and the passenger can see through the door 58*a* and the door 58*b* can be displayed on the display portion 59*a* and the display portion 59*b*. This allows the driver and the passenger to experience the sensation of floating. A display panel having an image capturing function is preferably used as at least one of the display panel 80*a* to the display panel 80*h*. Furthermore, a display panel having an image capturing function can also be used as one or more of the display panels provided in the display portion 59*a* and the display portion 59*b*.

For example, when the driver touches the display panel, the vehicle can perform biometric authentication such as fingerprint authentication or palm print authentication. The vehicle may have a function of setting an environment to meet the driver's preference when the driver is authenticated by biometric authentication. For example, one or more of adjustment of the position of the seat, adjustment of the position of the handle, adjustment of the position of the camera 55, setting of brightness, setting of an air conditioner, setting of the speed (frequency) of wipers, volume setting of audio, and reading of the playlist of the audio are preferably performed after authentication.

A vehicle can be brought into a state where the vehicle can be driven, e.g., a state where an engine is started or a state where an electric vehicle can be started, after the driver is authenticated by biological authentication. This is preferable because a key, which is conventionally necessary, is unnecessary.

Although the display apparatus that surrounds the driver's seat and the front passenger's seat is described here, a display portion can be provided in the backseat to surround a passenger. For example, the display portion can be provided along the back of the driver's seat or the passenger's seat or along a side surface of a rear door.

At least part of this embodiment can be implemented as appropriate in combination with any of the other embodiments described in this specification.

Embodiment 10

In this embodiment, electronic devices of one embodiment of the present invention are described with reference to FIG. 35.

An electronic device in this embodiment includes the display apparatus of one embodiment of the present invention. For the display apparatus of one embodiment of the present invention, increases in definition, resolution, and sizes are easily achieved. Since the display apparatus of one embodiment of the present invention has a wide viewing angle, the quality of an image displayed along the curved display surface can be increased. Thus, the display apparatus of one embodiment of the present invention can be used for display portions of a variety of electronic devices.

The display apparatus of one embodiment of the present invention can be manufactured at low cost, which leads to a reduction in manufacturing cost of an electronic device.

Examples of electronic devices include electronic devices with a relatively large screen, such as a television device, a desktop or laptop personal computer, a monitor of a computer or the like, digital signage, and a large game machine such as a pachinko machine; a camera such as a digital camera or a digital video camera; a digital photo frame; a mobile phone; a portable game console; a portable information terminal; and an audio reproducing device.

In particular, a display apparatus of one embodiment of the present invention can have a high definition, and thus can be favorably used for an electronic device having a relatively small display portion. As such an electronic device, a watch-type or bracelet-type information terminal device (wearable device); and a wearable device worn on a head, e.g., a device for VR such as a head mounted display and a glasses-type device for AR can be given, for example. Examples of wearable devices include a device for SR and a device for MR.

The resolution of the display apparatus of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K2K (number of pixels: 3840×2160), or 8K4K (number of pixels: 7680×4320). In particular, resolution of 4K2K, 8K4K, or higher is preferable. Furthermore, the pixel density (definition) of the display apparatus of one embodiment of the present invention is preferably higher than or equal to 300 ppi, further preferably higher than or equal to 500 ppi, still further preferably higher than or equal to 1000 ppi, still further preferably higher than or equal to 2000 ppi, still further preferably higher than or equal to 3000 ppi, still further preferably higher than or equal to 5000 ppi, and yet further preferably higher than or equal to 7000 ppi. With such a display apparatus with high resolution and high definition, the electronic device can provide higher realistic sensation, sense of depth, and the like in personal use such as portable use and home use.

The electronic device in this embodiment can be incorporated along a curved surface of an inside wall or an outside wall of a house or a building or the interior or the exterior of a car. The electronic device in this embodiment may include an antenna. With the antenna receiving a signal, the electronic device can display an image, information, and the like on a display portion. When the electronic device includes an antenna and a secondary battery, the antenna may be used for contactless power transmission.

The electronic device in this embodiment may include a sensor (a sensor having a function of sensing, detecting, or measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device of one embodiment of the present invention can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Electronic devices illustrated in FIG. 35A to FIG. 35F include a housing 9000, a display portion 9001, a speaker 9003, an operation key 9005 (including a power switch or an operation switch), a connection terminal 9006, a sensor 9007 (a sensor having a function of sensing, detecting, or measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIG. 35A to FIG. 35F have a variety of functions. For example, the electronic device can have a function of displaying a variety of information (a still image, a moving image, a text image, and the like) on the display portion, a touch panel function, a function of displaying a calendar, date, time, and the like, a function of controlling processing with the use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may each be provided with a camera or the like and have a function of taking a still image or a moving image, a function of storing the taken image in a storage medium (an external storage medium or a storage medium incorporated in the camera), a function of displaying the taken image on the display portion, or the like.

The display apparatus of one embodiment of the present invention can be used for the display portion 9001.

The electronic devices illustrated in FIG. 35A to FIG. 35F will be described in detail below.

Figure 35A:
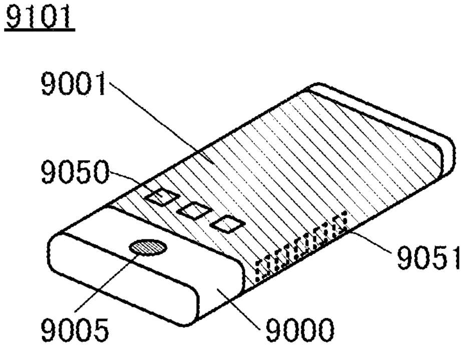
FIG. 35A to FIG. 35F are diagrams illustrating examples of electronic devices.

FIG. 35A is a perspective view showing a portable information terminal 9101. For example, the portable information terminal 9101 can be used as a smartphone. Note that the portable information terminal 9101 may include the speaker 9003, the connection terminal 9006, the sensor 9007, or the like. The portable information terminal 9101 can display characters and image information on its plurality of surfaces. FIG. 35A illustrates an example in which three icons 9050 are displayed. Furthermore, information 9051 indicated by dashed rectangles can be displayed on another surface of the display portion 9001. Examples of the information 9051 include notification of reception of an e-mail, an SNS, or an incoming call, the title and sender of an e-mail, an SNS, or the like, the date, the time, remaining battery, and the intensity of antenna reception. Alternatively, the icon 9050 or the like may be displayed at the position where the information 9051 is displayed.

Figure 35B:
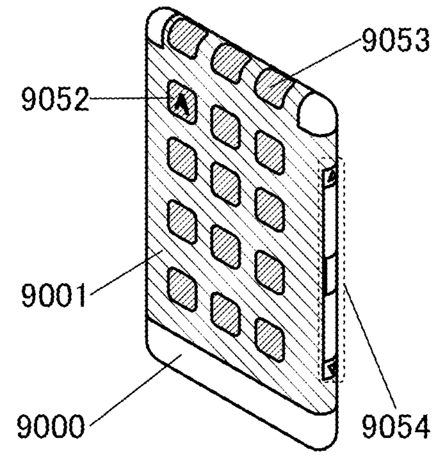

FIG. 35B is a perspective view showing a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can check the information 9053 displayed such that it can be seen from above the portable information terminal 9102, with the portable information terminal 9102 put in a breast pocket of his/her clothes. Thus, the user can see the display without taking out the portable information terminal 9102 from the pocket and decide whether to answer the call, for example.

Figure 35C:
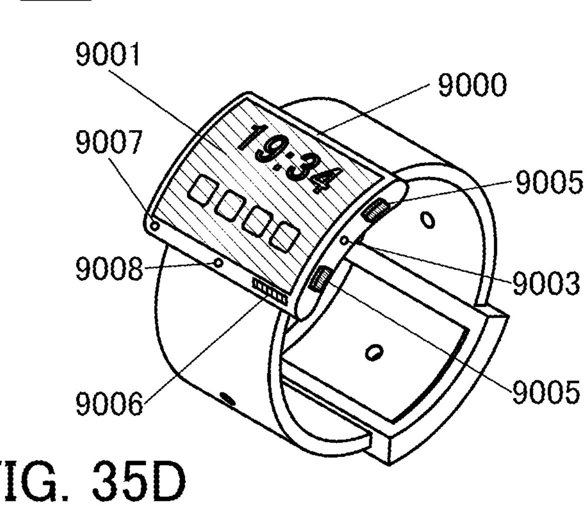

FIG. 35C is a perspective view illustrating a watch-type portable information terminal 9200. For example, the portable information terminal 9200 can be used as a Smartwatch (registered trademark). The display surface of the display portion 9001 is curved, and an image can be displayed on the curved display surface. Mutual communication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

Figure 35D:
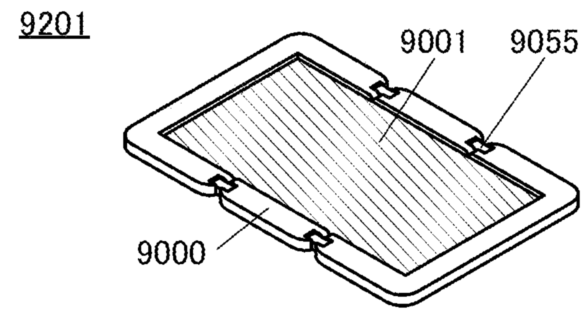
Figure 35E:
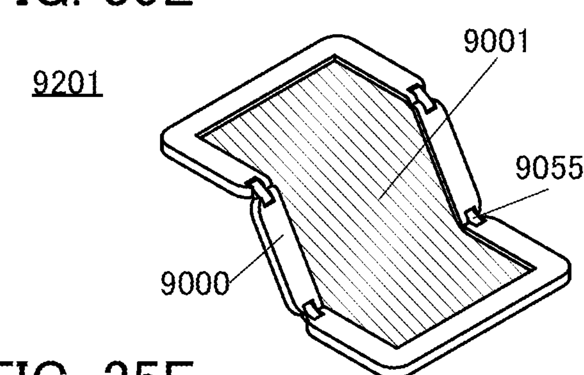
Figure 35F:
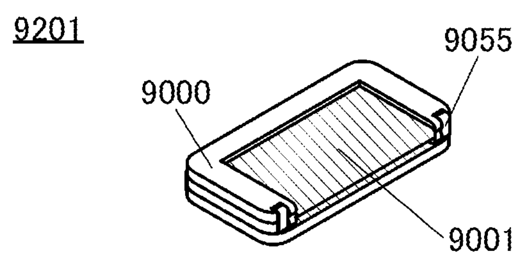

FIG. 35D to FIG. 35F are perspective views illustrating a foldable portable information terminal 9201. FIG. 35D is a perspective view of an opened state of the portable information terminal 9201, FIG. 35F is a perspective view of a folded state thereof, and FIG. 35E is a perspective view of a state in the middle of change from one of FIG. 35D and FIG. 35F to the other. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. For example, the display portion 9001 can be folded with a radius of curvature greater than or equal to 0.1 mm and less than or equal to 150 mm.

At least part of the structure examples, the drawings corresponding thereto, and the like described in this embodiment as an example can be combined with any of the other structure examples, the other drawings, and the like as appropriate.

At least part of this embodiment can be implemented as appropriate in combination with any of the other embodiments described in this specification.

REFERENCE NUMERALS

20: light-receiving portion, 31: first direction, 31A: angle, 31B: angle, 32: second direction, 32A: angle, 32B: angle, 41: steering wheel, 51: display portion, 52: dashboard, 54: windshield, 55: camera, 56: air outlet, 58*a*: door, 58*b*: door, 59*a*: display portion, 59*b*: display portion, 61: display panel, 61A: display portion, 61B: display portion, 61D: display portion, 62*a*: member, 62*b*: member, 62*c*: member, 62*d*: member, 62*e*: member, 63: display region, 64: non-display region, 66: electronic component, 67: belt, 80: display region, 80*a*: display panel, 80*b*: display panel, 80*c*: display panel, 80*d*: display panel, 80*e*: display panel, 80*f*: display panel, 80*g*: display panel, 80*h*: display panel, 90: light-emitting element, 90B: light-emitting element, 90G: light-emitting element, 90R: light-emitting element, 100: display apparatus, 100A: display apparatus, 100B: display apparatus, 101: layer, 110: pixel, 110*a*: subpixel, 110*b*: subpixel, 110*c*: subpixel, 110*d*: subpixel, 111: pixel electrode, 111*a*: pixel electrode, 111*b*: pixel electrode, 111B: pixel electrode, 111*c*: pixel electrode, 111C: connection electrode, 111G: pixel electrode, 111R: pixel electrode, 112: organic layer, 112B: organic layer, 112Bf: organic film, 112G: organic layer, 112Gf: organic film, 112R: organic layer, 112Rf: organic film, 113: common electrode, 114: organic layer, 117: light-blocking layer, 118: insulating layer, 119: insulating layer, 119*a*: insulating layer, 119*b*: insulating layer, 121: protective layer, 122*a*: conductive layer, 122*b*: conductive layer, 122*c*: conductive layer, 122B: conductive layer, 122G: conductive layer, 122R: conductive layer, 123*a*: layer, 123*b*: layer, 123*c*: layer, 124: insulating layer, 125: insulating layer, 125*f*: insulating film, 126: resin layer, 127: insulating layer, 128: layer, 129*a*: coloring layer, 129*b*: coloring layer, 129*c*: coloring layer, 130*a*: light-emitting device, 130*b*: light-emitting device, 130*c*: light-emitting device, 131: protective layer, 132: protective layer, 138: region, 140: connection portion, 142: adhesive layer, 144Ba: sacrificial film, 144Bb: sacrificial film, 144Ga: sacrificial film, 144Gb: sacrificial film, 144Ra: sacrificial film, 144Rb: sacrificial film, 145Ba: sacrificial layer, 145Bb: sacrificial layer, 145Ga: sacrificial layer, 145Gb: sacrificial layer, 145Ra: sacrificial layer, 145Rb: sacrificial layer, 151: substrate, 152: substrate, 153: insulating layer, 162: display portion, 164: circuit, 165: wiring, 166: conductive layer, 172: FPC, 173: IC, 201: transistor, 204: connection portion, 205: transistor, 209: transistor, 210: transistor, 211: insulating layer, 213: insulating layer, 214: insulating layer, 215: insulating layer, 218: insulating layer, 221: conductive layer, 222*a*: conductive layer, 222*b*: conductive layer, 223: conductive layer, 225: insulating layer, 228: region, 231: semiconductor layer, 231*i*: channel formation region, 23In: low-resistance region, 242: connection layer, 300: display panel, 300A: display panel, 300B: display panel, 301: substrate, 302: substrate, 303: functional layer, 311: light-emitting element, 311B: light-emitting element, 311G: light-emitting element, 311R: light-emitting element, 311R: light-emitting element, 311W: light-emitting element, 312: light-receiving element, 313R: light-emitting and light-receiving element, 320: finger, 321: contact portion, 322: fingerprint, 323: imaging range, 325: stylus, 326: path, 500: display panel, 500*a*: display panel, 500*b*: display panel, 500*c*: display panel, 500*d*: display panel, 501: display region, 501*a*: display region, 501*b*: display region, 501*c*: display region, 501*d*: display region, 510: region, 510*b*: region, 510*c*: region, 510*d*: region, 512: FPC, 512*a*: FPC, 520: region, 520*b*: region, 520*c*: region, 550: stacked-layer panel, 551: display region, 711: light-emitting layer, 712: light-emitting layer, 713: light-emitting layer, 720: layer, 720-1: layer, 720-2: layer, 730: layer, 730-1: layer, 730-2: layer, 740: intermediate layer, 750: light-emitting device, 750B: light-emitting device, 750G: light-emitting device, 750R: light-emitting device, 751: layer, 752: layer, 753B: light-emitting layer, 753G: light-emitting layer, 753R: light-emitting layer, 754: layer, 755: layer, 760: light-receiving device, 761: layer, 762: layer, 763: layer, 790: EL layer, 790*a*: EL layer, 790*b*: EL layer, 791: lower electrode, 791B: pixel electrode, 791G: pixel electrode, 791PD: pixel electrode, 791R: pixel electrode, 792: upper electrode, 795: coloring layer, 9000: housing, 9001: display portion, 9003: speaker, 9005: operation key, 9006: connection terminal, 9007: sensor, 9008: microphone, 9050: icon, 9051: information, 9052: information, 9053: information, 9054: information, 9055: hinge, 9101: portable information terminal, 9102: portable information terminal, 9200: portable information terminal, 9201: portable information terminal This application is based on Japanese Patent Application Serial No. 2021-072688 filed on Apr. 22, 2021 the entire contents are hereby incorporated herein by reference.

The invention claimed is:

1. A display apparatus comprising a first light-emitting element and a second light-emitting element over a substrate, wherein the first light-emitting element comprises a first pixel electrode, a first organic layer, and a common electrode, wherein the second light-emitting element comprises a second pixel electrode, a second organic layer, and the common electrode, wherein the first light-emitting element comprises a first side and a second side that is shorter than the first side in a top view of the substrate, wherein an absolute value of a difference between a chromaticity difference Δu'v' between a chromaticity in a front direction and a chromaticity in a first direction and a chromaticity difference Δu'v' between the chromaticity in the front direction and a chromaticity in a second direction is less than or equal to 0.05, wherein a projection of the first direction onto the substrate is parallel to the first side, wherein a projection of the second direction onto the substrate is parallel to the second side, wherein an angle formed by the first direction and a normal direction of a surface of the substrate is 70°, and wherein an angle formed by the second direction and the normal direction of the surface of the substrate is 70°.

2. The display apparatus according to claim 1, wherein in a top view of the first light-emitting element, in a region where the first pixel electrode and the common electrode overlap with each other with a light-emitting region of the first organic layer therebetween, an entire surface of the first pixel electrode on the first organic layer side and an entire surface of the common electrode on the first organic layer side are parallel or substantially parallel to each other.

3. The display apparatus according to claim 1, further comprising an insulating layer, wherein an end portion of the first pixel electrode and an end portion of the first organic layer are aligned or substantially aligned with each other, wherein an end portion of the second pixel electrode and an end portion of the second organic layer are aligned or substantially aligned with each other, and wherein the insulating layer comprises regions in contact with side surfaces of the first pixel electrode, the second pixel electrode, the first organic layer, and the second organic layer.

4. The display apparatus according to claim 1, further comprising an insulating layer, wherein a width of the first pixel electrode is smaller than a width of the first organic layer, wherein a width of the second pixel electrode is smaller than a width of the second organic layer, wherein the first organic layer covers a side surface and a top surface of the first pixel electrode, wherein the second organic layer covers a side surface and a top surface of the second pixel electrode, and wherein the insulating layer comprises regions in contact with side surfaces and parts of top surfaces of the first organic layer and the second organic layer.

5. The display apparatus according to claim 1, further comprising an insulating layer, wherein a width of the first pixel electrode is larger than a width of the first organic layer, wherein a width of the second pixel electrode is larger than a width of the second organic layer, and wherein the insulating layer comprises regions in contact with side surfaces and parts of top surfaces of the first pixel electrode and the second pixel electrode and side surfaces of the first organic layer and the second organic layer.

6. The display apparatus according to claim 1, further comprising a first insulating layer and a second insulating layer, wherein the first insulating layer covers an end portion of the first pixel electrode, wherein the first organic layer is provided over the first pixel electrode and the first insulating layer, wherein the second insulating layer is provided over the first organic layer and the first insulating layer, and wherein the second insulating layer comprises regions in contact with a side surface and a part of a top surface of the first organic layer and a part of a top surface of the first insulating layer.

7. The display apparatus according to claim 6, wherein an end portion of the first insulating layer has a tapered shape, and wherein the second insulating layer comprises a region overlapping with the end portion of the first insulating layer with the first organic layer therebetween.

8. The display apparatus according to claim 1, wherein the first light-emitting element comprises a common layer between the first organic layer and the common electrode, and wherein the second light-emitting element comprises the common layer between the second organic layer and the common electrode.

9. The display apparatus according to claim 8, wherein the common layer comprises one or both of an electron-transport layer and an electron-injection layer.

10. The display apparatus according to claim 1, wherein the substrate has flexibility, and wherein a shape of the substrate is non-rectangular.

* * * * *